US012560835B2

(12) United States Patent
Kuzuhara et al.

(10) Patent No.: US 12,560,835 B2
(45) Date of Patent: Feb. 24, 2026

(54) ANTI-GLARE FILM AND IMAGE DISPLAY DEVICE

(71) Applicant: DAI NIPPON PRINTING CO., LTD., Tokyo (JP)

(72) Inventors: Mitsuhiro Kuzuhara, Tsukuba (JP); Yukimitsu Iwata, Okayama (JP); Jun Tsujimoto, Bizen (JP); Shigeki Murakami, Okayama (JP); Gen Furui, Okayama (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 474 days.

(21) Appl. No.: 17/998,460

(22) PCT Filed: May 14, 2021

(86) PCT No.: PCT/JP2021/018316
§ 371 (c)(1),
(2) Date: Nov. 10, 2022

(87) PCT Pub. No.: WO2021/230337
PCT Pub. Date: Nov. 18, 2021

(65) Prior Publication Data
US 2023/0229036 A1    Jul. 20, 2023

(30) Foreign Application Priority Data

May 15, 2020    (JP) ................................ 2020-086214
May 15, 2020    (JP) ................................ 2020-086221
May 15, 2020    (JP) ................................ 2020-086226

(51) Int. Cl.
G02B 1/11        (2015.01)
G01J 1/02        (2006.01)
(Continued)

(52) U.S. Cl.
CPC ...... *G02F 1/133502* (2013.01); *G01J 1/0242* (2013.01); *G02B 1/11* (2013.01);
(Continued)

(58) Field of Classification Search
CPC ......... G02F 1/133502; G02F 1/133314; G02F 1/133331; G01J 1/0242; G02B 1/11;
(Continued)

(56) References Cited

U.S. PATENT DOCUMENTS

2002/0122257 A1* 9/2002 Suga .................... G02B 5/0268
                                                    349/137
2005/0152034 A1    7/2005 Matsunaga
                    (Continued)

FOREIGN PATENT DOCUMENTS

JP        H04-258901        9/1992
JP        2002-196116        7/2002
                    (Continued)

OTHER PUBLICATIONS

International Search Report of PCT/JP2021/018316, Jul. 13, 2021, 7 pages including English translation.
(Continued)

*Primary Examiner* — Balram T Parbadia
(74) *Attorney, Agent, or Firm* — HSML P.C.

(57)        ABSTRACT

An anti-glare film including an anti-glare layer, the anti-glare film having an uneven surface, wherein for amplitude spectrum of elevation of the uneven surface, when a sum of amplitudes corresponding to spatial frequencies of 0.005 $\mu m^{-1}$, 0.010 $\mu m^{-1}$, and 0.015 $\mu m^{-1}$ is defined as AM1 and an amplitude at a spatial frequency of 0.300 $\mu m^{-1}$ is defined as AM2, AM1 is 0.070 $\mu m$ or more and 0.400 $\mu m$ or less, AM2 is 0.0050 $\mu m$ or more, and AM2<AM1.

15 Claims, 14 Drawing Sheets

(51) Int. Cl.
    *G02F 1/1333*     (2006.01)
    *G02F 1/1335*     (2006.01)
    *H10K 59/80*     (2023.01)

(52) U.S. Cl.
    CPC .. *G02F 1/133314* (2021.01); *G02F 1/133331*
        (2021.01); *H10K 59/8791* (2023.02)

(58) Field of Classification Search
    CPC .......... G02B 5/02; G02B 1/118; G02B 7/023;
        G02B 1/111; G02B 1/113; B32B 7/023;
        G09F 9/00; G09F 9/30; H05B 33/02;
        H10K 59/8791; H10K 50/86
    See application file for complete search history.

(56)         References Cited

U.S. PATENT DOCUMENTS

| | | |
|---|---|---|
| 2007/0217015 A1 | 9/2007 | Furuya et al. |
| 2010/0247866 A1* | 9/2010 | Nakahata ............. G02B 5/0278 |
| | | 428/156 |
| 2012/0141736 A1 | 6/2012 | Hotta et al. |
| 2014/0177060 A1 | 6/2014 | Furui et al. |
| 2014/0211316 A1 | 7/2014 | Furui et al. |
| 2014/0254021 A1 | 9/2014 | Furui et al. |
| 2015/0077841 A1 | 3/2015 | Matsuo et al. |
| 2015/0116835 A1 | 4/2015 | Ogumi et al. |
| 2017/0205539 A1 | 7/2017 | Oishi et al. |
| 2021/0199860 A1* | 7/2021 | Usa ...................... G02B 5/0242 |
| 2021/0278568 A1 | 9/2021 | Yanagawa et al. |

FOREIGN PATENT DOCUMENTS

| | | |
|---|---|---|
| JP | 20030066207 A | 3/2003 |
| JP | 2005-234554 | 9/2005 |
| JP | 2007-187952 | 7/2007 |
| JP | 2008-233870 | 10/2008 |
| JP | 2009-086410 | 4/2009 |
| JP | 2009-265500 | 11/2009 |
| JP | 2010-160398 | 7/2010 |
| JP | 2012-133066 | 7/2012 |
| JP | 2013-061636 | 4/2013 |
| JP | 2014-006448 | 1/2014 |
| JP | 2014-157247 | 8/2014 |
| JP | 2014-232159 | 12/2014 |
| JP | 2015-103413 | 6/2015 |
| JP | 2016-033657 | 3/2016 |
| JP | 2016-033659 | 3/2016 |
| JP | 2016-033660 | 3/2016 |
| JP | 2017-021293 | 1/2017 |
| JP | 2017-021297 | 1/2017 |
| JP | 2017-219622 | 12/2017 |
| JP | 2018-077279 | 5/2018 |
| JP | 2018-116285 | 7/2018 |
| JP | 2019-113877 | 7/2019 |
| KR | 1020130122964 A | 11/2013 |
| WO | 2008/072581 | 6/2008 |
| WO | 2013/015039 | 1/2013 |
| WO | 2013/047184 | 4/2013 |
| WO | 2016/038853 | 3/2016 |
| WO | 2017/043538 | 3/2017 |
| WO | 2018/212051 | 11/2018 |

OTHER PUBLICATIONS

Ex Parte Quayle Office Action issued for U.S. Appl. No. 18/350,424, filed Nov. 21, 2023, 16 pages.
Office Action issued for Korean Patent Application No. 10-2022-7042873, Dispatched date: Feb. 4, 2025, 11 pages including English machine translation.
Notice of Reasons for Refusal issued for Japanese Patent Application No. 2024-059937, Dispatch date: Aug. 5, 2025, 8 pages including English machine translation.

* cited by examiner

[Fig. 1]
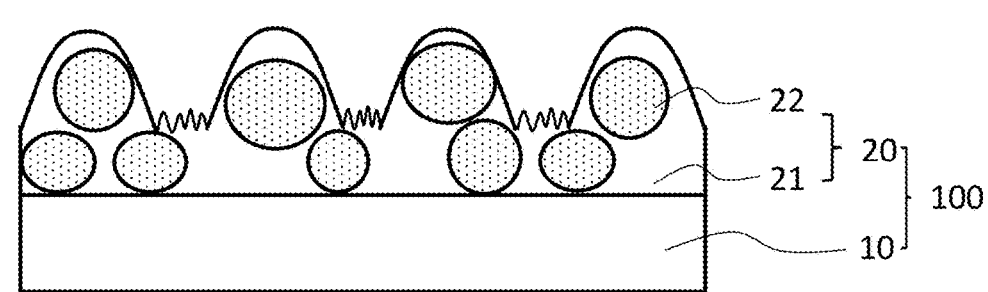
[Fig. 2]
[Fig. 3]
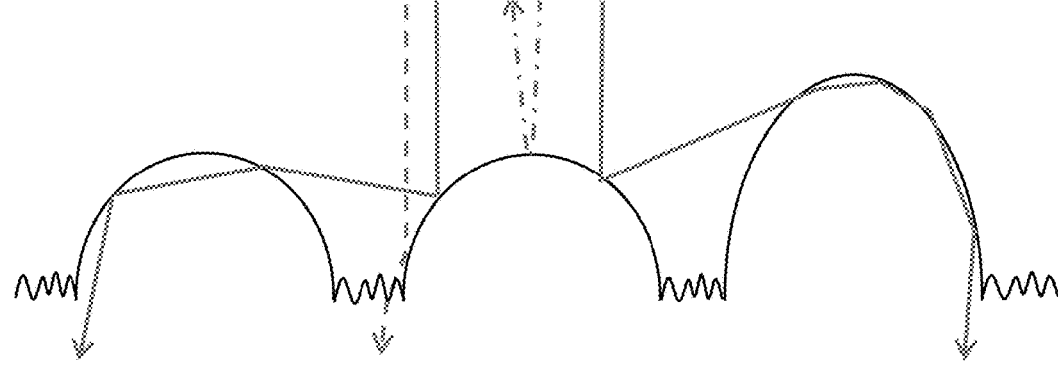

[Fig. 4]
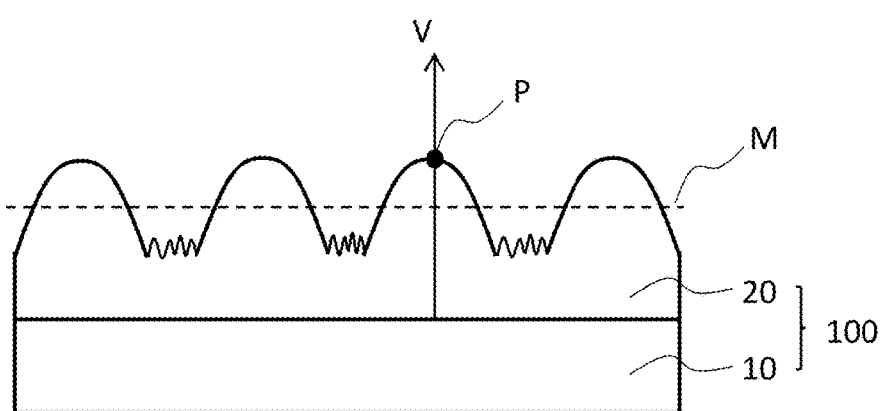
[Fig. 5]
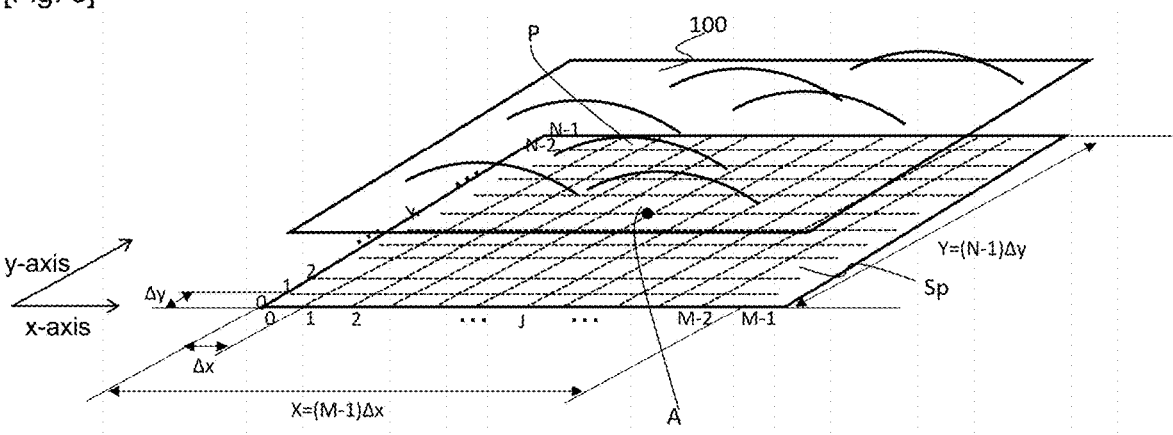
[Fig. 6]
Spatial frequency/amplitude
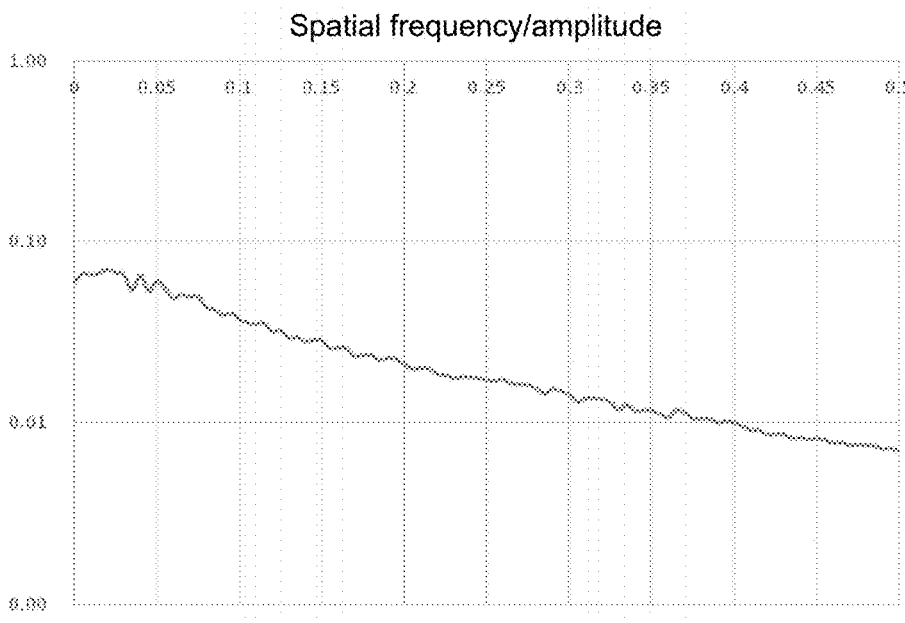

[Fig. 7]
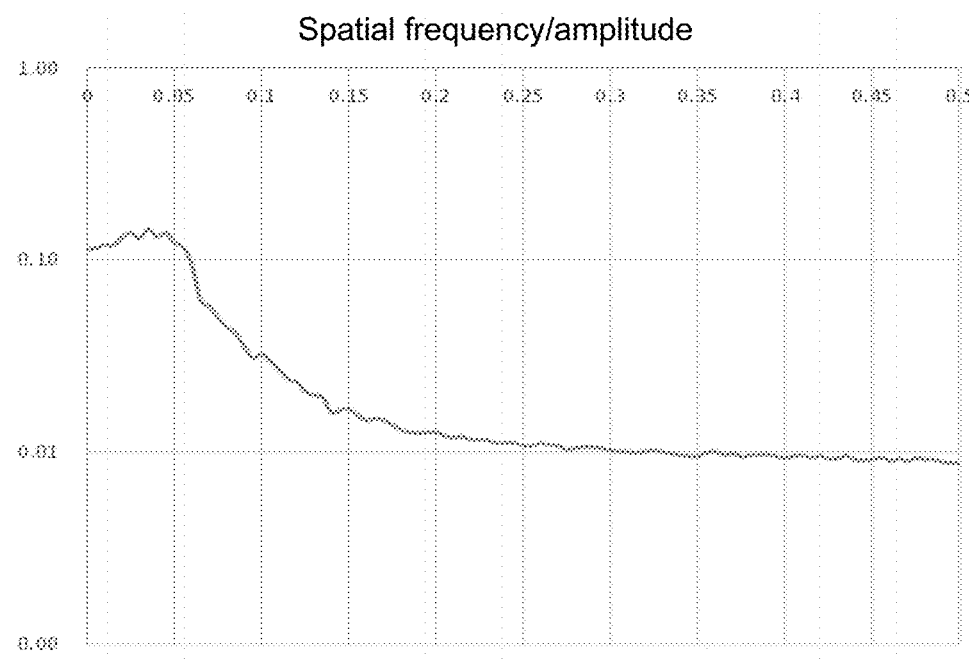
[Fig. 8]
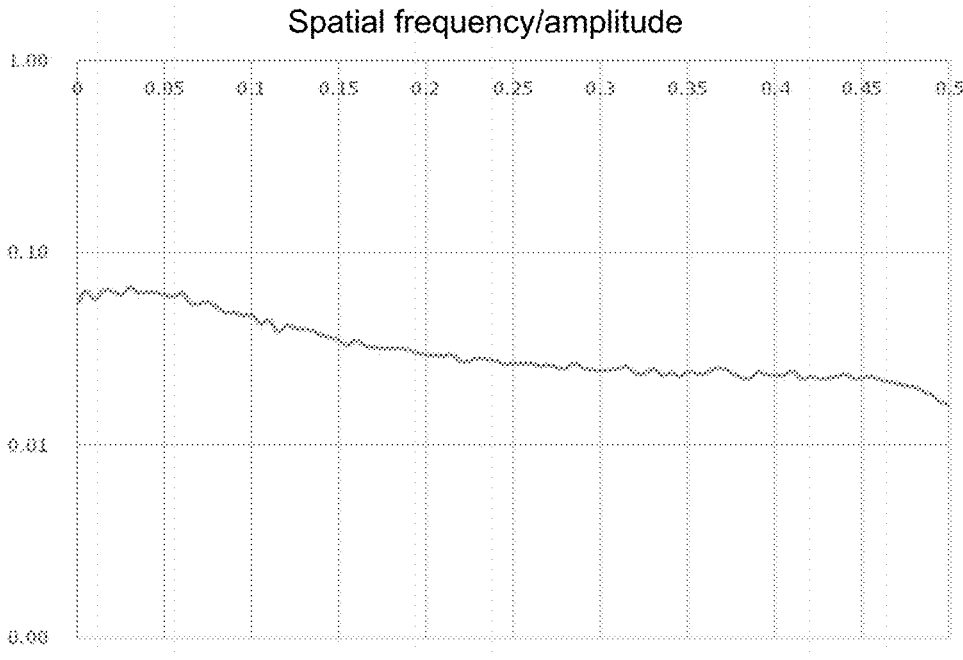

[Fig. 9]
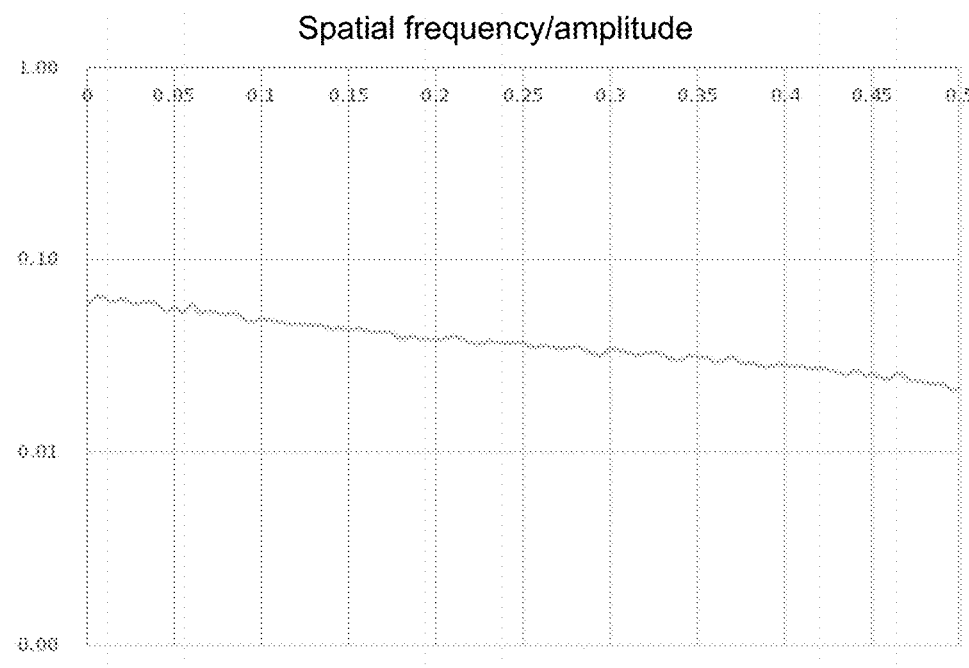
Spatial frequency/amplitude
[Fig. 10]
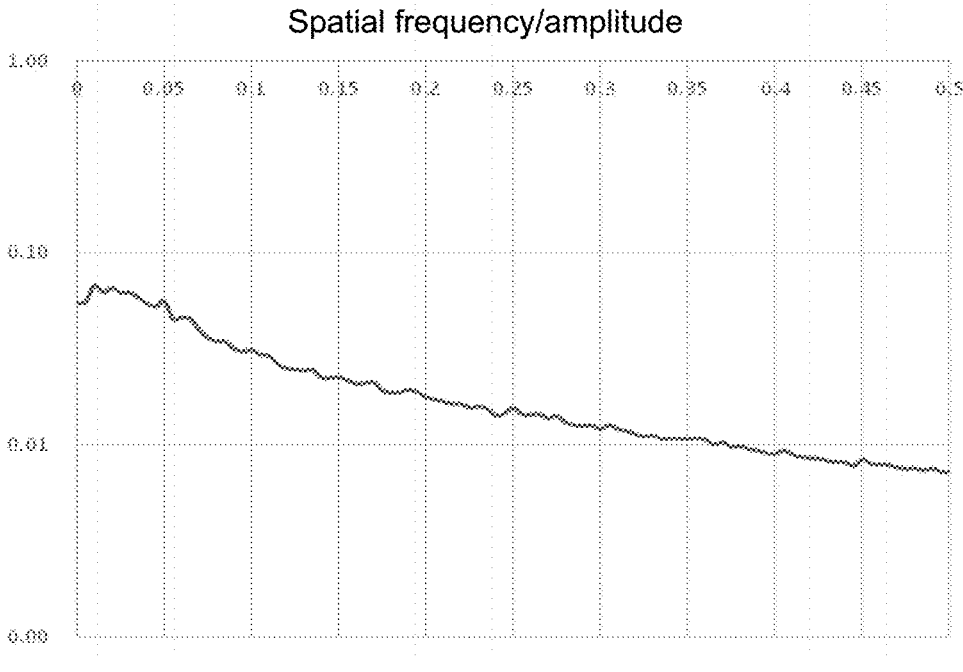
Spatial frequency/amplitude

[Fig. 11]
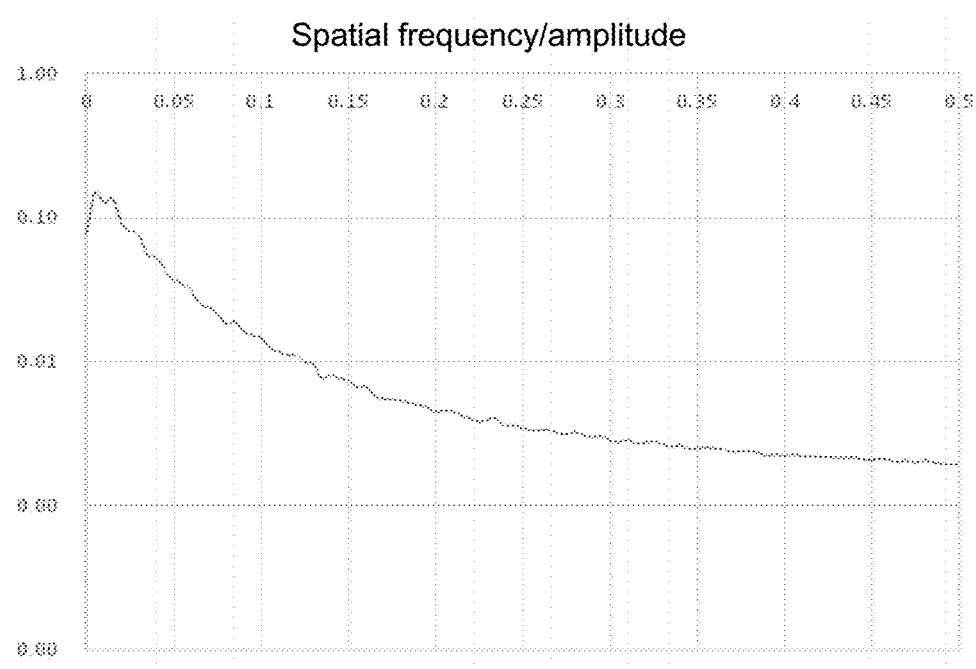
Spatial frequency/amplitude
[Fig. 12]
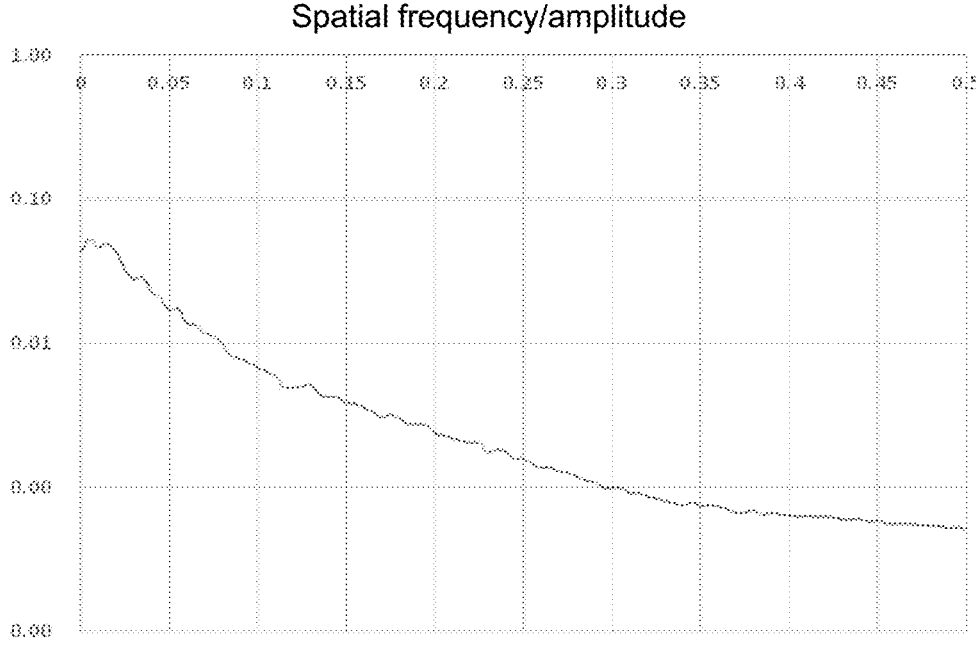
Spatial frequency/amplitude

[Fig. 13]
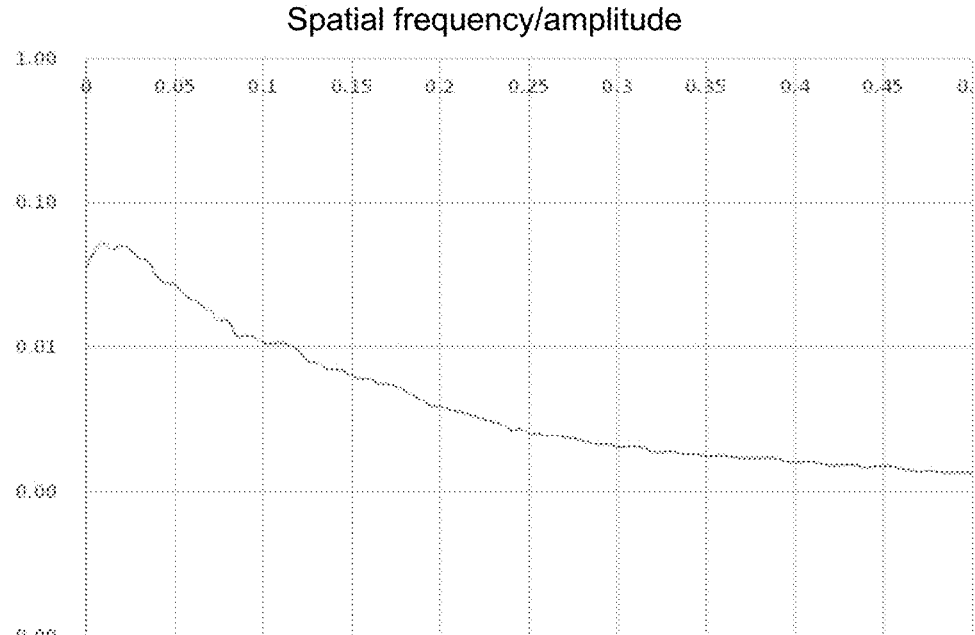
Spatial frequency/amplitude
[Fig. 14]
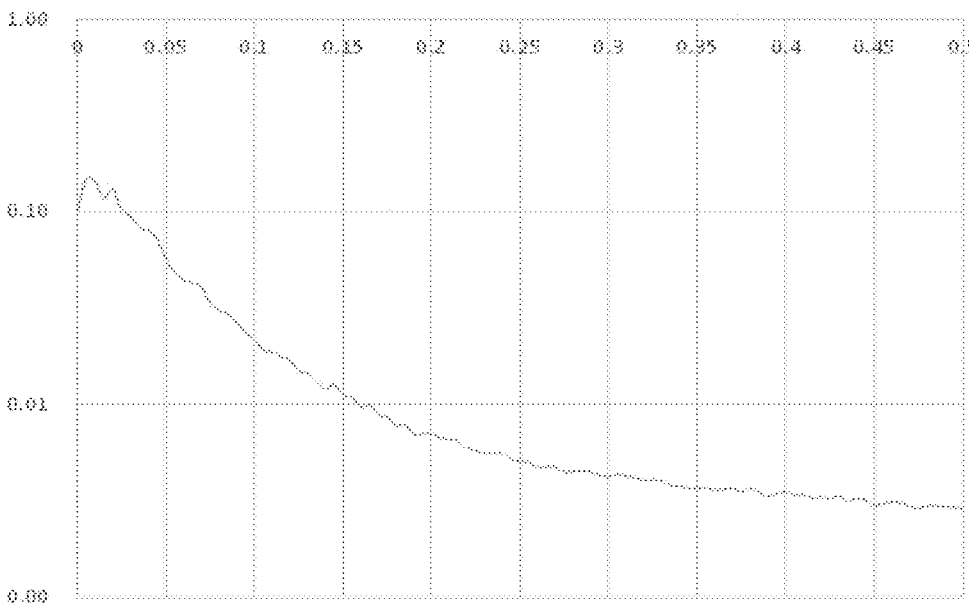
Spatial frequency/amplitude

[Fig. 15]
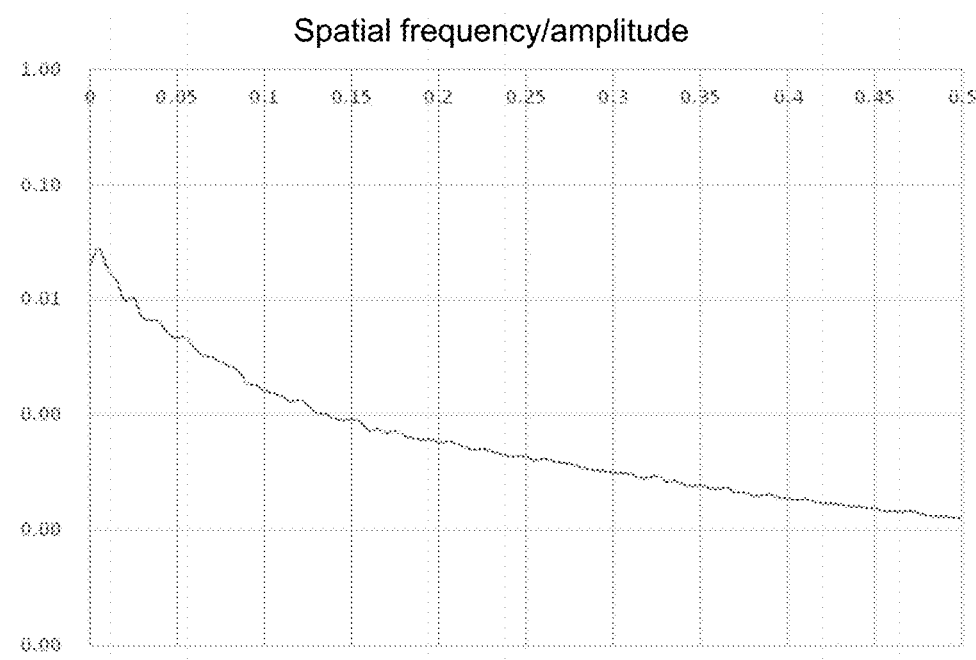
[Fig. 16]
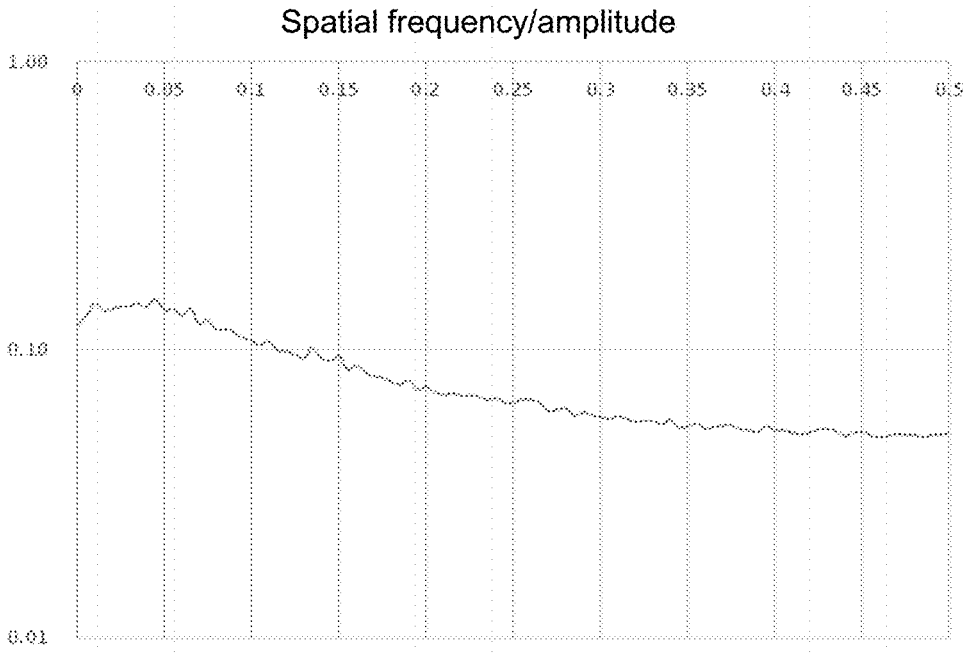

[Fig. 17]
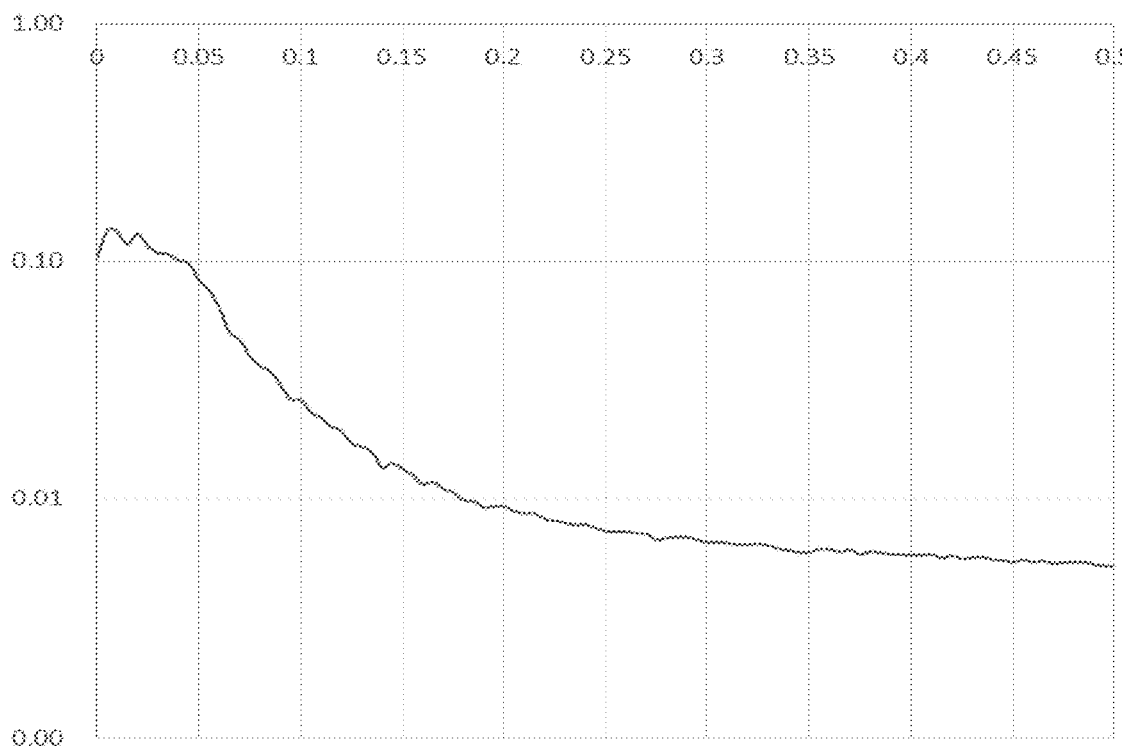
Spatial frequency/amplitude
[Fig. 18]
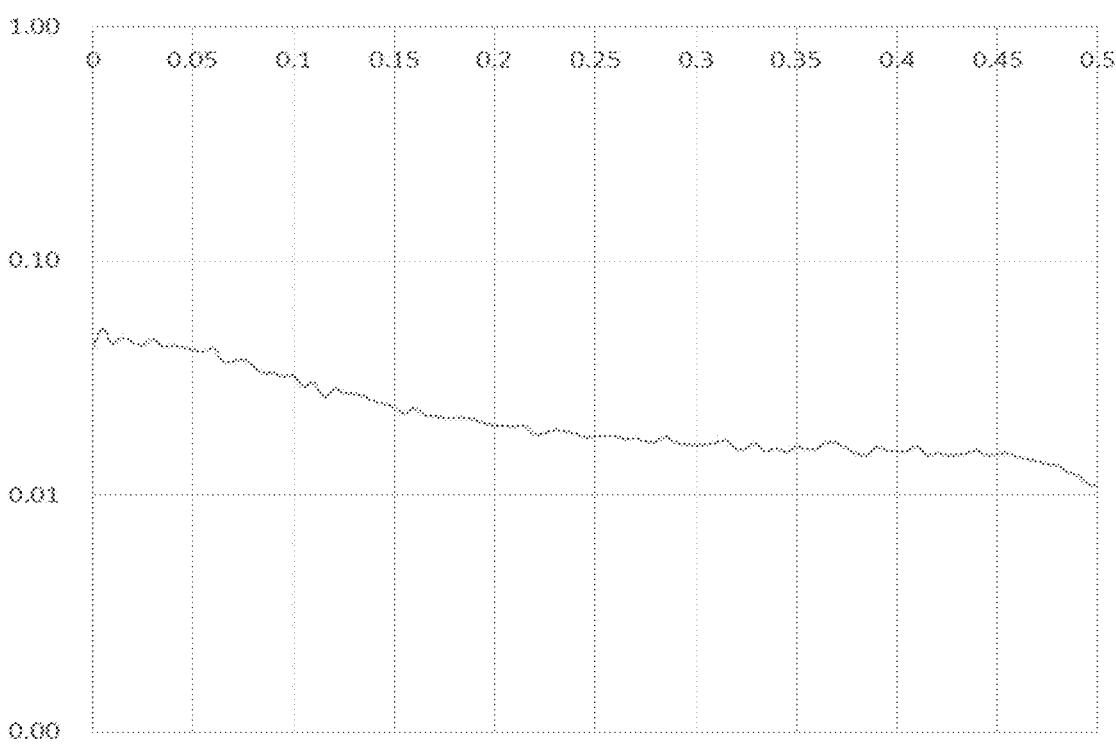
Spatial frequency/amplitude

[Fig. 19]
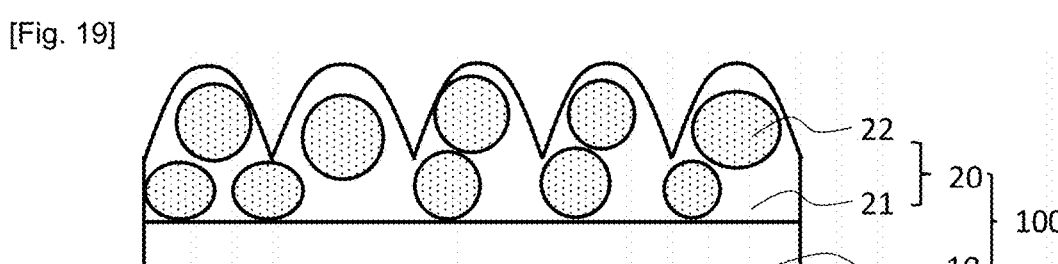
[Fig. 20]
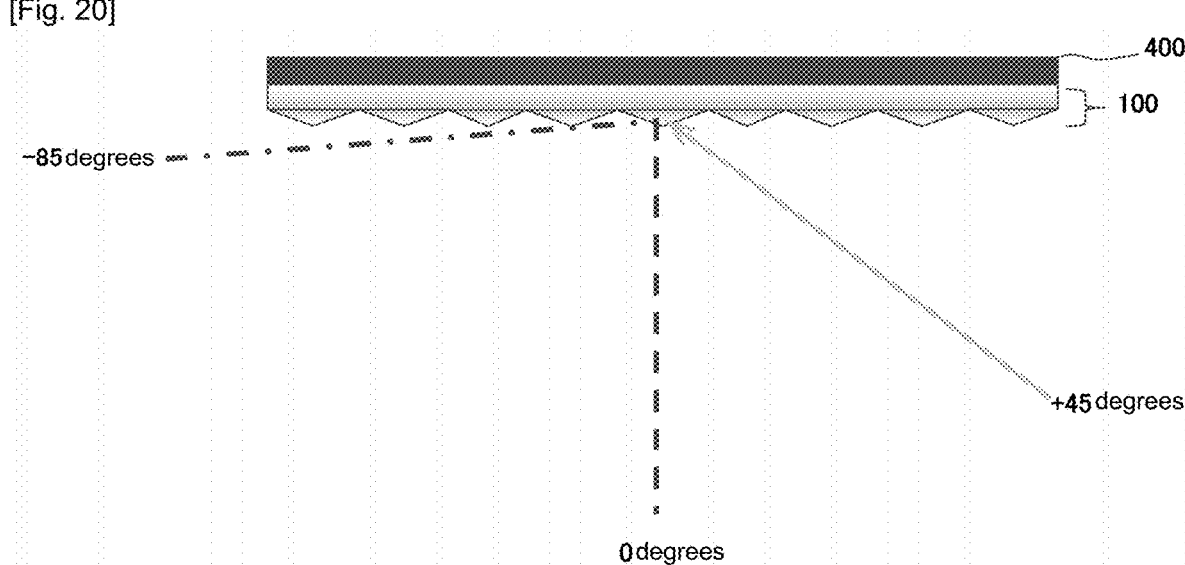
[Fig. 21]
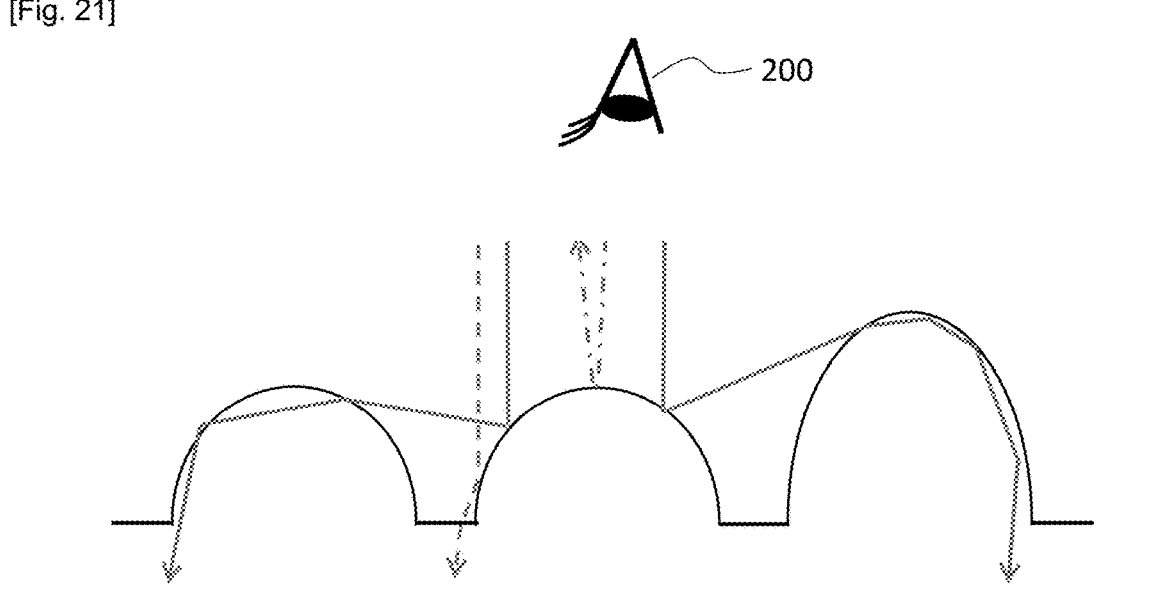

[Fig. 22]
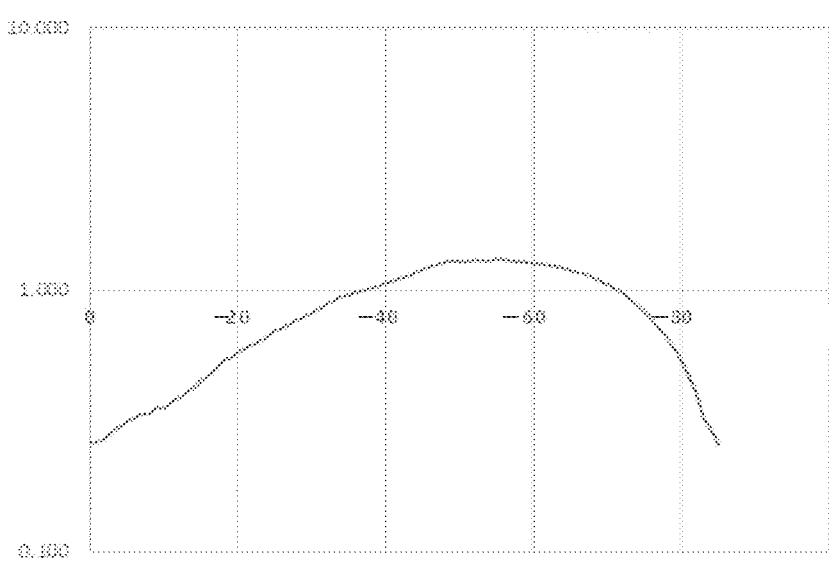
[Fig. 23]
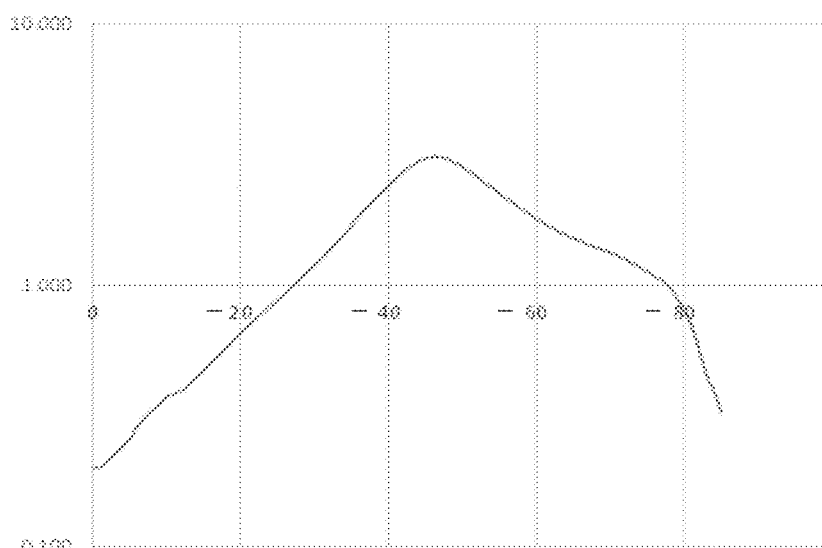

[Fig. 24]
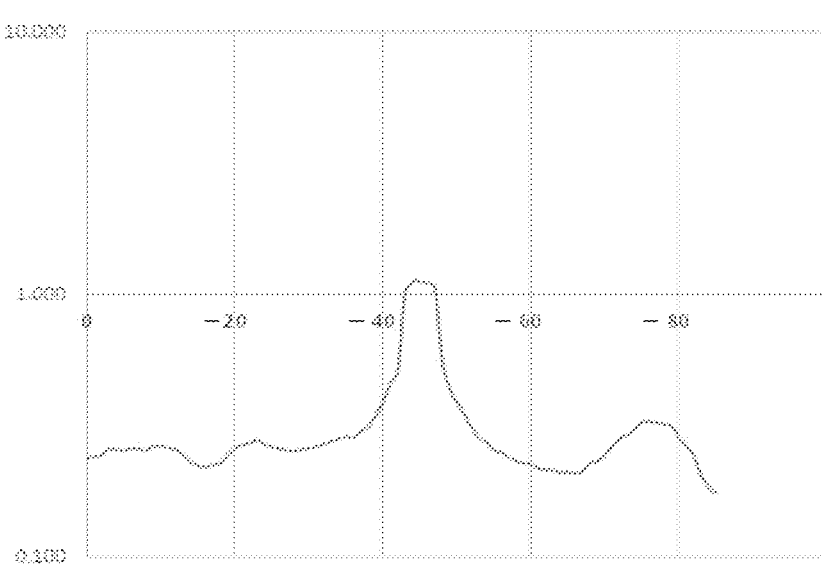
[Fig. 25]
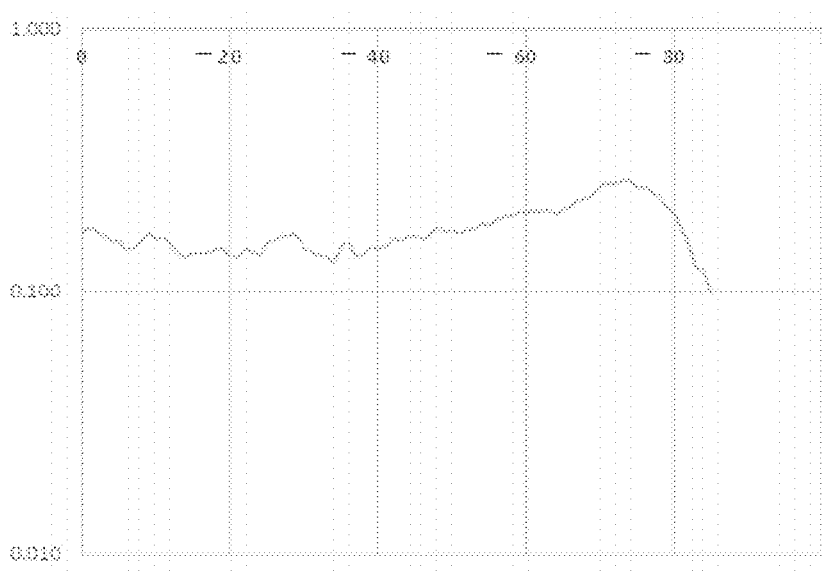

[Fig. 26]
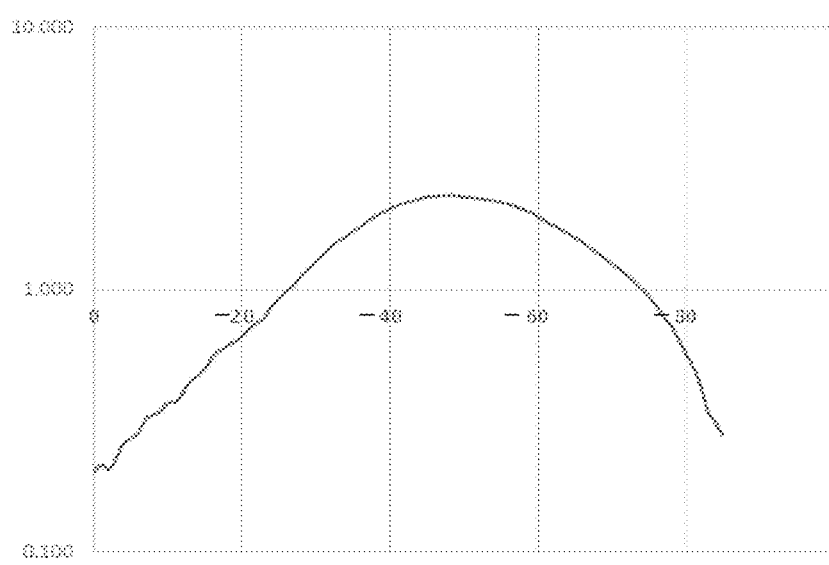
[Fig. 27]
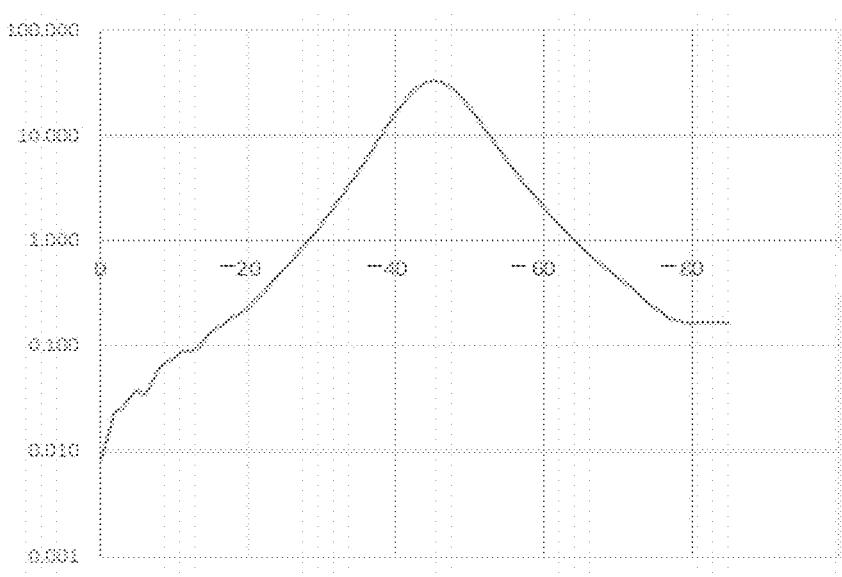

[Fig. 28]
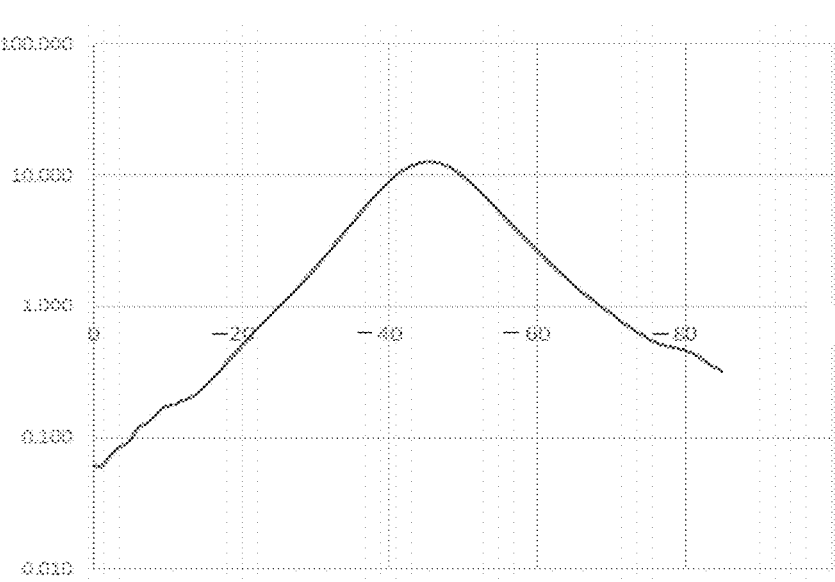
[Fig. 29]
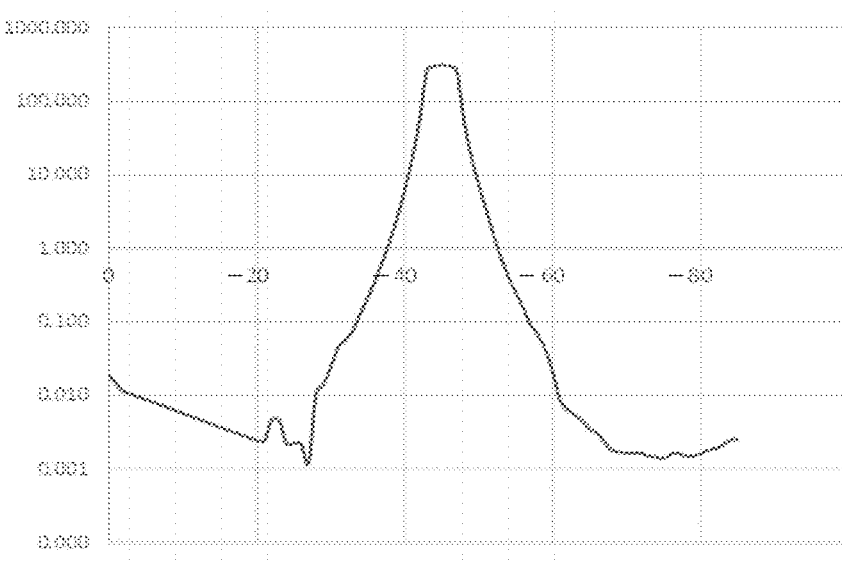

[Fig. 30]
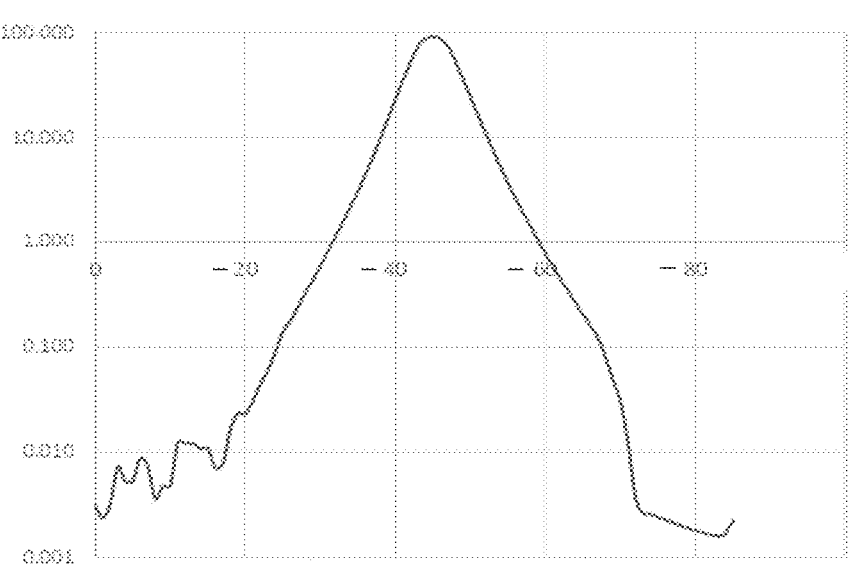

ANTI-GLARE FILM AND IMAGE DISPLAY DEVICE

TECHNICAL FIELD

The present disclosure relates to an anti-glare film and an image display device.

BACKGROUND ART

An anti-glare film for suppressing reflection of a background such as illumination or a person may be installed on the surface of an image display device such as a monitor of a TV, a laptop PC, or a desktop PC.

The anti-glare film has a basic structure in which an anti-glare layer having an unevenly shaped surface is provided on a transparent substrate. As such an anti-glare film, for example, Patent Literature 1 to 4 and the like have been proposed.

CITATION LIST

Patent Literature

PTL 1: JP 2005-234554 A
PTL 2: JP 2009-86410 A
PTL 3: JP 2009-265500 A
PTL 4: WO 2013/015039 A

SUMMARY OF INVENTION

Technical Problem

Conventional anti-glare films such as those described in PTL 1 to 4 impart anti-glare properties to such an extent that a reflected image is blurred, and therefore it has been difficult to sufficiently suppress reflection of a background such as illumination or a person.

On the other hand, by increasing the degree of roughness of the surface unevenness of the anti-glare layer, reflection is sufficiently suppressed, and therefore, the anti-glare properties can be enhanced. However, simply increasing the degree of roughness of the surface unevenness increases the intensity of reflected scattered light, resulting in a problem of impairing the contrast of the image display device.

An object of the present disclosure is to provide an anti-glare film excellent in anti-glare properties and capable of suppressing reflected scattered light.

Solution to Problem

The present disclosure provides an anti-glare film and a display device according to the following [1] to [5]:

[1] An anti-glare film comprising an anti-glare layer, the anti-glare film having an uneven surface, wherein for amplitude spectrum of elevation of the uneven surface, when a sum of amplitudes corresponding to spatial frequencies of $0.005 \ \mu m^{-1}$, $0.010 \ \mu m^{-1}$, and $0.015 \ \mu m^{-1}$ is defined as AM1 and an amplitude at a spatial frequency of $0.300 \ \mu m^{-1}$ is defined as AM2, AM1 is $0.070 \ \mu m$ or more and $0.400 \ \mu m$ or less, AM2 is $0.0050 \ \mu m$ or more, and AM2<AM1.

[2] An anti-glare film comprising an anti-glare layer, the anti-glare film having an uneven surface, wherein a smoothed reflected light intensity measured under the following measurement conditions satisfies the following conditions 1 and 2:

<Measurement Conditions>

(1) in in a transmission measurement mode of a goniophotometer, a visible light beam is emitted as a parallel light beam from a light source of the goniophotometer, an intensity of the emitted light is measured at an aperture angle of 1 degree without passing through a sample, and standardization is performed so that the maximum intensity is 100,000;

(2) a black plate is bonded to a surface opposite to the uneven surface of the anti-glare film via a transparent adhesive layer to produce a sample α in which the anti-glare film, the transparent adhesive layer, and the black plate are laminated and which has the uneven surface;

(3) the sample α is placed in the goniophotometer, the uneven surface of the sample α is irradiated with a visible light beam as a parallel light beam from the light source of the goniophotometer, and a reflected light intensity is measured at an aperture angle of 1 degree, wherein an irradiation angle of the parallel light beam is set to a direction inclined by +45 degrees from a normal direction of the sample α, the reflected light intensity is measured at intervals of 1 degree from 0 degrees, which is the normal direction of the sample α, to −85 degrees, and in order to maintain effects of standardization in (1), the reflected light intensity is measured in the transmission measurement mode; and (4) a smoothing process represented by the following formula (i) is performed at each angle from 0 degrees to −85 degrees, and the reflected light intensity after the smoothing process is defined as the smoothed reflected light intensity at each angle:

$$n\text{-degree smoothed reflected light intensity} = ([n-2\text{-degree reflected light intensity}] + [n-1\text{-degree reflected light intensity}] + [n\text{-degree reflected light intensity}] + [n+1\text{-degree reflected light intensity}] + [n+2\text{-degree reflected light intensity}])/5 \quad (i)$$

<Condition 1> when the n-degree smoothed reflected light intensity is defined as Rn, and the n−1-degree smoothed reflected light intensity is defined as Rn−1, a maximum absolute value of difference between Rn and Rn−1 is 2.00 or less, and <Condition 2> the smoothed reflected light intensity at −35 degrees is 4.0 or less.

[3] An anti-glare film comprising an anti-glare layer, the anti-glare film having an uneven surface, wherein the uneven surface has a three-dimensional arithmetic mean roughness Sa of $0.30 \ \mu m$ or more, and a three-dimensional mean peak interval Smp of $10.00 \ \mu m$ or less.

[4] An anti-glare film comprising an anti-glare layer, the anti-glare film having an uneven surface and having any configuration selected from the group consisting of the following first configuration, second configuration, and third configuration:

<<First Configuration>> for amplitude spectrum of elevation of the uneven surface, when a sum of amplitudes corresponding to spatial frequencies of $0.005 \ \mu m^{-1}$, $0.010 \ \mu m^{-1}$, and $0.015 \ \mu m^{-1}$ is defined as AM1 and an amplitude at a spatial frequency of $0.300 \ \mu m^{-1}$ is defined as AM2, AM1 is $0.070 \ \mu m$ or more and $0.400 \ \mu m$ or less, AM2 is $0.0050 \ \mu m$ or more, and AM2<AM1;

<<Second Configuration>> a smoothed reflected light intensity measured under the following measurement conditions satisfies the following conditions 1 and 2:

<Measurement Conditions>
(1) in a transmission measurement mode of a goniopho-
tometer, a visible light beam is emitted as a parallel
light beam from a light source of the goniophotometer,
an intensity of the emitted light is measured at an
aperture angle of 1 degree without passing through a
sample, and standardization is performed so that the
maximum intensity is 100,000;
(2) a black plate is bonded to a surface opposite to the
uneven surface of the anti-glare film via a transparent
adhesive layer to produce a sample α in which the
anti-glare film, the transparent adhesive layer, and the
black plate are laminated and which has the uneven
surface;
(3) the sample α is placed in the goniophotometer, the
uneven surface of the sample α is irradiated with a
visible light beam as a parallel light beam from the light
source of the goniophotometer, and a reflected light
intensity is measured at an aperture angle of 1 degree,
wherein an irradiation angle of the parallel light beam
is set to a direction inclined by +45 degrees from a
normal direction of the sample α, the reflected light
intensity is measured at intervals of 1 degree from 0
degrees, which is the normal direction of the sample α,
to −85 degrees, and in order to maintain effects of
standardization in (1), the reflected light intensity is
measured in the transmission measurement mode; and
(4) a smoothing process represented by the following
formula (i) is performed at each angle from 0 degrees
to −85 degrees, and the reflected light intensity after the
smoothing process is defined as the smoothed reflected
light intensity at each angle:

$n$-degree smoothed reflected light intensity=([$n$−2-
degree reflected light intensity]+[$n$−1-degree
reflected light intensity]+[$n$-degree reflected
light intensity]+[$n$+1-degree reflected light
intensity]+[$n$+2-degree reflected light inten-
sity])/5     (i)

<Condition 1>
when the n-degree smoothed reflected light intensity is
defined as Rn, and the n−1-degree smoothed reflected light
intensity is defined as Rn−1, a maximum absolute value of
difference between Rn and Rn−1 is 2.00 or less, and
<Condition 2>
the smoothed reflected light intensity at −35 degrees is 4.0
or less; and
<<Third Configuration>>
the uneven surface has a three-dimensional arithmetic
mean roughness Sa of 0.30 μm or more, and a three-
dimensional mean peak interval Smp of 10.00 μm or less.
[5] An image display device comprising:
a display element; and
the anti-glare film according to any one of [1] to [4]
disposed on the display element so that a surface of the
anti-glare film on the uneven surface side is disposed so
as to face the opposite side to the display element, the
anti-glare film being disposed on an outermost surface.

Advantageous Effects of Invention

The anti-glare film and image display device of the
present disclosure are excellent in anti-glare properties and
capable of suppressing reflected scattered light.

BRIEF DESCRIPTION OF DRAWINGS

FIG. 1 is a schematic cross-sectional view showing one
embodiment of an anti-glare film of the present disclosure;

FIG. 2 is a schematic view for explaining the behavior of
light incident on an anti-glare layer;
FIG. 3 is a cross-sectional view showing one embodiment
of an image display device of the present disclosure;
FIG. 4 is a view for explaining a method of calculating an
amplitude spectrum of an elevation of an uneven surface;
FIG. 5 is a view for explaining a method of calculating an
amplitude spectrum of an elevation of an uneven surface;
FIG. 6 is a graph showing the relationship between spatial
frequency and amplitude of an anti-glare film of Example
1-1;
FIG. 7 is a graph showing the relationship between spatial
frequency and amplitude of an anti-glare film of Example
1-2;
FIG. 8 is a graph showing the relationship between spatial
frequency and amplitude of an anti-glare film of Example
1-3;
FIG. 9 is a graph showing the relationship between spatial
frequency and amplitude of an anti-glare film of Example
1-4;
FIG. 10 is a graph showing the relationship between
spatial frequency and amplitude of an anti-glare film of
Example 1-5;
FIG. 11 is a graph showing the relationship between
spatial frequency and amplitude of an anti-glare film of
Comparative Example 1-1;
FIG. 12 is a graph showing the relationship between
spatial frequency and amplitude of an anti-glare film of
Comparative Example 1-2;
FIG. 13 is a graph showing the relationship between
spatial frequency and amplitude of an anti-glare film of
Comparative Example 1-3;
FIG. 14 is a graph showing the relationship between
spatial frequency and amplitude of an anti-glare film of
Comparative Example 1-4;
FIG. 15 is a graph showing the relationship between
spatial frequency and amplitude of an anti-glare film of
Comparative Example 1-5;
FIG. 16 is a graph showing the relationship between
spatial frequency and amplitude of an anti-glare film of
Comparative Example 1-6;
FIG. 17 is a graph showing the relationship between
spatial frequency and amplitude of an anti-glare film of
Example 1-6;
FIG. 18 is a graph showing the relationship between
spatial frequency and amplitude of an anti-glare film of
Example 1-7;
FIG. 19 is a schematic cross-sectional view showing one
embodiment of the anti-glare film of the present disclosure;
FIG. 20 is a schematic view for explaining a method of
measuring reflected light intensity;
FIG. 21 is a schematic view for explaining the behavior
of light incident on an anti-glare layer;
FIG. 22 is a graph showing the smoothed reflected light
intensity for each angle of an anti-glare film of Example 2-1;
FIG. 23 is a graph showing the smoothed reflected light
intensity for each angle of an anti-glare film of Example 2-2;
FIG. 24 is a graph showing the smoothed reflected light
intensity for each angle of an anti-glare film of Example 2-3;
FIG. 25 is a graph showing the smoothed reflected light
intensity for each angle of an anti-glare film of Example 2-4;
FIG. 26 is a graph showing the smoothed reflected light
intensity for each angle of an anti-glare film of Example 2-5;
FIG. 27 is a graph showing the smoothed reflected light
intensity for each angle of an anti-glare film of Comparative
Example 2-1;

5
6

FIG. 28 is a graph showing the smoothed reflected light intensity for each angle of an anti-glare film of Comparative Example 2-2;

FIG. 29 is a graph showing the smoothed reflected light intensity for each angle of an anti-glare film of Comparative Example 2-3; and FIG. 30 is a graph showing the smoothed reflected light intensity for each angle of an anti-glare film of Comparative Example 2-4.

DESCRIPTION OF EMBODIMENTS

Embodiments of the present disclosure will be described below.

[Anti-Glare Film of First Embodiment]

An anti-glare film of the first embodiment of the present disclosure is an anti-glare film including an anti-glare layer, the anti-glare film having an uneven surface, wherein for amplitude spectrum of elevation of the uneven surface, when a sum of amplitudes corresponding to spatial frequencies of 0.005 $\mu m^{-1}$, 0.010 $\mu m^{-1}$, and 0.015 $\mu m^{-1}$ is defined as AM1 and an amplitude at a spatial frequency of 0.300 $\mu m^{-1}$ is defined as AM2, AM1 is 0.070 $\mu m$ or more and 0.400 $\mu m$ or less, AM2 is 0.0050 $\mu m$ or more, and AM2<AM1.

In the present specification, AM1 is the sum of the amplitudes of the three spatial frequencies and is represented by the following formula. When the expression "In the present specification, "xxx"." is given, "xxx" is a description common to anti-glare films of the first, second, and third embodiments, unless otherwise specified. For example, the expression "In the present specification, AM1 is represented by the following formula." has the same meaning as the expression "in the anti-glare films of the first, second, and third embodiments, AM1 is represented by the following formula.", unless otherwise specified.

$$AM1 = \text{amplitude at spatial frequency } 0.005 \ \mu m^{-1} +$$
$$\text{amplitude at spatial frequency } 0.010 \ \mu m^{-1} +$$
$$\text{amplitude at spatial frequency } 0.015 \ \mu m^{-1}$$

Since the spatial frequency is a discrete value depending on the length of one side, a spatial frequency corresponding to 0.005 $\mu m^{-1}$, 0.010 $\mu m^{-1}$, 0.015 $\mu m^{-1}$, and 0.300 $\mu m^{-1}$ may not be obtained. In the present specification, in a case where there is no spatial frequency that matches the value, the amplitude of a spatial frequency having a value closest to the value is extracted.

FIG. 1 is a schematic cross-sectional view of the cross-sectional shape of an anti-glare film 100 of the first embodiment of the present disclosure.

The anti-glare film 100 of FIG. 1 has an anti-glare layer 20 and has an uneven surface. In FIG. 1, a surface of the anti-glare layer 20 is the uneven surface of the anti-glare film. The anti-glare film 100 of FIG. 1 has the anti-glare layer 20 on a transparent substrate 10. The anti-glare layer 20 in FIG. 1 has a binder resin 21 and organic particles 22.

FIG. 1 is a schematic cross-sectional view. That is, the scale of each layer constituting the anti-glare film 100, the scale of each material, and the scale of the surface unevenness are schematic for easy illustration, and thus are different from the actual scale. The same applies to FIGS. 2 to 4 and FIGS. 19 to 21.

The anti-glare film of the first embodiment of the present disclosure is not limited to the laminated structure shown in FIG. 1 as long as it has an anti-glare layer with an uneven surface where AM1 is 0.070 $\mu m$ or more and 0.400 $\mu m$ or less, AM2 is 0.0050 $\mu m$ or more, and AM2<AM1. For example, the anti-glare film may have a single-layer structure of an anti-glare layer, or may have a layer other than the transparent substrate and the anti-glare layer, such as an anti-reflection layer and an anti-fouling layer. When another layer is provided on the anti-glare layer, a surface of the other layer may be the uneven surface of the anti-glare film.

In the first embodiment, a preferred embodiment of the anti-glare film includes an anti-glare layer on a transparent substrate, wherein a surface of the anti-glare layer opposite to the transparent substrate is the uneven surface.

<Transparent Substrate>

The anti-glare film of the first embodiment, and the anti-glare films of the second and third embodiments described later, preferably have a transparent substrate in terms of ease of production of the anti-glare film and ease of handling of the anti-glare film.

In the first, second, and third embodiments, the transparent substrate preferably has light transmittance, smoothness, heat resistance, and excellent mechanical strength. Examples of such a transparent substrate include plastic films such as polyester, triacetyl cellulose (TAC), cellulose diacetate, cellulose acetate butyrate, polyamide, polyimide, polyether sulfone, polysulfone, polypropylene, polymethylpentene, polyvinyl chloride, polyvinyl acetal, polyether ketone, polymethyl methacrylate, polycarbonate, polyurethane, and amorphous olefin (Cyclo-Olefin-Polymer: COP). The transparent substrate may be a laminate of two or more plastic films.

Among the above, in order to improve the mechanical strength and the dimensional stability, a polyester such as polyethylene terephthalate or polyethylene naphthalate subjected to a stretching process, particularly, a biaxial stretching process is preferable. TAC and acrylic are preferable because light transmittance and optical isotropy can be easily improved. COP and polyester are preferable in terms of excellent weather resistance.

In the first, second, and third embodiments, the thickness of the transparent substrate is preferably 5 $\mu m$ or more and 300 $\mu m$ or less, more preferably 20 $\mu m$ or more and 200 $\mu m$ or less, and still more preferably 30 $\mu m$ or more and 120 $\mu m$ or less.

When it is desired to reduce the thickness of the anti-glare film, the upper limit of the thickness of the transparent substrate is preferably 60 $\mu m$, and more preferably 50 $\mu m$. When the transparent substrate is a low moisture-permeable substrate such as polyester, COP, or acrylic, the upper limit of the thickness of the transparent substrate for forming a thin film is preferably 40 $\mu m$, and more preferably 20 $\mu m$. Even in the case of a large screen, when the upper limit of the thickness of the transparent substrate is within the aforementioned range, strain is less likely to occur, which is also preferable.

The thickness of the transparent substrate can be measured with Digimatic standard outside micrometer (product number "MDC-25SX" available from MITUTOYO CORPORATION) or the like. As the thickness of the transparent substrate, the average of the values measured at any ten points thereof may be the value described above.

In the first, second, and third embodiments, examples of the preferred range of the thickness of the transparent substrate include 5 $\mu m$ or more and 300 $\mu m$ or less, 5 $\mu m$ or more and 200 $\mu m$ or less, 5 $\mu m$ or more and 120 $\mu m$ or less, 5 $\mu m$ or more and 60 $\mu m$ or less, 5 $\mu m$ or more and 50 $\mu m$ or less, 5 $\mu m$ or more and 40 $\mu m$ or less, 5 $\mu m$ or more and 20 $\mu m$ or less, 20 $\mu m$ or more and 300 $\mu m$ or less, 20 $\mu m$ or more and 200 $\mu m$ or less, 20 $\mu m$ or more and 120 $\mu m$ or less, 20 $\mu m$ or more and 60 $\mu m$ or less, 20 $\mu m$ or more and 50 $\mu m$

7 or less, 30 μm or more and 300 μm or less, 30 μm or more and 200 μm or less, 30 μm or more and 120 μm or less, 30 μm or more and 60 μm or less, and 30 μm or more and 50 μm or less.

In the first, second, and third embodiments, a surface of the transparent substrate may be subjected to a physical treatment such as a corona discharge treatment or a chemical treatment, or an easily adhesive layer may be formed on the surface of the transparent substrate to improve adhesiveness.

<Uneven Surface>

The anti-glare film of the first embodiment is required to have an uneven surface.

The anti-glare film of the first embodiment requires that for amplitude spectrum of elevation of the uneven surface, AM1 is 0.070 μm or more and 0.400 μm or less, AM2 is 0.0050 μm or more, and AM2<AM1.

When there is no other layer on the anti-glare layer, the surface of the anti-glare layer may satisfy the above conditions of the uneven surface. When there is another layer on the anti-glare layer, the surface of the other layer may satisfy the above conditions of the uneven surface.

In the present specification, "elevation of the uneven surface" means the linear distance in the direction of the normal V of the anti-glare film between any point P on the uneven surface and a virtual plane M having an average height of the uneven surface (see FIG. 4). The elevation of the virtual plane M is set to 0 μm as a reference. The direction of the normal V is the normal direction of the virtual plane M. When the elevation of any point P is higher than the average height, the elevation is positive, and when the elevation of any point P is lower than the average height, the elevation is negative.

In the present specification, words including "elevation" mean elevations based on the above average height, unless otherwise specified.

The spatial frequency and amplitude can be obtained by Fourier transforming the three-dimensional coordinate data of the uneven surface. The method of calculating the spatial frequency and amplitude from the three-dimensional coordinate data of the uneven surface herein will be described later.

<<AM1, AM2>>

For amplitude spectrum of elevation of the uneven surface, it can be said that the spatial frequency is generally correlated with "the reciprocal of the interval between the convex portions", and the amplitude is generally correlated with "the amount of change in the elevation of the convex portions having a predetermined interval". The spatial frequency of 0.005 μm$^{-1}$ indicates that the interval is about 200 μm, the spatial frequency of 0.010 μm$^{-1}$ indicates that the interval is about 100 μm, the spatial frequency of 0.015 μm$^{-1}$ indicates that the interval is about 67 μm, and the spatial frequency of 0.300 μm$^{-1}$ indicates that the interval is about 3 μm. It can be said that "the amount of change in the elevation of the convex portions having a predetermined interval" is generally proportional to the absolute value of each individual height of convex portions having a predetermined interval.

Therefore, it can be said that it is indirectly defined that the uneven surfaces in which AM1 is 0.070 μm or more and 0.400 μm or less, AM2 is 0.0050 μm or more, and AM2<AM1 include the following convex portion groups i and ii.

<Convex Portion Group of i>

Those in which a plurality of convex portions i are disposed at intervals of about 67 μm or more and 200 μm or less, and the absolute value of the height of the convex portions i is within a predetermined range.

<Convex Portion Group of ii>

Those in which a plurality of convex portions ii are arranged at intervals of about 3 μm, and the absolute value of the height of the convex portions ii is greater than or equal to a predetermined value and less than the absolute value of the height of the convex portions i.

It is considered that the uneven surface having the convex portion groups of i and ii described above can exhibit excellent anti-glare properties and can suppress reflected scattered light mainly for the following reasons (x1) to (x5). Explanation will be given below with reference to FIG. 2. In FIG. 2, the convex portions with large intervals in the uneven structure indicates convex portions i. In FIG. 2, convex portions with small intervals between a convex portion i and another convex portion i, and convex portions with small intervals in the uneven structure present at both left and right ends of FIG. 2 are convex portions ii. In FIG. 2, the outer edges of the convex portions having large absolute values of height are drawn with a smooth line, but the outer edges may have fine unevenness. For example, it is considered that the anti-glare films of Examples 1-1 to 1-7 have fine unevenness on the outer edges of the convex portions having large absolute values of height.

(x1) In the convex portion group of i, the interval between adjacent convex portions i is not too long, and the convex portions i have a predetermined height. Therefore, most of the reflected light reflected by the surface of any convex portion i is incident on the adjacent convex portion i. Then, the light repeats total reflection inside the adjacent convex portion i, and finally travels opposite to the observer 200 (solid line image in FIG. 2).

(x2) Reflected light of the light incident on the steep slope of any convex portion i travels opposite to the observer 200 regardless of the adjacent convex portion i (dashed line image in FIG. 2).

(x3) Normally, the region between a convex portion i and another convex portion i is likely to form a substantially flat portion that causes specularly reflected light. However, in the first embodiment, since the convex portion group ii is formed in the region between a convex portion i and another convex portion i, the proportion of the specularly reflected light in the reflected light reflected by the region can be reduced.

(x4) The reflected light reflected in the region between a convex portion i and another convex portion i tends to collide with the adjacent peaks. Therefore, the angular distribution of the reflected light reflected by the region is not biased to a predetermined angle, and becomes a substantially uniform angular distribution.

(x5) The reflected light of the light incident on the gentle slope of the convex portion i travels toward the observer 200 (dashed-dotted line image in FIG. 2). Since the angular distribution of the gentle slope of the convex portion i is uniform, the angular distribution of the reflected light is also uniform without being biased to a specific angle.

First, from (x1) to (x3) above, it is considered that the anti-glare properties can be improved at a predetermined level because the reflected scattered light can be suppressed.

Furthermore, from (x4) and (x5) above, even when a small amount of reflected scattered light is generated, the angular distribution of the reflected scattered light can be made uniform. Even when the amount of the reflected scattered light is very small, when the angular distribution of the reflected scattered light is biased to a specific angle, the light is recognized as reflected light. Therefore, the anti-glare properties can be made extremely good from (x4) and (x5) above.

Further, from (x1) to (x5) above, the observer can hardly perceive the reflected scattered light, which gives the anti-glare film a jet-black appearance, and furthermore, gives the image display device a luxurious feel.

When AM1 is 0.070 μm or more and 0.400 μm or less, AM2 is 0.0050 μm or more, and AM2<AM1, the effects of (x1) to (x5) above are more likely to occur, which makes it possible to have good anti-glare properties and also makes it easier to give jet-black appearance by suppressing reflected scattered light.

In order to facilitate the effects of (x1) to (x5) above to occur, AM1 is preferably 0.090 μm or more and 0.390 μm or less, more preferably 0.130 μm or more and 0.380 μm or less, and still more preferably 0.150 μm or more and 0.370 μm or less.

When AM is too small, the anti-glare properties tend to be particularly insufficient.

On the other hand, when AM1 is too large, the resolution of the video tends to decrease. Further, when AM1 is too large, the proportion of light totally reflected by the uneven surface increases, so the transmittance of light such as image light entering from the opposite side of the uneven surface tends to decrease. Also, when AM1 is too large, the proportion of light reflected to the observer side increases due to the increase in the number of convex portions having a large absolute value of height, and thus the reflected scattered light may become conspicuous. Therefore, it is suitable that AM1 is not too large in order to suppress the deterioration of the resolution and the transmittance and to further suppress the reflected scattered light.

In the first, second, and third embodiments, examples of the preferred range of AM1 include 0.070 μm or more and 0.400 μm or less, 0.070 μm or more and 0.390 μm or less, 0.070 μm or more and 0.380 μm or less, 0.070 μm or more and 0.370 μm or less, 0.090 μm or more and 0.400 μm or less, 0.090 μm or more and 0.390 μm or less, 0.090 μm or more and 0.380 μm or less, 0.090 μm or more and 0.370 μm or less, 0.130 μm or more and 0.400 μm or less, 0.130 μm or more and 0.390 μm or less, 0.130 μm or more and 0.380 μm or less, 0.130 μm or more and 0.370 μm or less, 0.150 μm or more and 0.400 μm or less, 0.150 μm or more and 0.390 μm or less, 0.150 μm or more and 0.380 μm or less, and 0.150 μm or more and 0.370 μm or less.

In order to facilitate the effects of (x1) to (x5) above to occur, AM2 is preferably 0.0055 μm or more and 0.0550 μm or less, more preferably 0.0060 μm or more and 0.0500 μm or less, still more preferably 0.0070 μm or more and 0.0450 μm or less, and further preferably 0.0080 μm or more and 0.0400 μm or less.

When AM2 is too large, the resolution of the video tends to decrease. Therefore, it is also suitable that AM2 is not too large in order to suppress the deterioration of the resolution.

In the first, second, and third embodiments, examples of the preferred range of AM2 include 0.0050 μm or more and 0.0550 μm or less, 0.0050 μm or more and 0.0500 μm or less, 0.0050 μm or more and 0.0450 μm or less, 0.0050 μm or more and 0.0400 μm or less, 0.0055 μm or more and 0.0550 μm or less, 0.0055 μm or more and 0.0500 μm or less, 0.0055 μm or more and 0.0450 μm or less, 0.0055 μm or more and 0.0400 μm or less, 0.0060 μm or more and 0.0550 μm or less, 0.0060 μm or more and 0.0500 μm or less, 0.0060 μm or more and 0.0450 μm or less, 0.0060 μm or more and 0.0400 μm or less, 0.0070 μm or more and 0.0550 μm or less, 0.0070 μm or more and 0.0500 μm or less, 0.0070 μm or more and 0.0450 μm or less, 0.0070 μm or more and 0.0400 μm or less, 0.0080 μm or more and 0.0550 μm or less, 0.0080 μm or more and 0.0500 μm or less, 0.0080 μm or more and 0.0450 μm or less, and 0.0080 μm or more and 0.0400 μm or less.

In the present specification, the numerical values for amplitude spectrum of elevations such as AM1 and AM2, numerical values for optical properties such as haze and total light transmittance, numerical values for surface shapes such as Sa and Smp, and numerical values for smoothed reflected light intensity in the embodiment 2 mean the average values of the measurement values at sixteen points.

In the present specification, regarding the 16 measurement sites, it is preferable that 1 cm region from the outer edge of a measurement sample is left as a margin, in a region on the inner side of the margin, lines that divide the region into five equal parts in the vertical direction and the horizontal direction are drawn, and measurement is performed mainly at 16 sites of the intersection points. For example, in the case of a quadrangular measurement sample, 1 cm region from the outer edge of the quadrangle is left as a margin, and measurement is performed mainly at 16 sites of the intersection points of dotted lines that divide a region on the inner side of the margin in the vertical direction and the horizontal direction. In addition, the average value of the measurement values at 16 sites is regarded as the value of each parameter. When the measurement sample has a shape other than a quadrangle such as a circle, an ellipse, a triangle, or a pentagon, it is preferable to draw a quadrangle inscribed inside these shapes and measurement is performed at each of the sixteen points of the quadrangle according to the above method.

In the present specification, various parameters such as the amplitude spectrum of elevation such as AM1 and AM2, optical properties such as haze and total light transmittance, surface shapes such as Sa and Smp, and smoothed reflected light intensity of the embodiment 2 are measured at a temperature of 23±5° C. and a relative humidity of 40% or more and 65% or less, unless otherwise specified. Further, before starting each measurement, the measurement is performed after exposing the target sample to the atmosphere for 30 minutes or more.

In the present specification, AM1 is the sum of the amplitudes of the three spatial frequencies. That is, in the present specification, three intervals are taken into consideration for the intervals of the convex portions in AM1. In this manner, in the present specification, a plurality of intervals are taken into consideration for AM1, and thus, by setting AM1 to a predetermined value, an increase in reflection light due to the uniform intervals between the convex portions can easily be suppressed.

In the first embodiment, when the average of the amplitudes corresponding to the spatial frequencies of 0.005 $\mu m^{-1}$, 0.010 $\mu m^{-1}$, and 0.015 $\mu m^{-1}$ is defined as AM1ave, AM1ave is preferably 0.023 μm or more and 0.133 μm or less, more preferably 0.030 μm or more and 0.130 μm or less, still more preferably 0.043 μm or more and 0.127 μm or less, and further preferably 0.050 μm or more and 0.123 μm or less. AM1ave can be represented by the following formula.

$$AM1\text{ave} = (\text{amplitude at spatial frequency } 0.005\ \mu m^{-1} + \text{amplitude at spatial frequency } 0.010\ \mu m^{-1} + \text{amplitude at spatial frequency } 0.015\ \mu m^{-1})/3$$

In the first, second, and third embodiments, examples of the preferred range of AM1ave include 0.023 μm or more and 0.133 μm or less, 0.023 μm or more and 0.130 μm or less, 0.023 μm or more and 0.127 μm or less, 0.023 μm or more and 0.123 μm or less, 0.030 μm or more and 0.133 μm or less, 0.030 μm or more and 0.130 μm or less, 0.030 μm or more and 0.127 μm or less, 0.030 μm or more and 0.123 μm or less, 0.043 μm or more and 0.133 μm or less, 0.043 μm or more and 0.130 μm or less, 0.043 μm or more and 0.127 μm or less, 0.043 μm or more and 0.123 μm or less, 0.050 μm or more and 0.133 μm or less, 0.050 μm or more and 0.130 μm or less, 0.050 μm or more and 0.127 μm or less, and 0.050 μm or more and 0.123 μm or less.

In the first embodiment, when the amplitude corresponding to the spatial frequency of 0.005 μm$^{-1}$ is defined as AM1-1, the amplitude corresponding to the spatial frequency of 0.010 μm$^{-1}$ is defined as AM1-2, and the amplitude corresponding to the spatial frequency of 0.015 μm$^{-1}$ is defined as AM1-3, AM1-1, AM1-2, and AM1-3 are preferably in the following ranges. By setting AM1-1, AM1-2, and AM1-3 within the following ranges, it becomes easier to suppress the uniformity of the intervals between the convex portions, an increase in reflected light can easily be suppressed.

In the first, second, and third embodiments, AM1-1 is preferably 0.020 μm or more and 0.150 μm or less, more preferably 0.030 μm or more and 0.140 μm or less, still more preferably 0.040 μm or more and 0.130 μm or less, and further preferably 0.050 μm or more and 0.120 μm or less.

In the first, second, and third embodiments, examples of the preferred range of AM1-1 include 0.020 μm or more and 0.150 μm or less, 0.020 μm or more and 0.140 μm or less, 0.020 μm or more and 0.130 μm or less, 0.020 μm or more and 0.120 μm or less, 0.030 μm or more and 0.150 μm or less, 0.030 μm or more and 0.140 μm or less, 0.030 μm or more and 0.130 μm or less, 0.030 μm or more and 0.120 μm or less, 0.040 μm or more and 0.150 μm or less, 0.040 μm or more and 0.140 μm or less, 0.040 μm or more and 0.130 μm or less, 0.040 μm or more and 0.120 μm or less, 0.050 μm or more and 0.150 μm or less, 0.050 μm or more and 0.140 μm or less, 0.050 μm or more and 0.130 μm or less, and 0.050 μm or more and 0.120 μm or less.

In the first, second, and third embodiments, AM1-2 is preferably 0.020 μm or more and 0.145 μm or less, more preferably 0.030 μm or more and 0.135 μm or less, still more preferably 0.040 μm or more and 0.125 μm or less, and further preferably 0.050 μm or more and 0.120 μm or less.

In the first, second, and third embodiments, examples of the preferred range of AM1-2 include 0.020 μm or more and 0.145 μm or less, 0.020 μm or more and 0.135 μm or less, 0.020 μm or more and 0.125 μm or less, 0.020 μm or more and 0.120 μm or less, 0.030 μm or more and 0.145 μm or less, 0.030 μm or more and 0.135 μm or less, 0.030 μm or more and 0.125 μm or less, 0.030 μm or more and 0.120 μm or less, 0.040 μm or more and 0.145 μm or less, 0.040 μm or more and 0.135 μm or less, 0.040 μm or more and 0.125 μm or less, 0.040 μm or more and 0.120 μm or less, 0.050 μm or more and 0.145 μm or less, 0.050 μm or more and 0.135 μm or less, 0.050 μm or more and 0.125 μm or less, and 0.050 μm or more and 0.120 μm or less.

In the first, second, and third embodiments, AM1-3 is preferably 0.020 μm or more and 0.145 μm or less, more preferably 0.030 μm or more and 0.135 μm or less, still more preferably 0.040 μm or more and 0.125 μm or less, and further preferably 0.050 μm or more and 0.120 μm or less.

In the first, second, and third embodiments, examples of the preferred range of AM1-3 include 0.020 μm or more and 0.145 μm or less, 0.020 μm or more and 0.135 μm or less, 0.020 μm or more and 0.125 μm or less, 0.020 μm or more and 0.120 μm or less, 0.030 μm or more and 0.145 μm or less, 0.030 μm or more and 0.135 μm or less, 0.030 μm or more and 0.125 μm or less, 0.030 μm or more and 0.120 μm or less, 0.040 μm or more and 0.145 μm or less, 0.040 μm or more and 0.135 μm or less, 0.040 μm or more and 0.125 μm or less, 0.040 μm or more and 0.120 μm or less, 0.050 μm or more and 0.145 μm or less, 0.050 μm or more and 0.135 μm or less, 0.050 μm or more and 0.125 μm or less, and 0.050 μm or more and 0.120 μm or less.

In the anti-glare film of the first embodiment, AM1/AM2 is preferably 1.0 or more and 60.0 or less, more preferably 2.0 or more and 50.0 or less, still more preferably 3.0 or more and 40.0 or less, and further preferably 4.0 or more and 30.0 or less in order to improve the balance of the convex portions having different cycles and to facilitate the effects of (x1) to (x5) to occur.

In the first, second, and third embodiments, examples of the preferred range of AM1/AM2 include 1.0 or more and 60.0 or less, 1.0 or more and 50.0 or less, 1.0 or more and 40.0 or less, 1.0 or more and 30.0 or less, 2.0 or more and 60.0 or less, 2.0 or more and 50.0 or less, 2.0 or more and 40.0 or less, 2.0 or more and 30.0 or less, 3.0 or more and 60.0 or less, 3.0 or more and 50.0 or less, 3.0 or more and 40.0 or less, 3.0 or more and 30.0 or less, 4.0 or more and 60.0 or less, 4.0 or more and 50.0 or less, 4.0 or more and 40.0 or less, and 4.0 or more and 30.0 or less.

—Calculation Method for AM1 and AM2—

In the present specification, for amplitude spectrum of elevation of the uneven surface, AM1 means the sum of amplitudes corresponding to spatial frequencies of 0.005 μm$^{-1}$, 0.010 μm$^{-1}$, and 0.015 μm$^{-1}$. Also, in the present specification, for the amplitude spectrum, AM2 means the amplitude at the spatial frequency of 0.300 μm$^{-1}$. A method of calculating AM1 and AM2 in the present specification will be described below.

First, as described above, in the present specification, "elevation of the uneven surface" means the linear distance in the direction of the normal V of the anti-glare film between any point P on the uneven surface and a virtual plane M having an average height of the uneven surface (see FIG. 4). The elevation of the virtual plane M is set to 0 μm as a reference. The direction of the normal V is the normal direction of the virtual plane M.

When the orthogonal coordinates in the uneven surface of the anti-glare film are represented by (x, y), the elevation of the uneven surface of the anti-glare film can be represented by a two-dimensional function h(x, y) of the coordinates (x, y).

The elevation of the uneven surface is preferably measured using an interference microscope. Examples of interference microscopes include "New View" series available from Zygo Corporation.

The horizontal resolution required for the measuring instrument is at least 5 μm or less, preferably 1 μm or less, and the vertical resolution is at least 0.01 μm or less, preferably 0.001 μm or less.

Considering that the spatial frequency resolution is 0.0050 μm⁻¹, the elevation measurement area is preferably an area of at least 200 μm×200 μm.

Next, a method for obtaining the amplitude spectrum of elevation from the two-dimensional function h(x, y). First, from the two-dimensional function h(x, y), the amplitude spectrum Hx(fx) in the x direction and the amplitude spectrum Hy(fy) in the y direction are obtained by Fourier transform defined by the following formulas (1a) and (1b).

$$H_x(f_x) \equiv \int_{-\infty}^{\infty} h(x)\exp(-2\pi i f_x x)dx \tag{1a}$$

$$H_y(f_y) \equiv \int_{-\infty}^{\infty} h(y)\exp(-2\pi i f_y y)dy \tag{1b}$$

wherein fx and fy are the frequencies in the x and y directions, respectively, and have the dimensions of the inverse of the length. π in the formulas (1a) and (1b) is the pi and i is the imaginary unit. The amplitude spectrum H(f) can be obtained by averaging the amplitude spectrum Hx(fx) in the x direction and the amplitude spectrum Hy(fy) in the y direction. This amplitude spectrum H(f) represents the spatial frequency distribution of the uneven surface of the anti-glare film.

Hereinafter, the method for obtaining the amplitude spectrum H(f) of the elevation of the uneven surface of the anti-glare film will be described more specifically. The three-dimensional information of the surface shape actually measured by the above interference microscope is generally obtained as discrete values. That is, the three-dimensional information of the surface shape actually measured by the interference microscope is obtained as elevations corresponding to many measurement points.

FIG. 5 is a schematic view showing how the function h(x, y) representing elevation is discretely obtained. As shown in FIG. 5, when the orthogonal coordinates in the plane of the anti-glare layer are represented by (x, y) and the lines divided by Δ x in the x-axis direction and the lines divided by Δ y in the y-axis direction on the projection plane Sp are represented by broken lines, the elevation of the uneven surface is obtained as a discrete elevation value at each intersection of the broken lines on the projection plane Sp in actual measurement.

The number of elevation values obtained depends on the measurement range and Δx and Δy. As shown in FIG. 5, when the measurement range in the x-axis direction is X=(M−1)Δx and the measurement range in the y-axis direction is Y=(N−1)Δy, the number of obtained elevation values is M×N.

As shown in FIG. 5, when the coordinates of the point of interest A on the projection plane Sp are (jΔx, kΔy), the elevation of the point P on the uneven surface corresponding to the point of interest A can be represented by h(jΔx, kΔy). Here, j is 0 or more and M−1 or less, and α is 0 or more and N−1 or less.

Here, the measurement intervals Δx and Δy depend on the horizontal resolution of the measuring instrument, and in order to accurately evaluate the fine uneven surface, both Δx and Δy are preferably 5 μm or less as described above, and more preferably 2 μm or less. Both the measurement ranges X and Y are preferably 200 μm or more, as described above.

Thus, in actual measurement, the function representing the elevation of the uneven surface is obtained as a discrete function h(x,y) having M×N values. N discrete functions Hx(fx) and M discrete functions Hy(fy) are obtained by subjecting the discrete function h(x, y) obtained by the measurement to the discrete Fourier transformation defined by the following formulas (2a) and (2b) in the x direction and the y direction, respectively, and the amplitude spectrum H(f) is obtained by obtaining absolute values (=amplitudes) of the functions and then averaging all the functions according to the following formula (2c). In the present specification, M=N and Δx=Δy. In the following formulas (2a) to (2c), "1" is an integer of −M/2 or more and M/2 or less, and "m" is an integer of −N/2 or more and N/2 or less. Δfx and Δfy are frequency intervals in the x direction and the y direction, respectively, and are defined by the formulas (3) and (4) below.

$$H_{xk}(f_x) = H_{xk}(l\Delta f_x) \equiv \frac{1}{M}\sum_{j=0}^{M-1} h(j\Delta x, k\Delta y)\exp(-2\pi i j\Delta x l\Delta f_x) \tag{2a}$$

$$H_{yj}(f_y) = H_{yj}(m\Delta f_y) \equiv \frac{1}{N}\sum_{k=0}^{N-1} h(j\Delta x, k\Delta y)\exp(-2\pi i k\Delta y m\Delta f_y) \tag{2b}$$

$$H(f) = H(l\Delta f_x(=k\Delta f_y)) \equiv \left[\frac{1}{N}\sum_{k=0}^{N-1}|H_{xk}(f_x)| + \frac{1}{M}\sum_{j=0}^{M-1}|H_{yj}(f_y)|\right]/2 \tag{2c}$$

$$\Delta f_x \equiv \frac{1}{M\Delta x} \tag{3}$$

$$\Delta f_y \equiv \frac{1}{N\Delta y} \tag{4}$$

The discrete function H(f) of the amplitude spectrum calculated as described above represents the spatial frequency distribution of the uneven surface of the anti-glare film. FIGS. 6 to 18 show the discrete function H(f) of the amplitude spectrum of the elevation of the uneven surface of Examples 1-1 to 1-7 and Comparative Examples 1-1 to 1-6. In the figures, the horizontal axis represents the spatial frequency (unit: "μm⁻¹"), and the vertical axis represents the amplitude (unit: "μm").

<<Sa, Smp>>

The uneven surface of the anti-glare film of the first embodiment preferably has a three-dimensional arithmetic mean roughness Sa of 0.30 μm or more. Further, the uneven surface of the anti-glare film of the first embodiment preferably has a three-dimensional mean peak interval Smp of 10.00 μm or less.

By setting Sa and Smp in the above ranges, the uneven surface in which peaks having a high elevation are present at narrow intervals can be easily obtained, and AM1 and AM2 can be easily set within the above ranges.

In the first, second, and third embodiments, Sa is preferably 0.40 μm or more, more preferably 0.50 μm or more, and still more preferably 0.55 μm or more.

In the first, second, and third embodiments, Sa is preferably 1.00 μm or less, more preferably 0.80 μm or less, and still more preferably 0.70 μm or less.

In the first, second, and third embodiments, examples of the preferred range of Sa include 0.30 μm or more and 1.00 μm or less, 0.30 μm or more and 0.80 μm or less, 0.30 μm or more and 0.70 μm or less, 0.40 μm or more and 1.00 μm or less, 0.40 μm or more and 0.80 μm or less, 0.40 μm or more and 0.70 μm or less, 0.50 μm or more and 1.00 μm or less, 0.50 μm or more and 0.80 μm or less, 0.50 μm or more and 0.70 μm or less, 0.55 μm or more and 1.00 μm or less, 0.55 μm or more and 0.80 μm or less, and 0.55 μm or more and 0.70 μm or less.

In the first, second, and third embodiments, Smp is preferably 8.00 µm or less, more preferably 6.00 µm or less, still more preferably 4.50 µm or less, and further preferably 3.50 µm or less.

In the first, second, and third embodiments, Smp is preferably 1.00 µm or more, more preferably 1.50 µm or more, and still more preferably 2.00 µm or more.

In the first, second, and third embodiments, examples of the preferred range of Smp include 1.00 µm or more and 10.00 µm or less, 1.00 µm or more and 8.00 µm or less, 1.00 µm or more and 6.00 µm or less, 1.00 µm or more and 4.50 µm or less, 1.00 µm or more and 3.50 µm or less, 1.50 µm or more and 10.00 µm or less, 1.50 µm or more and 8.00 µm or less, 1.50 µm or more and 6.00 µm or less, 1.50 µm or more and 4.50 µm or less, 1.50 µm or more and 3.50 µm or less, 2.00 µm or more and 10.00 µm or less, 2.00 µm or more and 8.00 µm or less, 2.00 µm or more and 6.00 µm or less, 2.00 µm or more and 4.50 µm or less, and 2.00 µm or more and 3.50 µm or less.

In the uneven surface of the anti-glare film of the first embodiment, Sa/Smp is preferably 0.05 or more, more preferably 0.10 or more, and still more preferably 0.13 or more. By setting Sa/Smp to 0.05 or more, it is possible to further increase the tendency of high peaks having a high elevation to be present at narrow intervals on the uneven surface of the anti-glare layer, and AM1 and AM2 can be easily set within the above ranges.

Sa/Smp is preferably 0.50 or less, more preferably 0.40 or less, and still more preferably 0.25 or less.

In the first, second, and third embodiments, examples of the preferred range of Sa/Smp include 0.05 or more and 0.50 or less, 0.05 or more and 0.40 or less, 0.05 or more and 0.25 or less, 0.10 or more and 0.50 or less, 0.10 or more and 0.40 or less, 0.10 or more and 0.25 or less, 0.13 or more and 0.50 or less, 0.13 or more and 0.40 or less, and 0.13 or more and 0.25 or less.

<<Sz/Sa>>

In the anti-glare film of the first embodiment, Sz/Sa, which is the ratio of the three-dimensional ten-point average roughness Sz of the uneven surface and Sa, is preferably 5.0 or more, more preferably 5.5 or more, and still more preferably 6.0 or more. When Sz/Sa is 5.0 or more, a certain degree of randomness is imparted to the uneven surface, and defects such as scratches on the uneven surface can be made inconspicuous.

When Sz/Sa is too large, there is a possibility that peculiar points are present on the uneven surface, causing sparkle or locally reducing the jet-black appearance. In the present specification, sparkle is a phenomenon in which minute variations in brightness are visible in image light. Therefore, Sz/Sa is preferably 10.0 or less, more preferably 8.0 or less, and still more preferably 7.5 or less.

In the first, second, and third embodiments, examples of the preferred range of Sz/Sa include 5.0 or more and 10.0 or less, 5.0 or more and 8.0 or less, 5.0 or more and 7.5 or less, 5.5 or more and 10.0 or less, 5.5 or more and 8.0 or less, 5.5 or more and 7.5 or less, 6.0 or more and 10.0 or less, 6.0 or more and 8.0 or less, and 6.0 or more and 7.5 or less.

<<Ssk>>

In the anti-glare film of the first embodiment, the three-dimensional skewness Ssk of the uneven surface is preferably 0.60 or less, more preferably 0.20 or less, and still more preferably 0 or less. A small Ssk means that the uneven surface has a small proportion of low-elevation points where specularly reflected light can be generated. Therefore, by setting Ssk to 0.60 or less, the effects of anti-glare properties, suppression of reflected scattered light, and jet-black appearance can be exhibited more easily.

When Ssk is too small, the effects of (x5) above tend to increase reflected scattered light. Also, when Ssk is too small, the lower portions of adjacent peaks may overlap and slopes with large angles may disappear, reducing the effects of (x2) above. Therefore, Ssk is preferably −1.00 or more, more preferably −0.80 or more, and still more preferably −0.70 or more.

In the first, second, and third embodiments, examples of the preferred range of Ssk include −1.00 or more and 0.60 or less, −1.00 or more and 0.20 or less, −1.00 or more and 0 or less, −0.80 or more and 0.60 or less, −0.80 or more and 0.20 or less, −0.80 or more and 0 or less, −0.70 or more and 0.60 or less, −0.70 or more and 0.20 or less, and −0.70 or more and 0 or less.

Ssk is an index that indicates the degree of bias in the positive and negative directions of the distribution of elevation with respect to the average value of the elevation of the entire measurement surface. Ssk indicates 0 when the elevation distribution is a normal distribution. When the distribution of elevation is biased in the negative direction, Ssk indicates a positive value, and as the degree of bias in the negative direction increases, the value of Ssk increases in the positive direction. On the other hand, when the distribution of elevation is biased in the positive direction, Ssk indicates a negative value, and as the degree of bias in the positive direction increases, the value of Ssk increases in the negative direction.

<<Inclination Angle>>

The uneven surface of the anti-glare film of the first embodiment preferably has a predetermined inclination angle distribution.

Specifically, for the inclination angle of the uneven surface of the anti-glare film of the first embodiment, an inclination angle of more than 0 degrees and less than 1 degree is defined as $\theta 1$, an inclination angle of 1 degree or more and less than 3 degrees is defined as $\theta 2$, an inclination angle of 3 degrees or more and less than 10 degrees is defined as $\theta 3$, and an inclination angle of 10 degrees or more and less than 90 degrees is defined as $\theta 4$. Further, when the sum of $\theta 1$, $\theta 2$, $\theta 3$, and $\theta 4$ is 100%, the ratio of $\theta 1$, $\theta 2$, $\theta 3$, and $\theta 4$ is preferably within the following ranges. By setting $\theta 1$, $\theta 2$, $\theta 3$, and $\theta 4$ within the following ranges, AM1 and AM2 can easily be set within the above ranges.

$\theta 1 \leq 3.0\%$
$0.5\% \leq \theta 2 \leq 15.0\%$
$7.0\% \leq \theta 3 \leq 40.0\%$
$50.0\% \leq \theta 4 \leq 90.0\%$ In the first, second, and third embodiments, the ratio of $\theta 1$ is more preferably 2.0% or less, still more preferably 1.5% or less, and further preferably 1.2% or less. In the first, second, and third embodiments, the lower limit of the ratio of $\theta 1$ is not particularly limited, but is usually 0.1% or more.

In the first, second, and third embodiments, examples of the preferred range of the ratio of $\theta 1$ include 0.1% or more and 2.0% or less, 0.1% or more and 1.5% or less, and 0.1% or more and 1.2% or less.

In the first, second, and third embodiments, the ratio of $\theta 2$ is more preferably 12.0% or less, still more preferably 10.0% or less, and further preferably 8.0% or less. In the first, second, and third embodiments, the lower limit of the ratio of $\theta 2$ is more preferably 1.0% or more, still more preferably 1.5% or more, and further preferably 2.0% or more.

In the first, second, and third embodiments, examples of the preferred range of the ratio of $\theta 2$ include 1.0% or more and 12.0% or less, 1.0% or more and 10.0% or less, 1.0% or more and 8.0% or less, 1.5% or more and 12.0% or less, 1.5% or more and 10.0% or less, 1.5% or more and 8.0% or less, 2.0% or more and 12.0% or less, 2.0% or more and 10.0% or less, and 2.0% or more and 8.0% or less.

In the first, second, and third embodiments, the ratio of O3 is more preferably 8.5% or more, still more preferably 10.0% or more, and further preferably 12.0% or more. In the first, second, and third embodiments, the ratio of O3 is more preferably 35.0% or less, still more preferably 32.0% or less, and further preferably 30.0% or less.

In the first, second, and third embodiments, examples of the preferred range of the ratio of O3 include 8.5% or more and 35.0% or less, 8.5% or more and 32.0% or less, 8.5% or more and 30.0% or less, 10.0% or more and 35.0% or less, 10.0% or more and 32.0% or less, 10.0% or more and 30.0% or less, 12.0% or more and 35.0% or less, 12.0% or more and 32.0% or less, and 12.0% or more and 30.0% or less.

In the first, second, and third embodiments, the ratio of O4 is more preferably 55.0% or more, still more preferably 57.5% or more, and further preferably 60.0% or more. In the first, second, and third embodiments, the ratio of O4 is more preferably 88.0% or less, still more preferably 86.5% or less, and further preferably 85.0% or less.

In the first, second, and third embodiments, examples of the preferred range of the ratio of O4 include 55.0% or more and 88.0% or less, 55.0% or more and 86.5% or less, 55.0% or more and 85.0% or less, 57.5% or more and 88.0% or less, 57.5% or more and 86.5% or less, 57.5% or more and 85.0% or less, 60.0% or more and 88.0% or less, 60.0% or more and 86.5% or less, and 60.0% or more and 85.0% or less.

In the present specification, the three-dimensional arithmetic mean roughness Sa is obtained by expanding the two-dimensional roughness parameter Ra described in JIS B0601:1994 to three dimensions. Sa is calculated by the following formula (i), where X and Y axes of orthogonal coordinate axes are placed on the reference plane, the roughness curved surface is Z(x, y), and the size of the reference plane is Lx and Ly. In the formula (i), A=Lx×Ly.

$$Sa = \frac{1}{A} \int_0^{Lx} \int_0^{Ly} |Z(x, y)| dxdy \qquad \text{(i)}$$

In the present specification, the three-dimensional mean peak interval Smp is obtained as follows. When a portion surrounded by one region in a portion higher than the reference plane from the three-dimensional roughness curved surface is defined as one peak, the number of peaks is defined as Ps, and the area of the entire measurement region (reference plane) is defined as A, Smp is calculated by the following Formula (ii).

$$Smp = \sqrt{\frac{A}{Ps}} \qquad \text{(ii)}$$

In the present specification, the three-dimensional ten-point mean roughness Sz is obtained by expanding the ten-point mean roughness Rz, which is a two-dimensional roughness parameter described in JIS B0601:1994 to three dimensions.

A large number of straight lines passing through the center of a reference surface are radially arranged on the reference surface by 360 degrees so as to cover the entire area, a cross-sectional curve cut from a three-dimensional roughness curved surface on the basis of each straight line is obtained, and ten-point mean roughness in the cross-sectional curve is obtained. Here, the ten-point mean roughness is the sum of the average of the five highest peak heights from the highest peak and the average of the five deepest valley depths from the deepest valley. Sz is calculated by averaging the top 50% of a large number of ten-point mean roughness values thus obtained.

In the present specification, the three-dimensional skewness Ssk is obtained by expanding the skewness Rsk of the roughness curve of the two-dimensional roughness parameter described in JIS B0601:1994 to three dimensions. Ssk is calculated by the following formula (iii), where X and Y axes of orthogonal coordinate axes are placed on the reference plane, the measured surface shape curve is z=f(x, y), and the size of the reference plane is Lx and Ly. In the formula (iii), "Sq" is the root mean square deviation of the surface height distribution defined by the formula (iv) below.

$$Ssk = \frac{1}{Sq^3} \int_0^{Lx} \int_0^{Ly} f^3(x, y) dxdy \qquad \text{(iii)}$$

$$Sq = \sqrt{\frac{1}{LxLy} \int_0^{Lx} \int_0^{Ly} f^2(x, y) dxdy} \qquad \text{(iv)}$$

In the present specification, the inclination angle distribution of the uneven surface can be calculated from the three-dimensional roughness curved surface. The data of the three-dimensional roughness curved surface are represented by points arranged in a grid with an interval d on a reference plane with the x-axis in the horizontal direction and the y-axis in the vertical direction, and the height at the position of the points. When a height at a position of an i-th point in the x-axis direction and a j-th point in the y-axis direction is $Z_{ij}$, an inclination Sx in the x-axis direction with respect to the x-axis and an inclination Sy in the y-axis direction with respect to the y-axis at any position (i, j) are calculated as follows. In the present specification, the position of the i-th point in the x-axis direction and the j-th point in the y-axis direction may be expressed as (i,j).

$$Sx = (Z_{i+1,j} - Z_{i-1,j})/2d$$

$$Sy = (Z_{i,j+1} - Z_{i,j-1})/2d$$

Furthermore, the inclination St with respect to the reference plane at (i, j) is calculated by the following formula (v).

$$St = \sqrt{Sx^2 + Sy^2} \qquad \text{(v)}$$

The inclination angle at (i, j) is calculated as $\tan^{-1}$ (St). By performing the above calculation for each point, the inclination angle distribution of the three-dimensional roughness curved surface can be calculated.

Sa, Smp, and the inclination angle distribution are preferably measured using an interference microscope. Examples of such interference microscopes include "New View" series available from Zygo Corporation. By using the measurement/analysis application software "MetroPro" attached to the interference microscope "New View" series described above, Sa, Smp, and the inclination angle distribution can be easily calculated.

<Anti-Glare Layer>

In the first embodiment, the anti-glare layer is the layer responsible for the suppression of reflected scattered light and the center of antiglare properties.

<<Method for Forming Anti-Glare Layer>>

In the first, second, and third embodiments, the anti-glare layer can be formed, for example, by (A) a method using an embossing roll, (B) an etching treatment, (C) molding with a mold, (D) formation of a coating film by coating, or the like. Among these methods, (C) molding with a mold is suitable for easily obtaining a stable surface shape, and (D) formation of a coating film by coating is suitable for productivity and compatibility with various products.

In the first, second, and third embodiments, when the anti-glare layer is formed by coating, examples of the method include a method (d1) in which a coating liquid containing a binder resin and particles is applied to form unevenness by the particles, and a method (d2) in which a coating liquid containing any resin and a resin having poor compatibility with the resin is applied to phase-separate the resin to form unevenness.

In the first embodiment, (d1) is more preferable than (d2) in that the balance between AM1 and AM2 is easily improved. Also, in the first embodiment, (d1) is more preferable than (d2) in that variations in Sa and Smp can be easily suppressed.

<<Thickness>>

In the first, second, and third embodiments, the thickness T of the anti-glare layer is preferably 2 μm or more and 10 μm or less, more preferably 4 μm or more and 8 μm or less, in order to achieve a good balance among curl suppression, mechanical strength, hardness, and toughness.

In the first, second, and third embodiments, examples of the preferred range of the thickness T of the anti-glare layer include 2 μm or more and 10 μm or less, 2 μm or more and 8 μm or less, 4 μm or more and 10 μm or less, and 4 μm or more and 8 μm or less.

In the present specification, the thickness of the anti-glare layer can be calculated, for example, by selecting 20 arbitrary points in a cross-sectional photograph of the anti-glare film taken with a scanning transmission electron microscope (STEM) and averaging the values. It is preferable that the acceleration voltage of the STEM is 10 kV or more and 30 kV or less, and the magnification of the STEM is 1000 times or more and 7000 times or less.

<<Components>>

In the first, second, and third embodiments, the anti-glare layer mainly contains a resin component, and optionally contains particles such as organic particles and inorganic fine particles, and additives such as a refractive index adjuster, an anti-static agent, an anti-fouling agent, an ultraviolet absorber, a light stabilizer, an antioxidant, a viscosity modifier, and a thermal polymerization initiator.

In the first, second, and third embodiments, the anti-glare layer preferably contains a binder resin and particles. In the first, second, and third embodiments, examples of the particles include organic particles and inorganic particles, and organic particles are preferred. That is, in the first, second, and third embodiments, the anti-glare layer more preferably contains a binder resin and organic particles.

—Particles—

In the first, second, and third embodiments, examples of the organic particles include particles made of polymethyl methacrylate, a polyacryl-styrene copolymer, a melamine resin, polycarbonate, polystyrene, polyvinyl chloride, a benzoguanamine-melamine-formaldehyde condensate, silicone, a fluorine-based resin, and a polyester-based resin.

In the first, second, and third embodiments, examples of the inorganic particles include silica, alumina, zirconia, and titania, and silica is preferred.

Since the specific gravity of organic particles is light, the organic particles are likely to float in the vicinity of the surface of the anti-glare layer when used in combination with the inorganic fine particles described later. Therefore, in the first embodiment, by using the organic particles and the inorganic fine particles in combination, the organic particles can easily form unevenness having a long cycle and the inorganic fine particles can easily form unevenness having a short cycle, and thus AM1 and AM2 can easily be set in the range described above. Further, since the organic particles are likely to float in the vicinity of the surface of the anti-glare layer, the surface shape such as Sa and Smp can easily be set in the range described above.

In the first embodiment, when only organic particles are used as the particles, it is preferable to increase the content ratio of the organic particles in the anti-glare layer in order to easily set AM1 and AM2 in the ranges described above. By increasing the content ratio of the organic particles in the anti-glare layer, it is possible to form a shape in which the organic particles are spread all over the surface to form unevenness having a short cycle AM2, and it is possible to form unevenness having a long cycle AM1 by partially forming a shape in which the organic particles are stacked in the shape in which the organic particles are spread all over the surface. In addition, the shape in which the organic particles are spread all over the surface makes it easy to reduce Smp. Furthermore, by partially forming a shape in which the organic particles are stacked in a shape in which the organic particles are spread all over the surface, Sa can be easily increased.

In the first, second, and third embodiments, the average particle size D of particles such as organic particles and inorganic particles is preferably 1.0 μm or more and 5.0 μm or less, more preferably 1.5 μm or more and 3.5 μm or less, and still more preferably 1.7 μm or more and 2.5 μm or less.

In the first embodiment, by setting the average particle size D to 1.0 μm or more, AM1 can be easily suppressed from becoming too small, and Sa can be easily set to 0.30 μm or more. Further, in the first embodiment, by setting the average particle size D to 5.0 μm or less, AM1 can be easily suppressed from becoming too large, and Smp can be easily set to 10.00 μm or less.

In the present specification, the average particle size of particles such as organic particles and inorganic particles can be calculated by the following operations (A1) to (A3).

(A1) A transmission observation image of the anti-glare film is imaged with an optical microscope. The magnification is preferably 500 times or more and 2000 times or less.

(A2) Any 10 particles are extracted from the observed image and the particle size of each particle is calculated. The particle size is measured as the linear distance in a combination of two straight lines such that the linear distance between the two straight lines is maximum when the cross-section of the particle is sandwiched between two arbitrary parallel straight lines.

(A3) The same operation is performed five times on an observation image of another screen of the same sample, and a value obtained from the number average of the particle size of 50 particles in total is defined as the average particle size of the particles.

In the first, second, and third embodiments, the ratio D/T of the thickness T of the anti-glare layer and the average particle size D of the particles is preferably 0.20 or more and 0.96 or less, more preferably 0.25 or more and 0.90 or less, still more preferably 0.30 or more and 0.80 or less, and further preferably 0.35 or more and 0.70 or less.

In the first, second, and third embodiments, examples of the preferred range of D/T include 0.20 or more and 0.96 or less, 0.20 or more and 0.90 or less, 0.20 or more and 0.80 or less, 0.20 or more and 0.70 or less, 0.25 or more and 0.96 or less, 0.25 or more and 0.90 or less, 0.25 or more and 0.80 or less, 0.25 or more and 0.70 or less, 0.30 or more and 0.96 or less, 0.30 or more and 0.90 or less, 0.30 or more and 0.80 or less, 0.30 or more and 0.70 or less, 0.35 or more and 0.96 or less, 0.35 or more and 0.90 or less, 0.35 or more and 0.80 or less, and 0.35 or more and 0.70 or less.

In the first embodiment, by setting D/T within the above range, AM1 and AM2 can easily be set in the range described above. Further, in the first embodiment, by setting D/T within the above range, it is possible to easily set the height of the peaks and the interval between the peaks of the uneven surface to be in an appropriate range, and to easily set the surface shape such as Sa and Smp to be in the range described above.

In the first, second, and third embodiments, the content of particles such as organic particles and inorganic particles is 40 parts by mass or more and 200 parts by mass or less, more preferably 55 parts by mass or more and 170 parts by mass or less, and still more preferably 60 parts by mass or more and 150 parts by mass or less based on 100 parts by mass of the binder resin.

Examples of the preferred range of the content of the particles based on 100 parts by mass of the binder resin include 40 parts by mass or more and 200 parts by mass or less, 40 parts by mass or more and 170 parts by mass or less, 40 parts by mass or more and 150 parts by mass or less, 55 parts by mass or more and 200 parts by mass or less, 55 parts by mass or more and 170 parts by mass or less, 55 parts by mass or more and 150 parts by mass or less, 60 parts by mass or more and 200 parts by mass or less, 60 parts by mass or more and 170 parts by mass or less, and 60 parts by mass or more and 150 parts by mass or less.

In the first embodiment, by setting the content of the particles to 40 parts by mass or more, AM1 can be easily suppressed from becoming too small. Further, in the first embodiment, by setting the content of the particles to 40 parts by mass or more, Sa can be easily set to 0.30 μm or more, and Smp can be easily set to 10.00 μm or less. Further, in the first embodiment, by setting the content of the particles to 200 parts by mass or less, AM1 can be easily suppressed from becoming too large, and the particles can be easily suppressed from falling off from the anti-glare layer.

In the first embodiment, when the inorganic fine particles described below are not used, the content of the particles is preferably set to a relatively large amount in the above range in order to exhibit the "stacking" described above.

—Inorganic Fine Particles—

In the first, second, and third embodiments, the anti-glare layer preferably further contains inorganic fine particles in addition to the binder resin and particles. In particular, in the first, second, and third embodiments, the anti-glare layer preferably further contains inorganic fine particles in addition to the binder resin and organic particles.

In the first, second, and third embodiments, when the inorganic fine particles in the anti-glare layer, the difference between the refractive index of the organic particles and the refractive index of the composition other than the organic particles of the anti-glare layer becomes small, and the internal haze can be easily reduced.

In the first embodiment, when the anti-glare layer contains inorganic fine particles, the organic particles having a relatively low specific gravity are likely to float in the vicinity of the surface of the anti-glare layer. Furthermore, in the first embodiment, when the anti-glare layer contains the inorganic fine particles, fine unevenness based on the inorganic fine particles are likely to be formed between the convex portions based on the organic particles. From these, AM1 and AM2 can easily be set in the range described above. Further, since the organic particles are likely to float in the vicinity of the surface of the anti-glare layer, the surface shape such as Sa and Smp can easily be set in the range described above.

In the first, second, and third embodiments, examples of the inorganic fine particles include fine particles made of silica, alumina, zirconia, and titania. Among these, silica is preferable since it easily suppresses the generation of internal haze.

In the first, second, and third embodiments, the average particle size of the inorganic fine particles is preferably 1 nm or more and 200 nm or less, more preferably 2 nm or more and 100 nm or less, and still more preferably 5 nm or more and 50 nm or less.

In the first, second, and third embodiments, examples of the preferred range of the average particle size of the inorganic fine particles include 1 nm or more and 200 nm or less, 1 nm or more and 100 nm or less, 1 nm or more and 50 nm or less, 2 nm or more and 200 nm or less, 2 nm or more and 100 nm or less, 2 nm or more and 50 nm or less, 5 nm or more and 200 nm or less, 5 nm or more and 100 nm or less, and 5 nm or more and 50 nm or less.

In the present specification, the average particle size of the inorganic fine particles can be calculated by the following operations (B1) to (B3).

(B1) A cross-section of the anti-glare film is imaged with a TEM or STEM. The acceleration voltage of the TEM or STEM is preferably 10 kV or more and 30 kV or less, and the magnification is preferably 50,000 times or more and 300,000 times or less.

(B2) Any 10 inorganic fine particles are extracted from the observed image and the particle size of each inorganic fine particle is calculated. The particle size is measured as the linear distance in a combination of two straight lines such that the linear distance between the two straight lines is maximum when the cross-section of the inorganic fine particle is sandwiched between two arbitrary parallel straight lines.

(B3) The same operation is performed five times on an observation image of another screen of the same sample, and a value obtained from the number average of the particle size of 50 particles in total is defined as the average particle size of the inorganic fine particles.

In the first, second, and third embodiments, the content of inorganic fine particles is 40 parts by mass or more and 200 parts by mass or less, more preferably 50 parts by mass or more and 150 parts by mass or less, and still more preferably 60 parts by mass or more and 100 parts by mass or less based on 100 parts by mass of the binder resin.

In the first, second, and third embodiments, examples of the preferred range of the content of the inorganic fine particles based on 100 parts by mass of the binder resin include 40 parts by mass or more and 200 parts by mass or less, 40 parts by mass or more and 150 parts by mass or less, 40 parts by mass or more and 100 parts by mass or less, 50 parts by mass or more and 200 parts by mass or less, 50 parts by mass or more and 150 parts by mass or less, 50 parts by mass or more and 100 parts by mass or less, 60 parts by mass or more and 200 parts by mass or less, 60 parts by mass or more and 150 parts by mass or less, and 40 parts by mass or more and 100 parts by mass or less.

In the first embodiment, by setting the content of the inorganic fine particles to 40 parts by mass or more, the effects based on the inorganic fine particles described above can be easily obtained. Further, in the first embodiment, by setting the content of the inorganic fine particles to 200 parts by mass or less, a decrease in coating film strength of the anti-glare layer can be easily suppressed.

—Binder Resin—

In the first, second, and third embodiments, in order to further improve the mechanical strength, the binder resin preferably contains a cured product of a curable resin such as a cured product of a thermosetting resin composition or a cured product of an ionizing radiation-curable resin composition, and more preferably contains a cured product of an ionizing radiation-curable resin composition.

In the first, second, and third embodiments, the thermosetting resin composition is a composition containing at least a thermosetting resin, and is a resin composition that is cured by heating.

In the first, second, and third embodiments, examples of thermosetting resins include acrylic resins, urethane resins, phenol resins, urea melamine resins, epoxy resins, unsaturated polyester resins, and silicone resins. If necessary, a curing agent is added to these curable resins in the thermosetting resin composition.

In the first, second, and third embodiments, the ionizing radiation-curable resin composition is a composition containing a compound having an ionizing radiation-curable functional group (hereinafter also referred to as an "ionizing radiation-curable compound").

In the first, second, and third embodiments, examples of the ionizing radiation-curable functional group include ethylenically unsaturated bond groups such as a (meth)acryloyl group, a vinyl group, an allyl group, an epoxy group, and an oxetanyl group. In the first, second, and third embodiments, the ionizing radiation-curable compound is preferably a compound having an ethylenically unsaturated bond group, more preferably a compound having two or more ethylenically unsaturated bond groups, and in particular, still more preferably a polyfunctional (meth)acrylate-based compound having two or more ethylenically unsaturated bond groups. In the first, second, and third embodiments, both monomers and oligomers can be used as polyfunctional (meth)acrylate-based compounds.

In the present specification, the ionizing radiation means an electromagnetic wave or a charged particle beam having an energy quantum capable of polymerizing or crosslinking a molecule, and an ultraviolet ray (UV) or an electron beam (EB) is usually used, but an electromagnetic wave such as an X-ray or a γ-ray, or a charged particle beam such as an α-ray or an ion beam can also be used.

In the first, second, and third embodiments, among the polyfunctional (meth)acrylate-based compounds, examples of the bifunctional (meth)acrylate-based monomer include ethylene glycol di(meth)acrylate, bisphenol A tetraethoxy diacrylate, bisphenol A tetrapropoxy diacrylate, and 1,6-hexanediol diacrylate.

In the first, second, and third embodiments, examples of the (meth)acrylate-based monomer having three or more functional groups include trimethylolpropane tri(meth)acrylate, pentaerythritol tri(meth)acrylate, pentaerythritol tetra(meth)acrylate, dipentaerythritol hexa(meth)acrylate, dipentaerythritol tetra(meth)acrylate, and isocyanuric acid-modified tri(meth)acrylate.

In the first, second, and third embodiments, the (meth) acrylate-based monomer may be a monomer in which a part of the molecular skeleton is modified, and a monomer modified with ethylene oxide, propylene oxide, caprolactone, isocyanuric acid, alkyl, cyclic alkyl, aromatic, bisphenol, or the like can also be used.

In the first, second, and third embodiments, examples of polyfunctional (meth)acrylate-based oligomers include acrylate-based polymers such as urethane (meth)acrylate, epoxy (meth)acrylate, polyester (meth)acrylate, and polyether (meth)acrylate.

In the first, second, and third embodiments, urethane (meth)acrylate is obtained, for example, by reacting polyhydric alcohol and organic diisocyanate with hydroxy (meth)acrylate.

In the first, second, and third embodiments, preferred epoxy (meth)acrylates are (meth)acrylates obtained by reacting a trifunctional or more aromatic epoxy resin, alicyclic epoxy resin, or aliphatic epoxy resin with a (meth) acrylic acid, (meth)acrylates obtained by reacting a bifunctional or more aromatic epoxy resin, alicyclic epoxy resin, or aliphatic epoxy resin with a polybasic acid and (meth)acrylic acid, and (meth)acrylates obtained by reacting a bifunctional or more aromatic epoxy resin, alicyclic epoxy resin, or aliphatic epoxy resin with phenol and (meth)acrylic acid.

For the purpose of adjusting the viscosity of the anti-glare layer-coating liquid or the like, a monofunctional (meth) acrylate may be used in combination as the ionizing radiation-curable compound in the first, second, and third embodiments. In the first, second, and third embodiments, examples of the monofunctional (meth)acrylate include methyl (meth)acrylate, ethyl (meth)acrylate, propyl (meth) acrylate, butyl (meth)acrylate, pentyl (meth)acrylate, hexyl (meth)acrylate, cyclohexyl (meth)acrylate, 2-ethylhexyl (meth)acrylate, lauryl (meth)acrylate, stearyl (meth)acrylate, and isobornyl (meth)acrylate.

The ionizing radiation-curable compounds may be used singly or in combination of two or more.

In the first, second, and third embodiments, when the ionizing radiation-curable compound is an ultraviolet-curable compound, the ionizing radiation-curable composition preferably contains an additive such as a photopolymerization initiator or a photopolymerization accelerator.

In the first, second, and third embodiments, examples of the photopolymerization initiator include one or more selected from the group consisting of acetophenone, benzophenone, α-hydroxyalkylphenone, Michler's ketone, benzoin, benzyl dimethyl ketal, benzoyl benzoate, α-acyloxime ester, thioxanthones, and the like.

The photopolymerization accelerator can reduce polymerization inhibition caused by air during curing and increase the curing rate. In the first, second, and third embodiments, examples of the photopolymerization accelerator include one or more selected from the group consisting of p-dimethylaminobenzoic acid isoamyl ester, p-dimethylaminobenzoic acid ethyl ester, and the like.

When the binder resin contains a cured product of an ionizing radiation-curable resin composition in the first, second, and third embodiments, the binder resin preferably has a configuration (C1) or (C2) as described below.

(C1) A thermoplastic resin is contained as the binder resin in addition to the cured product of the ionizing radiation-curable resin composition.

(C2) Substantially only the cured product of the ionizing radiation-curable resin composition is contained as the binder resin, and substantially only a monomer component is contained as the ionizing radiation-curable compound contained in the ionizing radiation-curable resin composition.

In the configuration C1, the viscosity of the anti-glare layer-coating liquid is increased by the thermoplastic resin, so that the organic particles are less likely to sink, and the binder resin is less likely to flow down between the convex portions based on the organic particles. Therefore, in the first embodiment, in the configuration C1, AM1 and AM2 can be easily suppressed from becoming too small, and the surface shapes such as Sa and Smp can be easily set within the above ranges.

In the first, second, and third embodiments, examples of the thermoplastic resin include polystyrene-based resins, polyolefin-based resins, ABS resins (including heat-resistant ABS resins), AS resins, AN resins, polyphenylene oxide-based resins, polycarbonate-based resins, polyacetal-based resins, acrylic resins, polyethylene terephthalate-based resins, polybutylene terephthalate-based resins, polysulfone-based resins, and polyphenylene sulfide-based resins, and acrylic resin is preferable for transparency.

In the first, second, and third embodiments, the weight-average molecular weight of the thermoplastic resin is preferably 20,000 or more and 200,000 or less, more preferably 30,000 or more and 150,000 or less, and still more preferably 50,000 or more and 100,000 or less.

In the first, second, and third embodiments, examples of the preferred range of the weight-average molecular weight of the thermoplastic resin include 20,000 or more and 200,000 or less, 20,000 or more and 150,000 or less, 20,000 or more and 100,000 or less, 30,000 or more and 200,000 or less, 30,000 or more and 150,000 or less, 30,000 or more and 100,000 or less, 50,000 or more and 200,000 or less, 50,000 or more and 150,000 or less, and 50,000 or more and 100,000 or less.

In the present specification, the weight-average molecular weight is the average molecular weight measured by GPC analysis and converted to standard polystyrene.

In the first, second, and third embodiments, the mass ratio of the cured product of the ionizing radiation-curable resin composition and the thermoplastic resin in the C1 configuration is preferably 60:40 to 90:10, and more preferably 70:30 to 80:20.

In the first, second, and third embodiments, examples of the preferred range of the mass ratio include 60:40 to 90:10, 60:40 to 80:20, 70:30 to 90:10, and 70:30 to 80:20.

In the first embodiment, by setting the thermoplastic resin to 10 or more with respect to the cured product 90 of the ionizing radiation-curable resin composition, the effect of increasing the viscosity of the anti-glare layer-coating liquid described above can be easily exhibited. Further, in the first embodiment, by setting the thermoplastic resin to 40 or less with respect to the cured product 60 of the ionizing radiation-curable resin composition, the decrease in the mechanical strength of the anti-glare layer can be easily suppressed.

In the first embodiment, in the above configuration C2, the organic particles are spread all over the bottom portion of the anti-glare layer, and the organic particles are stacked in a part of the region, and these organic particles tend to be covered with a thin-skinned binder resin. In the configuration C2, the stacked organic particles form unevenness having a long cycle AM1, and the non-stacked organic particles form unevenness having a short cycle AM2 between the unevenness having a long cycle. Therefore, in the first embodiment, in the configuration C2, AM1 and AM2 can easily be set within the above ranges. In the first embodiment, in the configuration C2, Sa can be easily set within the above range by the stacked organic particles, and Smp can be easily set within the above range by the spread organic particles. In the first embodiment, in the configuration C2, in order to facilitate the arrangement of the organic particles as described above, it is preferable to increase the content of the organic particles with respect to the binder resin compared to the configuration C1.

In the first, second, and third embodiments, in the configuration C2, the ratio of the cured product of the ionizing radiation-curable resin composition to the total amount of the binder resin is preferably 90% by mass or more, more preferably 95% by mass or more, and still more preferably 100% by mass.

Further, in the first, second, and third embodiments, in the configuration C2, the ratio of the monomer component to the total amount of the ionizing radiation-curable compound is preferably 90% by mass or more, more preferably 95% by mass or more, and still more preferably 100% by mass. The monomer component is preferably a polyfunctional (meth) acrylate-based compound.

In the first, second, and third embodiments, a solvent is usually used as the anti-glare layer-coating liquid to adjust the viscosity and to dissolve or disperse each component. Since the surface shape of the anti-glare layer after coating and drying differs depending on the type of solvent, it is preferable to select the solvent in consideration of the saturated vapor pressure of the solvent, the permeability of the solvent to the transparent substrate, and the like.

In the first, second, and third embodiments, examples of the solvent include ketones such as acetone, methyl ethyl ketone, methyl isobutyl ketone, and cyclohexanone; ethers such as dioxane and tetrahydrofuran; aliphatic hydrocarbons such as hexane; alicyclic hydrocarbons such as cyclohexane; aromatic hydrocarbons such as toluene and xylene; halogenated carbons such as dichloromethane and dichloroethane; esters such as methyl acetate, ethyl acetate, and butyl acetate; alcohols such as isopropanol, butanol, and cyclohexanol; cellosolves such as methyl cellosolve and ethyl cellosolve; glycol ethers such as propylene glycol monomethyl ether acetate; cellosolve acetates; sulfoxides such as dimethyl sulfoxide; amides such as dimethylformamide and dimethylacetamide; and a mixture of these.

In the first, second, and third embodiments, it is preferable that the main component of the solvent in the anti-glare layer-coating liquid is a solvent having a high evaporation rate.

In the present specification, the main component means 50% by mass or more, preferably 70% by mass or more, and more preferably 80% by mass or more of the total amount of the solvent.

In the first embodiment, by increasing the evaporation rate of the solvent, the organic particles are prevented from settling to the bottom portion of the anti-glare layer, and the binder resin is less likely to flow down between the convex portions based on the organic particles. Therefore, in the first embodiment, by increasing the evaporation rate of the solvent, AM1 and AM2 can be easily set within the above ranges, and surface shapes such as Sa and Smp can be easily set within the above ranges.

In the present specification, a solvent having a high evaporation rate means a solvent having an evaporation rate of 100 or more when the evaporation rate of butyl acetate is 100. The evaporation rate of the solvent having a high evaporation rate is more preferably 120 or more and 300 or less, still more preferably 150 or more and 220 or less. Examples of solvents having a high evaporation rate include methyl isobutyl ketone having an evaporation rate of 160, toluene having an evaporation rate of 200, and methyl ethyl ketone having an evaporation rate of 370.

In the first, second, and third embodiments, the solvent in the anti-glare layer-coating liquid preferably also contains a small amount of solvent having a low evaporation rate in addition to the solvent having a high evaporation rate.

In the first, second, and third embodiments, the mass ratio of the solvent having a high evaporation rate and the solvent having a low evaporation rate is preferably 99:1 to 80:20, more preferably 98:2 to 85:15.

In the first embodiment, by containing a solvent having a low evaporation rate, the organic particles are moderately agglomerated, and the area ratio of the convex portions based on the organic particles in the uneven surface becomes an appropriate range, so that AM1 and AM2 can be easily set within the above range, and the surface shapes such as Sa and Smp can be easily set within the above range.

In the present specification, a solvent having a low evaporation rate means a solvent having an evaporation rate of less than 100 when the evaporation rate of butyl acetate is 100. The evaporation rate of the solvent having a low evaporation rate is more preferably 20 or more and 60 or less, and still more preferably 25 or more and 40 or less.

Examples of solvents having a low evaporation rate include cyclohexanone having an evaporation rate of 32 and propylene glycol monomethyl ether acetate having an evaporation rate of 44.

In the first, second, and third embodiments, it is preferable to control the drying conditions when forming the anti-glare layer from the anti-glare layer-coating liquid.

In the first, second, and third embodiments, the drying conditions can be controlled by the drying temperature and the wind speed inside the dryer. In the first, second, and third embodiments, the drying temperature is preferably 30° C. or more and 120° C. or less, and the drying wind speed is preferably 0.2 m/s or more and 50 m/s or less. In the first, second, and third embodiments, in order to control the surface shape of the anti-glare layer by drying, the irradiation with ionizing-radiation is preferably performed after the drying of the coating liquid.

<Optical Characteristics>

In the first, second, and third embodiments, the anti-glare film preferably has a total light transmittance in accordance with JIS K7361-1:1997 of 70% or more, more preferably 80% or more, and still more preferably 85% or more.

In the first, second, and third embodiments, the light incident surface for measuring total light transmittance and haze, which will be described later, is the opposite side of the uneven surface.

In the first, second, and third embodiments, the anti-glare film preferably has a haze in accordance with JIS K7136-1:2000 of 60% or more and 98% or less, more preferably 66% or more and 86% or less, and still more preferably 70% or more and 80% or less.

In the first, second, and third embodiments, examples of the preferred range of the haze include 60% or more and 98% or less, 60% or more and 86% or less, 60% or more and 80% or less, 66% or more and 98% or less, 66% or more and 86% or less, 66% or more and 80% or less, 70% or more and 98% or less, 70% or more and 86% or less, and 70% or more and 80% or less.

In the first, second, and third embodiments, by setting the haze to 60% or more, the anti-glare properties can be easily improved. Further, in the first, second, and third embodiments, by setting the haze to 98% or less, the deterioration in image resolution can be easily suppressed.

In the first, second, and third embodiments, the anti-glare film preferably has an internal haze of 20% or less, more preferably 15% or less, and still more preferably 10% or less in order to facilitate better image resolution and contrast.

Internal haze can be measured by a general-purpose method. For example, the internal haze can be measured by laminating a transparent sheet on the uneven surface via a transparent adhesive layer to flatten the unevenness of the uneven surface.

<Other Layers>

In the first, second, and third embodiments, the anti-glare film may have another layer which is a layer other than the anti-glare layer and transparent substrate described above. Examples of the other layers include an anti-reflection layer, an anti-fouling layer, and an anti-static layer.

In the first, second, and third embodiments, examples of a preferred embodiment in which another layer is provided include an embodiment in which an anti-reflection layer is provided on the uneven surface of the anti-glare layer and a surface of the anti-reflection layer is the uneven surface. In the preferred embodiment, the anti-reflection layer more preferably has antifouling properties. That is, in the first, second, and third embodiments, it is more preferable that the antifouling anti-reflection layer is provided on the anti-glare layer and the surface of the antifouling anti-reflection layer is the uneven surface.

<<Anti-Reflection Layer>>

In the first, second, and third embodiments, the anti-reflection layer may have a single-layer structure of a low refractive index layer; a two-layer structure of a high refractive index layer and a low refractive index layer; or a multilayer structure of three or more layers, for example.

In the first, second, and third embodiments, the low refractive index layer and the high refractive index layer can be formed by a general-purpose wet method, dry method, or the like. A single-layer structure or a two-layer structure is preferred in the case of the wet method, and a multi-layer structure is preferred in the case of the dry method.

—Single-Layer Structure or Two-Layer Structure—

In the first, second, and third embodiments, the anti-reflection layer having a single-layer structure or a two layer-structure is preferably formed by a wet method.

In the first, second, and third embodiments, the low refractive index layer is preferably disposed on the outermost surface of the anti-glare film. In the first, second, and third embodiments, when imparting antifouling properties to the anti-reflection layer, the low refractive index layer preferably contains an antifouling agent such as a silicone-based compound and a fluorine-based compound.

In the first, second, and third embodiments, the lower limit of the refractive index of the low refractive index layer is preferably 1.10 or more, more preferably 1.20 or more, more preferably 1.26 or more, more preferably 1.28 or more, and more preferably 1.30 or more, and the upper limit thereof is preferably 1.48 or less, more preferably 1.45 or less, more preferably 1.40 or less, more preferably 1.38 or less, and more preferably 1.32 or less.

In the first, second, and third embodiments, examples of the preferred range of the refractive index of the low refractive index layer include 1.10 or more and 1.48 or less, 1.10 or more and 1.45 or less, 1.10 or more and 1.40 or less, 1.10 or more and 1.38 or less, 1.10 or more and 1.32 or less, 1.20 or more and 1.48 or less, 1.20 or more and 1.45 or less, 1.20 or more and 1.40 or less, 1.20 or more and 1.38 or less, 1.20 or more and 1.32 or less, 1.26 or more and 1.48 or less, 1.26 or more and 1.45 or less, 1.26 or more and 1.40 or less, 1.26 or more and 1.38 or less, 1.26 or more and 1.32 or less, 1.28 or more and 1.48 or less, 1.28 or more and 1.45 or less, 1.28 or more and 1.40 or less, 1.28 or more and 1.38 or less, 1.28 or more and 1.32 or less, 1.30 or more and 1.48 or less, 1.30 or more and 1.45 or less, 1.30 or more and 1.40 or less, 1.30 or more and 1.38 or less, and 1.30 or more and 1.32 or less.

In the first, second, and third embodiments, the lower limit of the thickness of the low refractive index layer is preferably 80 nm or more, more preferably 85 nm or more, more preferably 90 nm or more, and the upper limit thereof is 150 nm or less. more preferably 110 nm or less, and more preferably 105 nm or less.

In the first, second, and third embodiments, examples of the preferred range of the thickness of the low refractive index layer include 80 nm or more and 150 nm or less, 80 nm or more and 110 nm or less, 80 nm or more and 105 nm or less, 85 nm or more and 150 nm or less, 85 nm or more and 110 nm or less, 85 nm or more and 105 nm or less, 90 nm or more and 150 nm or less, 90 nm or more and 110 nm or less, and 90 nm or more and 105 nm or less.

In the first, second, and third embodiments, the high refractive index layer is preferably disposed closer to the anti-glare layer than the low refractive index layer.

In the first, second, and third embodiments, the lower limit of the refractive index of the high refractive index layer is preferably 1.53 or more, more preferably 1.54 or more, more preferably 1.55 or more, more preferably 1.56 or more, and the upper limit thereof is preferably 1.85 or less, more preferably 1.80 or less, more preferably 1.75 or less, and more preferably 1.70 or less.

In the first, second, and third embodiments, examples of the preferred range of the refractive index of the high refractive index layer include 1.53 or more and 1.85 or less, 1.53 or more and 1.80 or less, 1.53 or more and 1.75 or less, 1.53 or more and 1.70 or less, 1.54 or more and 1.85 or less, 1.54 or more and 1.80 or less, 1.54 or more and 1.75 or less, 1.54 or more and 1.70 or less, 1.55 or more and 1.85 or less, 1.55 or more and 1.80 or less, 1.55 or more and 1.75 or less, 1.55 or more and 1.70 or less, 1.56 or more and 1.85 or less, 1.56 or more and 1.80 or less, 1.56 or more and 1.75 or less, and 1.56 or more and 1.70 or less.

In the first, second, and third embodiments, the upper limit of the thickness of the high refractive index layer is preferably 200 nm or less, more preferably 180 nm or less, still more preferably 150 nm or less, and the lower limit is 50 nm or more, and more preferably 70 nm or more.

In the first, second, and third embodiments, examples of the preferred range of the thickness of the high refractive index layer include 50 nm or more and 200 nm or less, 50 nm or more and 180 nm or less, 50 nm or more and 150 nm or less, 70 nm or more and 200 nm or less, 70 nm or more and 180 nm or less, and 70 nm or more and 150 nm or less.

—Multilayer Structure of Three or More Layers—

In the first, second, and third embodiments, the multilayer structure preferably formed by the dry method has a structure in which high refractive index layers and low refractive index layers are alternately laminated to form a total of three or more layers. Also in the multilayer structure, the low refractive index layer is preferably disposed on the outermost surface of the anti-glare film.

In the first, second, and third embodiments, when the anti-reflection layer has a multilayer structure, the high refractive index layer preferably has a thickness of 10 nm or more and 200 nm or less, and preferably has a refractive index of 2.1 or more and 2.4 or less. The thickness of the high refractive index layer is more preferably 20 nm or more and 70 nm or less.

In the first, second, and third embodiments, when the anti-reflection layer has a multilayer structure, the low refractive index layer preferably has a thickness of 5 nm or more and 200 nm or less, and preferably has a refractive index of 1.33 or more and 1.53 or less. The thickness of the low refractive index layer is more preferably 20 nm or more and 120 nm or less.

<Size, Shape, and the Like>

In the first, second, and third embodiments, the anti-glare film may be in the form of a sheet cut into a predetermined size, or may be in the form of a roll obtained by winding a long sheet. The size of the sheet is not particularly limited, but the maximum size is about 2 inches or more and 500 inches or less. The "maximum size" refers to the maximum length of any two points of the anti-glare film when connected. For example, when the anti-glare film is rectangular, the diagonal line of the rectangle is the maximum size. When the anti-glare film is circular, the diameter of the circle is the maximum size.

In the first, second, and third embodiments, the width and length of the roll are not particularly limited, but generally, the width is 500 mm or more and 3000 mm or less and the length is about 500 m or more and 5000 m or less. The anti-glare film in the form of a roll may be cut into a sheet according to the size of an image display device or the like. At the time of cutting, it is preferable to exclude the end portion of the roll where the physical properties are not stable.

In the first, second, and third embodiments, the shape of the sheet is not particularly limited, and examples thereof include polygons such as triangles, quadrilaterals, and pentagons, circles, and random irregular shapes. When the anti-glare film has a square shape, the aspect ratio is not particularly limited as long as there is no problem as a display screen. For example, the aspect ratio may be horizontal:vertical=1:1, 4:3, 16:10, 16:9, 2:1, or the like, but the aspect ratio is not limited to such an aspect ratio in in-vehicle applications and digital signage which are rich in design.

In the first, second, and third embodiments, the surface shape of the anti-glare film on the side opposite to the uneven surface is not particularly limited, but is preferably substantially smooth.

In the present specification, substantially smooth means that the arithmetic mean roughness Ra of JIS B0601:1994 at a cutoff value of 0.8 mm is less than 0.03 $\mu$m, preferably 0.02 $\mu$m or less.

[Anti-Glare Film of Second Embodiment]

An anti-glare film of the second embodiment of the present disclosure includes an anti-glare layer and has an uneven surface, and the smoothed reflected light intensity measured under the following measurement conditions satisfies the following conditions 1 and 2.

<Measurement Conditions>

(1) in a transmission measurement mode of a goniophotometer, a visible light beam is emitted as a parallel light beam from a light source of the goniophotometer, an intensity of the emitted light is measured at an aperture angle of 1 degree without passing through a sample, and standardization is performed so that the maximum intensity is 100,000;

(2) a black plate is bonded to a surface opposite to the uneven surface of the anti-glare film via a transparent adhesive layer to produce a sample α in which the anti-glare film, the transparent adhesive layer, and the black plate are laminated and which has the uneven surface;

(3) the sample α is placed in the goniophotometer, the uneven surface of the sample α is irradiated with a visible light beam as a parallel light beam from the light source of the goniophotometer, and a reflected light intensity is measured at an aperture angle of 1 degree, wherein an irradiation angle of the parallel light beam is set to a direction inclined by +45 degrees from a normal direction of the sample α, the reflected light intensity is measured at intervals of 1 degree from 0 degrees, which is the normal direction of the sample α, to −85 degrees, and in order to maintain effects of standardization in (1), the reflected light intensity is measured in the transmission measurement mode; and (4) a smoothing process represented by the following formula (i) is performed at each angle from 0 degrees to −85 degrees, and the reflected light intensity after the smoothing process is defined as the smoothed reflected light intensity at each angle:

$$n\text{-degree smoothed reflected light intensity} = ([n-2\text{-degree reflected light intensity}] + [n-1\text{-degree reflected light intensity}] + [n\text{-degree reflected light intensity}] + [n+1\text{-degree reflected light intensity}] + [n+2\text{-degree reflected light intensity}])/5 \quad (i)$$

<Condition 1> when the n-degree smoothed reflected light intensity is defined as Rn, and the n−1-degree smoothed reflected light intensity is defined as Rn−1, a maximum absolute value of difference between Rn and Rn−1 is 2.00 or less, and <Condition 2> the smoothed reflected light intensity at −35 degrees is 4.0 or less.

FIG. 19 is a schematic cross-sectional view of the cross-sectional shape of an anti-glare film 100 of the second embodiment of the present disclosure.

The anti-glare film 100 of FIG. 19 has an anti-glare layer 20 and has an uneven surface. In FIG. 19, a surface of the anti-glare layer 20 is the uneven surface of the anti-glare film. The anti-glare film 100 of FIG. 19 has the anti-glare layer 20 on a transparent substrate 10. The anti-glare layer 20 in FIG. 19 has a binder resin 21 and organic particles 22.

The anti-glare film of the second embodiment of the present disclosure is not limited to the laminated structure of FIG. 19 as long as the conditions 1 and 2 are satisfied. For example, the anti-glare film may have a single-layer structure of an anti-glare layer, or may have a layer other than the transparent substrate and the anti-glare layer, such as an anti-reflection layer and an anti-fouling layer. When another layer is provided on the anti-glare layer, a surface of the other layer may be the uneven surface of the anti-glare film.

In the second embodiment, a preferred embodiment of the anti-glare film includes an anti-glare layer on a transparent substrate, and a surface of the anti-glare layer opposite to the transparent substrate is the uneven surface of the anti-glare film.

<Transparent Substrate>

The anti-glare film of the second embodiment preferably has a transparent substrate in terms of ease of production of the anti-glare film and ease of handling of the anti-glare film. The transparent substrate of the second embodiment is as described above.

<Uneven Surface>

The anti-glare film of the second embodiment of the present disclosure has an uneven surface.

When there is no other layer on the anti-glare layer, a surface of the anti-glare layer serves as the uneven surface of the anti-glare film. When another layer is provided on the anti-glare layer, a surface of the other layer serves as the uneven surface of the anti-glare film.

<Condition 1, Condition 2>

The anti-glare film of the second embodiment of the present disclosure has an uneven surface, and the smoothed reflected light intensity measured under the following measurement conditions satisfies the following conditions 1 and 2.

<<Measurement Conditions>>

(1) in a transmission measurement mode of a goniophotometer, a visible light beam is emitted as a parallel light beam from a light source of the goniophotometer, an intensity of the emitted light is measured at an aperture angle of 1 degree without passing through a sample, and standardization is performed so that the maximum intensity is 100,000;

(2) a black plate is bonded to a surface opposite to the uneven surface of the anti-glare film via a transparent adhesive layer to produce a sample α in which the anti-glare film, the transparent adhesive layer, and the black plate are laminated and which has the uneven surface;

(3) the sample α is placed in the goniophotometer, the uneven surface of the sample α is irradiated with a visible light beam as a parallel light beam from the light source of the goniophotometer, and a reflected light intensity is measured at an aperture angle of 1 degree, wherein an irradiation angle of the parallel light beam is set to a direction inclined by +45 degrees from a normal direction of the sample α, the reflected light intensity is measured at intervals of 1 degree from 0 degrees, which is the normal direction of the sample α, to −85 degrees, and in order to maintain effects of standardization in (1), the reflected light intensity is measured in the transmission measurement mode; and (4) a smoothing process represented by the following formula (i) is performed at each angle from 0 degrees to −85 degrees, and the reflected light intensity after the smoothing process is defined as the smoothed reflected light intensity at each angle:

$$n\text{-degree smoothed reflected light intensity} = ([n-2\text{-degree reflected light intensity}] + [n-1\text{-degree reflected light intensity}] + [n\text{-degree reflected light intensity}] + [n+1\text{-degree reflected light intensity}] + [n+2\text{-degree reflected light intensity}])/5 \quad (i)$$

The step (1) of measurement conditions is a step of standardization. By performing the step (1), even when the brightness of the light source of the goniophotometer is different, the reflection characteristics of the anti-glare film can be evaluated based on the absolute value of the reflected light intensity in the step (3) and the absolute value of the smoothed reflected light intensity in the step (4) to be described later. When the reflected light intensity in the step (3) described later is measured for a plurality of samples, the standardization in the step (1) is performed for each sample.

In the step (1), the direction of the parallel light beam and the normal direction of the light receiver are made to coincide with each other to perform the standardization.

An example of the goniophotometer is "GC5000L" (trade name) manufactured by Nippon Denshoku Industries Co., Ltd. In examples described below, GC5000L (trade name) manufactured by Nippon Denshoku Industries Co., Ltd. (beam size: about 3 mm, inclination angle in beam: 0.8 degrees or less, aperture angle of light receiver: 1 degree) is used as the goniophotometer.

The step (2) of measurement conditions is a step of preparing a sample α, which is a sample for measurement. In the sample α, a black plate is bonded to the surface opposite to the uneven surface of the anti-glare film in order to eliminate reflection at the interface between the surface opposite to the uneven surface of the anti-glare film and the air in the measurement of the reflected light intensity in the step (3) described later.

The difference in refractive index between the member of the anti-glare film on the side in contact with the transparent adhesive layer and the transparent adhesive layer is preferably 0.15 or less, more preferably 0.10 or less, still more preferably 0.05 or less, further preferably 0.02 or less, and still further preferably 0.01 or less. Examples of the member of the anti-glare film on the side in contact with the transparent adhesive layer include a transparent substrate.

The black plate preferably has a total light transmittance of 1% or less, more preferably 0%, according to JIS K7361-1:1997. The difference between the refractive index of the resin constituting the black plate and the refractive index of the transparent adhesive layer is preferably 0.15 or less, more preferably 0.10 or less, still more preferably 0.05 or less, further preferably 0.02 or less, and still further preferably 0.01 or less.

The step (3) of the measurement conditions is a step of irradiating the uneven surface of the sample α with visible light beam as parallel light beam and measuring the reflected light intensity. The measurement of the reflected light intensity in step (3) is carried out in transmission measurement mode in order to maintain the effect of standardization in step (1).

In the step (3), the incident angle of the visible light beam is set to a direction inclined +45 degrees from the normal direction of the sample α. In FIG. 20, the dashed line indicates 0 degrees, which is the normal direction of the sample α, and the solid-line arrows indicate parallel light beam emitted from the light source.

In the step (3), the reflected light intensity is measured at intervals of 1 degree from 0 degrees, which is the normal direction of the sample α, to −85 degrees, and In FIG. 20, the direction of the dashed line indicates 0 degrees, and the direction of the dashed-dotted line indicates −85 degrees.

When measuring the reflected light intensity in the step (3), the detecting aperture angle of the light receiver set to 1 degree by a diaphragm of the light receiver. For example, in the measurement of 0 degrees, a range of −0.5 degrees to +0.5 degrees is measured, in the measurement of −35 degrees, a range of −34.5 degrees to −35.5 degrees is measured, and in the measurement of −85 degrees, a range of −85.5 degrees to −84.5 degrees is measured.

The step (4) of the measurement conditions is a step of performing a smoothing process represented by the following formula (i) and using the reflected light intensity after the smoothing process as the smoothed reflected light intensity at each angle.

$$n\text{-degree smoothed reflected light intensity} = ([n-2\text{-degree reflected light intensity}] + [n-1\text{-degree reflected light intensity}] + [n\text{-degree reflected light intensity}] + [n+1\text{-degree reflected light intensity}] + [n+2\text{-degree reflected light intensity}])/5 \quad \text{(i)}$$

In the formula (i), the measured value of the reflected light intensity may repeat increases and decreases in short cycles. Since the "central visual field", which is a well visible region in the human visual field, is "about 5 degrees", the smoothing process is performed using data of five points in formula (i).

Since the measurement range is from 0 degrees to −85 degrees, in the formula (i), three points are averaged at 0 degrees and −85 degrees, four points are averaged at −1 degrees and −84 degrees, and five points are not averaged. However, 0 degrees, −1 degree, −84 degrees, and −85 degrees are far from −45 degrees, which is the specular reflection direction of the incident light, and since the absolute value of the reflected light intensity is small, it can be said that it does not affect condition 1.

<<Condition 1, Condition 2>>

The anti-glare film of the second embodiment of the present disclosure requires that the smoothed reflected light intensity measured under the above measurement conditions satisfies conditions 1 and 2.

—Condition 1—

When the n-degree smoothed reflected light intensity is defined as Rn, and the n−1-degree smoothed reflected light intensity is defined as Rn−1, a maximum absolute value of difference between Rn and Rn−1 is 2.00 or less.

Satisfying the condition 1 means that the change in smoothed reflected light intensity for each angle is small. That is, light incident on and reflected by the uneven surface of the anti-glare film satisfying the condition 1 is not biased in the vicinity of the specular reflection direction, and is diffusely reflected at various angles. Therefore, by satisfying the condition 1, the anti-glare properties can be improved.

In condition 1, the maximum absolute value of the difference is preferably 1.00 or less, more preferably 0.50 or less, more preferably 0.20 or less, more preferably 0.10 or less, and more preferably 0.05 or less.

When the absolute value of the difference in condition 1 becomes too small, the resolution of the video tends to decrease. Therefore, the maximum absolute value of the difference is preferably 0.01 or more, more preferably 0.02 or more.

Examples of the preferred range of the maximum absolute value of the difference include 0.01 or more and 2.00 or less, 0.01 or more and 1.00 or less, 0.01 or more and 0.50 or less, 0.01 or more and 0.20 or less, 0.01 or more and 0.10 or less, 0.01 or more and 0.05 or less, 0.02 or more and 2.00 or less, 0.02 or more and 1.00 or less, 0.02 or more and 0.50 or less, 0.02 or more and 0.20 or less, 0.02 or more and 0.10 or less, and 0.02 or more and 0.05 or less.

—Condition 2—

The smoothed reflected light intensity at −35 degrees is 4.0 or less.

Satisfying condition 2 means that the smoothed reflected light intensity at −35 degrees, which is a direction 10 degrees away from −45 degrees, which is the specular reflection direction, is small. Normally, when a person sees an object, he or she sees the object from an angle at which there is no specular reflected light. Therefore, the intensity of the reflected scattered light (≈whiteness) is evaluated at an angle other than −45 degrees, which is the specular reflection direction, and thus can be made to match the appearance of a person.

Therefore, by satisfying condition 2, the reflected scattered light can be suppressed and the contrast of the image display device can be improved.

The smoothed reflected light intensity at −35 degrees and the smoothed reflected light intensity at −55 degrees are generally comparable. Therefore, it is preferable that the smoothed reflected light intensity at −55 degrees is also 4.0 or less.

Satisfying condition 2 and satisfying condition 1 means that even when a small amount of reflected scattered light is generated, the angular distribution of the reflected scattered light is uniform without bias. Therefore, by satisfying the conditions 1 and 2, the observer can hardly perceive the reflected scattered light, which gives the anti-glare film a jet-black appearance, and gives the image display device a luxurious feel.

In condition 2, the smoothed reflected light intensity at −35 degrees is preferably 2.0 or less, more preferably 1.5 or less, more preferably 1.0 or less, more preferably 0.5 or less, and more preferably 0.3 or less. It is preferable that the smoothed reflected light intensity at −55 degrees is also the above value.

When the smoothed reflected light intensity at −35 degrees in condition 2 becomes too small, the resolution of the video tends to decrease. Therefore, the smoothed reflected light intensity at −35 degrees is preferably 0.1 or more. It is preferable that the smoothed reflected light intensity at −55 degrees is also the above value.

Examples of the preferred range of the smoothed reflected light intensity at −35 degrees include 0.1 or more and 4.0 or less, 0.1 or more and 2.0 or less, 0.1 or more and 1.5 or less, 0.1 or more and 1.0 or less, 0.1 or more and 0.5 or less, and 0.1 or more and 0.3 or less.

<<Condition 3>>

In the anti-glare film of the second embodiment of the present disclosure, the smoothed reflected light intensity measured under the above measurement conditions preferably satisfies the following condition 3.

—Condition 3—

The smoothed reflected light intensity at −45 degrees is 8.0 or less.

Satisfying condition 3 means that the smoothed reflected light intensity at −45 degrees, which is the specular reflection direction, is small. Therefore, by satisfying condition 3, the reflected scattered light can be suppressed in all directions, and the anti-glare properties of the anti-glare film, the contrast of the image display device, and the jet-black appearance of the anti-glare film can be further improved.

In condition 3, the smoothed reflected light intensity at −45 degrees is more preferably 4.0 or less, still more preferably 2.0 or less, and further preferably 1.5 or less.

When the smoothed reflected light intensity at −45 degrees in condition 3 becomes too small, the resolution of the video tends to decrease. Therefore, the smoothed reflected light intensity at −45 degrees is preferably 0.1 or more.

Examples of the preferred range of the smoothed reflected light intensity at −45 degrees include 0.1 or more and 8.0 or less, 0.1 or more and 4.0 or less, 0.1 or more and 2.0 or less, and 0.1 or more and 1.5 or less.

In order to easily satisfy conditions 1 to 3, it is preferable that the uneven surface of the anti-glare film has a configuration in which peaks having a high elevation are present at narrow intervals. In the case of the above configuration, it is considered that conditions 1 to 3 are easily satisfied mainly for the following reasons (y1) to (y5).

(y1) Since the adjacent peaks are close to each other, most of the reflected light reflected on the surface of any peak enters the adjacent peak. Then, the light repeats total reflection inside the adjacent peak, and finally travels opposite to the observer 200 (solid line image in FIG. 21).

(y2) The reflected light of the light incident on the steep slope of any peak travels opposite to the observer 200 regardless of the adjacent peak (dashed line image in FIG. 21).

(y3) Since the adjacent peaks are close to each other, there are few substantially flat regions that generate specular reflected light.

(y4) The reflected light reflected by a substantially flat region present in a small proportion is likely to collide with the adjacent peak. Therefore, the angular distribution of the reflected light reflected by the substantially flat region is not biased to a predetermined angle, and becomes a substantially uniform angular distribution.

(y5) The reflected light of the light incident on the gentle slope of any peak travels toward the observer 200 (dashed-dotted line image in FIG. 21). Since the angular distribution of the gentle slope of the peak is uniform, the angular distribution of the reflected light is also uniform without being biased to a specific angle.

First, from (y1) to (y3) above, it is considered that the anti-glare properties can be improved at a predetermined level because the reflected scattered light can be suppressed.

Furthermore, from (y4) and (y5) above, even when a small amount of reflected scattered light is generated, the angular distribution of the reflected scattered light can be made uniform, and conditions 1 to 3 can be easily satisfied. Even when the amount of the reflected scattered light is very small, when the angular distribution of the reflected scattered light is biased to a specific angle, the light is recognized as reflected light. Therefore, the anti-glare properties can be made extremely good from (y4) and (y5) above.

Further, from (y1) to (y5) above, the observer can hardly perceive the reflected scattered light, which gives the anti-glare film a jet-black appearance, and furthermore, gives the image display device a luxurious feel.

<<Sa, Smp>>

The uneven surface of the anti-glare film of the second embodiment preferably has a three-dimensional arithmetic mean roughness Sa of 0.30 μm or more. Further, the uneven surface of the anti-glare film of the second embodiment preferably has a three-dimensional mean peak interval Smp of 10.00 μm or less. By setting Sa and Smp in the above ranges, the uneven surface in which peaks having a high elevation are present at narrow intervals can be easily obtained, and conditions 1 to 3 can be easily satisfied.

The preferred ranges of Sa and Smp in the second embodiment are as described above.

In the uneven surface of the anti-glare film of the second embodiment, Sa/Smp is preferably 0.05 or more, more preferably 0.10 or more, and still more preferably 0.13 or more. By setting Sa/Smp to 0.05 or more, it is possible to further increase the tendency of high peaks having a high elevation to be present at narrow intervals on the uneven surface of the anti-glare layer, and conditions 1 to 3 can be easily satisfied.

Sa/Smp is preferably 0.50 or less, more preferably 0.40 or less, and still more preferably 0.25 or less.

The preferred range of Sa/Smp in the second embodiment is as described above.

<<Sz/Sa>>

In the anti-glare film of the second embodiment, Sz/Sa, which is the ratio of the three-dimensional ten-point mean roughness Sz of the uneven surface and Sa, is preferably 5.0 or more, more preferably 5.5 or more, and still more preferably 6.0 or more. When Sz/Sa is 5.0 or more, a certain degree of randomness is imparted to the uneven surface, and defects such as scratches on the uneven surface can be made inconspicuous.

When Sz/Sa is too large, there is a possibility that peculiar points are present on the uneven surface, causing sparkle or locally reducing the jet-black appearance. Therefore, Sz/Sa is preferably 10.0 or less, more preferably 8.0 or less, and still more preferably 7.5 or less.

The preferred range of Sz/Sa in the second embodiment is as described above.

<<Ssk>>

In the anti-glare film of the second embodiment, the three-dimensional skewness Ssk of the uneven surface is preferably 0.60 or less, more preferably 0.20 or less, and still more preferably 0 or less. A small Ssk means that the uneven surface has a small proportion of low-elevation points. Therefore, by setting Ssk to 0.60 or less, the effects of (y3) and (y4) above are more likely to occur, the effects of anti-glare properties, suppression of reflected scattered light, and jet-black appearance can be exhibited more easily.

When Ssk is too small, the effects of (y5) above tend to increase reflected scattered light. Also, when Ssk is too small, the lower portions of adjacent peaks may overlap and slopes with large angles may disappear, reducing the effects of (y2) above. Therefore, Ssk is preferably −1.00 or more, more preferably −0.80 or more, and still more preferably −0.70 or more.

The preferred range of Ssk in the second embodiment is as described above.

<<Inclination Angle>>

The uneven surface of the anti-glare film of the second embodiment preferably has a predetermined inclination angle distribution.

Specifically, for the inclination angle of the uneven surface of the anti-glare film of the second embodiment, an inclination angle of more than 0 degrees and less than 1 degree is defined as $\theta 1$, an inclination angle of 1 degree or more and less than 3 degrees is defined as $\theta 2$, an inclination angle of 3 degrees or more and less than 10 degrees is defined as $\theta 3$, and an inclination angle of 10 degrees or more and less than 90 degrees is defined as $\theta 4$. Further, when the sum of $\theta 1$, $\theta 2$, $\theta 3$, and $\theta 4$ is 100%, the ratio of $\theta 1$, $\theta 2$, $\theta 3$, and $\theta 4$ is preferably within the following ranges. By setting $\theta 1$, $\theta 2$, $\theta 3$, and $\theta 4$ within the following ranges, conditions 1 to 3 can be easily satisfied.

$\theta 1 \leq 3.0\%$
$0.5\% \leq \theta 2 \leq 15.0\%$
$7.0\% \leq \theta 3 \leq 40.0\%$
$50.0\% \leq \theta 4 \leq 90.0\%$ The preferred range of $\theta 1$ in the second embodiment is as described above.

The preferred range of $\theta 2$ in the second embodiment is as described above.

The preferred range of $\theta 3$ in the second embodiment is as described above.

The preferred range of $\theta 4$ in the second embodiment is as described above.

<<Amplitude Spectrum of Elevation>>

In the anti-glare film of the second embodiment, it is preferable that the amplitude spectrum of the elevation of the uneven surface satisfies predetermined conditions.

For amplitude spectrum of elevation of the uneven surface, the sum of amplitudes corresponding to spatial frequencies of $0.005 \ \mu m^{-1}$, $0.010 \ \mu m^{-1}$, and $0.015 \ \mu m^{-1}$ is defined as AM1 and the amplitude at a spatial frequency of $0.300 \ \mu m^{-1}$ is defined as AM2.

On the above premise, in the anti-glare film of the second embodiment, it is preferable that AM1 is $0.070 \ \mu m$ or more and $0.400 \ \mu m$ or less. In the anti-glare film of the second embodiment, it is preferable that AM2 is $0.0050 \ \mu m$ or more. In the anti-glare film of the second embodiment, it is preferable that AM2<AM1.

Further, on the above premise, in the anti-glare film of the second embodiment, it is more preferable that AM1 is $0.070 \ \mu m$ or more and $0.400 \ \mu m$ or less, AM2 is $0.0050 \ \mu m$ or more, and AM2<AM1.

As described above, AM1 is the sum of the amplitudes of the three spatial frequencies and is represented by the following formula.

$$AM1 = \text{amplitude at spatial frequency } 0.005 \ \mu m^{-1} + \text{amplitude at spatial frequency } 0.010 \ \mu m^{-1} + \text{amplitude at spatial frequency } 0.015 \ \mu m^{-1}$$

Since the spatial frequency is a discrete value depending on the length of one side, a spatial frequency corresponding to $0.005 \ \mu m^{-1}$, $0.010 \ \mu m^{-1}$, $0.015 \ \mu m^{-1}$, and $0.300 \ \mu m^{-1}$ may not be obtained. In a case where there is no spatial frequency that matches the value, the amplitude of a spatial frequency having a value closest to the value may be extracted.

The spatial frequency and amplitude can be obtained by Fourier transforming the three-dimensional coordinate data of the uneven surface. The method of calculating the spatial frequency and amplitude from the three-dimensional coordinate data of the uneven surface is as described in the first embodiment.

<<AM1, AM2>>

For amplitude spectrum of elevation of the uneven surface, it can be said that the spatial frequency is generally correlated with "the reciprocal of the interval between the convex portions", and the amplitude is generally correlated with "the amount of change in the elevation of the convex portions having a predetermined interval". The spatial frequency of $0.005 \ \mu m^{-1}$ indicates that the interval is about 200 $\mu m$, the spatial frequency of $0.010 \ \mu m^{-1}$ indicates that the interval is about 100 $\mu m$, the spatial frequency of $0.015 \ \mu m^{-1}$ indicates that the interval is about 67 $\mu m$, and the spatial frequency of $0.300 \ \mu m^{-1}$ indicates that the interval is about 3 $\mu m$. It can be said that "the amount of change in the elevation of the convex portions having a predetermined interval" is generally proportional to the absolute value of each individual height of the convex portions having a predetermined interval.

Therefore, it can be said that it is indirectly defined that the uneven surfaces in which AM1 is $0.070 \ \mu m$ or more and $0.400 \ \mu m$ or less, AM2 is $0.0050 \ \mu m$ or more, and AM2<AM1 include the following convex portion groups i and ii.

<Convex Portion Group of i>

Those in which a plurality of convex portions i are disposed at intervals of about 67 $\mu m$ or more and 200 $\mu m$ or less, and the absolute value of the height of the convex portions i is within a predetermined range.

<Convex Portion Group of ii>

Those in which a plurality of convex portions ii are arranged at intervals of about 3 $\mu m$, and the absolute value of the height of the convex portions ii is greater than or equal to a predetermined value and less than the absolute value of the height of the convex portions i.

It is considered that the uneven surface including the convex portion groups of i and ii described above first exhibit the actions of (y1) to (y5) described above by the convex portion group of i described above. Further, in the uneven surface including the convex portion groups of i and ii, since the convex portion by the convex portion group ii can be formed in the substantially flat region between the adjacent peaks, the proportion of the specular reflected light in the reflected light reflected by the substantially flat region can be reduced. Therefore, it is considered that the uneven surface including the convex portion groups of i and ii described above tends to improve anti-glare properties, suppression of reflected scattered light, and jet-black appearance.

In order to allow the effects described above to be easily exhibited, AM1 is preferably 0.090 μm or more and 0.390 μm or less, more preferably 0.130 μm or more and 0.380 μm or less, and still more preferably 0.150 μm or more and 0.370 μm or less.

When AM is too small, the anti-glare properties tend to be particularly insufficient.

On the other hand, when AM1 is too large, the resolution of the video tends to decrease. Further, when AM1 is too large, the proportion of light totally reflected by the uneven surface increases, so the transmittance of light such as image light entering from the opposite side of the uneven surface tends to decrease. Also, when AM1 is too large, the proportion of light reflected to the observer side increases due to the increase in the number of convex portions having a large absolute value of height, and thus the reflected scattered light may become conspicuous. Therefore, it is suitable that AM1 is not too large in order to suppress the deterioration of the resolution and the transmittance and also to further suppress the reflected scattered light.

The preferred range of AM1 in the second embodiment is as described above.

In order to allow the effects described above to be easily exhibited, AM2 is preferably 0.0055 μm or more and 0.0550 μm or less, more preferably 0.0060 μm or more and 0.0500 μm or less, still more preferably 0.0070 μm or more and 0.0450 μm or less, and further preferably 0.0080 μm or more and 0.0400 μm or less.

When AM2 is too large, the resolution of the video tends to decrease. Therefore, it is also suitable that AM2 is not too large in order to suppress the deterioration of the resolution.

The preferred range of AM2 in the second embodiment is as described above.

In the second embodiment, when the average of the amplitudes corresponding to the spatial frequencies of 0.005 $\mu m^{-1}$, 0.010 $\mu m^{-1}$, and 0.015 $\mu m^{-1}$ is defined as AM1ave, AM1ave is preferably 0.023 μm or more and 0.133 μm or less, more preferably 0.030 μm or more and 0.130 μm or less, still more preferably 0.043 μm or more and 0.127 μm or less, and further preferably 0.050 μm or more and 0.123 μm or less. AM1ave can be represented by the following formula.

$$AM1ave = (\text{amplitude at spatial frequency } 0.005 \ \mu m^{-1} + \text{amplitude at spatial frequency } 0.010 \ \mu m^{-1} + \text{amplitude at spatial frequency } 0.015 \ \mu m^{-1})/3$$

In the second embodiment, when the amplitude corresponding to the spatial frequency of 0.005 $\mu m^{-1}$ is defined as AM1-1, the amplitude corresponding to the spatial frequency of 0.010 $\mu m^{-1}$ is defined as AM1-2, and the amplitude corresponding to the spatial frequency of 0.015 $\mu m^{-1}$ is defined as AM1-3, AM1-1, AM1-2, and AM1-3 are preferably in the ranges described above. By setting AM1-1, AM1-2, and AM1-3 within the ranges described above, it becomes easier to suppress the uniformity of the intervals between the convex portions, so it is easier to suppress an increase in reflected light.

The preferred range of AM1-1 in the second embodiment is as described above.

The preferred range of AM1-2 in the second embodiment is as described above.

The preferred range of AM1-3 in the second embodiment is as described above.

In the anti-glare film of the second embodiment, AM1/AM2 is preferably 1.0 or more and 60.0 or less, more preferably 2.0 or more and 50.0 or less, still more preferably 3.0 or more and 40.0 or less, and further preferably 4.0 or more and 30.0 or less in order to improve the balance of the convex portions having different cycles and to facilitate the effects of (y1) to (y5) to occur.

The preferred range of AM1/AM2 in the second embodiment is as described above.

<Anti-Glare Layer>

In the second embodiment, the anti-glare layer is the layer responsible for the suppression of reflected scattered light and the center of anti-glare properties.

<<Method for Forming Anti-Glare Layer>>

The method of forming the anti-glare layer of the second embodiment is as described above.

In the second embodiment, (d1) above is more preferable than (d2) above in that variation of surface shapes such as Sa and Smp can be easily suppressed. In the second embodiment, (d1) above is more preferable than (d2) above in that the balance between AM1 and AM2 is easily improved.

<<Thickness>>

In the second embodiment, the preferred range of the thickness T of the anti-glare layer is as described above.

<<Components>>

In the second embodiment, embodiments of the components of the anti-glare layer are as described above. That is, in the second embodiment, the anti-glare layer mainly contains a resin component, and optionally contains particles such as organic particles and inorganic fine particles, and additives such as a refractive index adjuster, an anti-static agent, an anti-fouling agent, an ultraviolet absorber, a light stabilizer, an antioxidant, a viscosity modifier, and a thermal polymerization initiator.

—Particles—

The types of particles in the second embodiment are as described above.

Since the specific gravity of organic particles is light, the organic particles are likely to float in the vicinity of the surface of the anti-glare layer when used in combination with the inorganic fine particles described later. Therefore, in the second embodiment, by using the organic particles and the inorganic fine particles in combination, it is possible to easily satisfy conditions 1 to 3, which is preferable. Further, in the second embodiment, by using the organic particles and the inorganic fine particles in combination, the organic particles can easily form unevenness having a long cycle and the inorganic fine particles can easily form unevenness having a short cycle, and thus AM1 and AM2 can easily be set in the range described above. Further, since the organic particles are likely to float in the vicinity of the surface of the anti-glare layer, the surface shapes such as Sa and Smp can easily be set in the range described above.

In the second embodiment, when only organic particles are used as the particles, it is preferable to increase the content ratio of the organic particles in the anti-glare layer in order to easily satisfy conditions 1 to 3. By increasing the content ratio of the organic particles in the anti-glare layer, a shape in which the organic particles are spread all over the surface is formed, and further, a shape in which the organic particles are stacked in the shape is easily partially formed. With such a shape, the effects of (y1) to (y5) described above can be easily obtained. By increasing the content ratio of the organic particles, it is possible to form a shape in which the organic particles are spread all over the surface to form unevenness having a short cycle AM2, and it is possible to form unevenness having a long cycle AM1 by partially forming a shape in which the organic particles are stacked in the shape in which the organic particles are spread all over the surface. In addition, the shape in which the organic particles are spread all over the surface makes it easy to reduce Smp. Furthermore, by partially forming a shape in which the organic particles are stacked in a shape in which the organic particles are spread all over the surface, Sa can be easily increased.

The preferred range of the average particle size D of the particles in the second embodiment is as described above.

In the second embodiment, by setting the average particle size D within the above range, it is possible to easily set the height of the peaks and the interval between the peaks of the uneven surface to be in an appropriate range, and to easily satisfy conditions 1 to 3.

In the second embodiment, by setting the average particle size D to 1.0 μm or more, AM1 can be easily suppressed from becoming too small, and Sa can be easily set to 0.30 μm or more. Further, in the second embodiment, by setting the average particle size D to 5.0 μm or less, AM1 can be easily suppressed from becoming too large, and Smp can be easily set to 10.00 μm or less.

In the second embodiment, the preferred range of D/T, which is the ratio of the thickness T of the anti-glare layer and the average particle size D of the particles, is as described above.

In the second embodiment, by setting D/T within the above range, it is possible to easily set the height of the peaks and the interval between the peaks of the uneven surface to be in an appropriate range, and to easily satisfy conditions 1 to 3. In the second embodiment, by setting D/T within the above range, AM1 and AM2 can easily be set in the range described above. Further, in the second embodiment, by setting D/T within the above range, it is possible to easily set the height of the peaks and the interval between the peaks of the uneven surface to be in an appropriate range, and to easily set the surface shapes such as Sa and Smp to be in the range described above.

In the second embodiment, the preferred range of the content of the particles is as described above.

In the second embodiment, by setting the content of the particles to 40 parts by mass or more, it is possible to easily set the height of the peaks and the interval between the peaks of the uneven surface to be in an appropriate range, and to easily satisfy conditions 1 to 3. In the second embodiment, by setting the content of the particles to 40 parts by mass or more, AM1 can be easily suppressed from becoming too small. Further, in the second embodiment, by setting the content of the particles to 40 parts by mass or more, Sa can be easily set to 0.30 μm or more, and Smp can be easily set to 10.00 μm or less.

In the second embodiment, by setting the content of the particles to 200 parts by mass or less, the particles can be easily prevented from falling off from the anti-glare layer.

In the second embodiment, when the inorganic fine particles described below are not used, the content of the particles is preferably set to a relatively large amount in the above range in order to facilitate the exhibition of the "spreading" and "stacking" described above.

—Inorganic Fine Particles—

As described above, in the second embodiment, the anti-glare layer preferably further contains inorganic fine particles in addition to the binder resin and particles. In particular, the anti-glare layer preferably further contains inorganic fine particles in addition to the binder resin and organic particles.

In the second embodiment, when the anti-glare layer contains inorganic fine particles, organic particles having a relatively low specific gravity are likely to float in the vicinity of the surface of the anti-glare layer, and thus the surface shapes such as Sa and Smp can easily be set in the range described above, and conditions 1 to 3 can be easily satisfied. Furthermore, in the second embodiment, when the anti-glare layer contains inorganic fine particles, fine unevenness is easily formed between peaks of the uneven surface, and thus specular reflected light is reduced, so that conditions 1 to 3 can be easily satisfied. Furthermore, in the second embodiment, when the anti-glare layer contains inorganic fine particles, fine unevenness is easily formed between peaks of the uneven surface, and AM1 and AM2 can easily be set in the range described above.

The types of inorganic fine particles in the second embodiment are as described above.

The preferred range of the average particle size of the inorganic fine particles in the second embodiment is as described above.

The preferred range of the content of the inorganic fine particles in the second embodiment is as described above.

In the second embodiment, by setting the content of the inorganic fine particles to 40 parts by mass or more, the effects based on the inorganic fine particles described above can be easily obtained. Further, in the second embodiment, by setting the content of the inorganic fine particles to 200 parts by mass or less, a decrease in coating film strength of the anti-glare layer can be easily suppressed.

—Binder Resin—

The types of binder resin in the second embodiment are as described above.

In the configuration C1 described above, the viscosity of the anti-glare layer-coating liquid is increased by the thermoplastic resin, so that the organic particles are less likely to sink, and the binder resin is less likely to flow down between the peaks. Therefore, in the second embodiment, in the configuration C1 above, it is possible to easily set the height of the peaks and the interval between the peaks of the uneven surface to be in an appropriate range, and to easily satisfy conditions 1 to 3. Furthermore, in the second embodiment, in the configuration C1 above, AM1 and AM2 can be easily suppressed from becoming too small, and the surface shapes such as Sa and Smp can be easily set within the above ranges.

The preferred range of the weight-average molecular weight of the thermoplastic resin in the second embodiment is as described above.

In the second embodiment, the preferred range of the mass ratio of the cured product of the ionizing radiation-curable resin composition and the thermoplastic resin in the configuration C1 is as described above.

In the second embodiment, by setting the thermoplastic resin to 10 or more with respect to the cured product 90 of the ionizing radiation-curable resin composition, the effect of increasing the viscosity of the anti-glare layer-coating liquid described above can be easily exhibited. Further, in the second embodiment, by setting the thermoplastic resin to 40 or less with respect to the cured product 60 of the ionizing radiation-curable resin composition, the decrease in the mechanical strength of the anti-glare layer can be easily suppressed.

In the second embodiment, in the above configuration C2, the organic particles are spread all over the bottom portion of the anti-glare layer, and the organic particles are stacked in a part of the region, and these organic particles tend to be covered with a thin-skinned binder resin. With such a shape, the effects of (y1) to (y5) described above can be easily obtained, and the conditions 1 to 3 can be easily satisfied. Further, in the configuration C2, the stacked organic particles form unevenness having a long cycle AM1, and the non-stacked organic particles form unevenness having a short cycle AM2 between the unevenness having a long cycle. Therefore, in the second embodiment, in the configuration C2, AM1 and AM2 can easily be set within the above ranges. In the second embodiment, in the configuration C2, Sa can be easily set within the above range by the stacked organic particles, and Smp can be easily set within the above range by the spread organic particles.

In the second embodiment, in the C2 configuration, it is preferable that the amount of the binder resins with respect to the organic particles is set to be smaller than that in the C1 configuration in order to easily form the binder resins into a thin film shape.

As described above, in the second embodiment, a solvent is usually used as the anti-glare layer-coating liquid to adjust the viscosity and to dissolve or disperse each component.

The type of solvent and the drying speed of the solvent in the second embodiment are as described above.

As described above, in the second embodiment, it is preferable that the main component of the solvent in the anti-glare layer-coating liquid is a solvent having a high evaporation rate.

In the second embodiment, by increasing the evaporation rate of the solvent, the organic particles are prevented from settling to the bottom portion of the anti-glare layer, and the binder resin is less likely to flow down between the peaks. Therefore, in the second embodiment, by increasing the evaporation rate of the solvent, it is possible to easily set the height of the peaks and the interval between the peaks of the uneven surface to be in an appropriate range, and to easily satisfy conditions 1 to 3. Further, by increasing the evaporation rate of the solvent, AM1 and AM2 can be easily set within the above ranges, and surface shapes such as Sa and Smp can be easily set within the above ranges.

As described above, in the second embodiment, the solvent in the anti-glare layer-coating liquid preferably also contains a small amount of solvent having a low evaporation rate in addition to the solvent having a high evaporation rate.

In the second embodiment, the preferred range of the mass ratio of the solvent having a high evaporation rate and the solvent having a low evaporation rate is as described above.

In the second embodiment, by containing a solvent having a low evaporation rate, the organic particles are aggregated, the height of the peaks and the interval between the peaks on the uneven surface can be easily set in an appropriate range, and conditions 1 to 3 can be easily satisfied. Further, in the second embodiment, by containing a solvent having a low evaporation rate and moderately agglomerating organic particles, AM1 and AM2 can be easily set within the above ranges, and surface shapes such as Sa and Smp can be easily set within the above ranges.

<Optical Characteristics>

Preferred ranges of the total light transmittance, haze and internal haze of the anti-glare film of the second embodiment are as described above.

<Other Layers>

The anti-glare film of the second embodiment may have another layer which is a layer other than the anti-glare layer and transparent substrate, as described above.

Embodiments of other layers in the second embodiment are as described above.

<Size, Shape, and the Like>

The size and shape of the anti-glare film of the second embodiment are as described above.

[Anti-Glare Film of Third Embodiment]

The anti-glare film of the third embodiment of the present disclosure is an anti-glare film comprising an anti-glare layer, the anti-glare film having an uneven surface, wherein the uneven surface has a three-dimensional arithmetic mean roughness Sa of 0.30 μm or more, and a three-dimensional mean peak interval Smp of 10.00 μm or less.

FIG. 19 is a schematic cross-sectional view of the cross-sectional shape of an anti-glare film 100 of the third embodiment of the present disclosure.

The anti-glare film 100 of FIG. 19 has an anti-glare layer 20 and has an uneven surface. In FIG. 19, a surface of the anti-glare layer 20 is the uneven surface of the anti-glare film. The anti-glare film 100 of FIG. 19 has the anti-glare layer 20 on a transparent substrate 10. The anti-glare layer 20 in FIG. 19 has a binder resin 21 and organic particles 22.

The anti-glare film of the third embodiment of the present disclosure is not limited to the laminated structure of FIG. 19 as long as the anti-glare film has an uneven surface in which Sa is 0.30 μm or more and Smp is 10.00 μm or less. For example, the anti-glare film may have a single-layer structure of an anti-glare layer, or may have a layer other than the transparent substrate and the anti-glare layer, such as an anti-reflection layer and an anti-fouling layer. When another layer is provided on the anti-glare layer, a surface of the other layer may be the uneven surface of the anti-glare film.

In the third embodiment, a preferred embodiment of the anti-glare film includes an anti-glare layer on a transparent substrate, and a surface of the anti-glare layer opposite to the transparent substrate is the uneven surface of the anti-glare film.

<Transparent Substrate>

The anti-glare film of the third embodiment preferably has a transparent substrate in terms of ease of production of the anti-glare film and ease of handling of the anti-glare film. Embodiments of the transparent substrate of the third embodiment are as described above.

<Uneven Surface>

The anti-glare film of the third embodiment has an uneven surface, and the uneven surface is required to have Sa of 0.30 μm or more and Smp of 10.00 μm or less.

When there is no other layer on the anti-glare layer, the surface of the anti-glare layer may satisfy the conditions of the uneven surface. When there is another layer on the anti-glare layer, the surface of the other layer may satisfy the above conditions of the uneven surface.

<<Sa, Smp>>

An uneven surface in which Sa is 0.30 μm or more and Smp is 10.00 μm or less indicates that peaks having a high elevation are present at narrow intervals. In this way, it is considered that when peaks having a high elevation are present at narrow intervals, the uneven surface can exhibit excellent anti-glare properties and can suppress reflected scattered light mainly for the following reasons (z1) to (z5).

(z1) Since the adjacent peaks are close to each other, most of the reflected light reflected on the surface of any peak enters the adjacent peak. Then, the light repeats total reflection inside the adjacent peak, and finally travels opposite to the observer 200 (solid line image in FIG. 21).

(z2) The reflected light of the light incident on the steep slope of any peak travels opposite to the observer 200 regardless of the adjacent peak (dashed line image in FIG. 21).

(z3) Since the adjacent peaks are close to each other, there are few substantially flat regions that generate specular reflected light.

(z4) The reflected light reflected by a substantially flat region present in a small proportion is likely to collide with the adjacent peak. Therefore, the angular distribution of the reflected light reflected by the substantially flat region is not biased to a predetermined angle, and becomes a substantially uniform angular distribution.

(z5) The reflected light of the light incident on the gentle slope of any peak travels toward the observer 200 (dashed-dotted line image in FIG. 21). Since the angular distribution of the gentle slope of the peak is uniform, the angular distribution of the reflected light is also uniform without being biased to a specific angle.

First, from (z1) to (z3) above, it is considered that the anti-glare properties can be improved at a predetermined level because the reflected scattered light can be suppressed.

Furthermore, from (z4) and (z5) above, even when a small amount of reflected scattered light is generated, the angular distribution of the reflected scattered light can be made uniform. Even when the amount of the reflected scattered light is very small, when the angular distribution of the reflected scattered light is biased to a specific angle, the light is recognized as reflected light. Therefore, the anti-glare properties can be made extremely good from (z4) and (z5) above.

Further, from (z1) to (z5) above, the observer can hardly perceive the reflected scattered light, which gives the anti-glare film a jet-black appearance, and furthermore, gives the image display device a luxurious feel.

Sa is preferably 0.40 μm or more, more preferably 0.50 μm or more, and still more preferably 0.55 μm or more in order to more easily exhibit the effects of the anti-glare properties, the suppression of reflected scattered light, and the jet-black appearance.

When Sa is too large, the resolution of the video tends to decrease. Further, when Sa becomes too large, the proportion of light totally reflected by the uneven surface increases, so the transmittance of light such as image light entering from the opposite side of the uneven surface tends to decrease. Therefore, Sa is preferably 1.00 μm or less, more preferably 0.80 μm or less, and still more preferably 0.70 μm or less.

The preferred range of Sa in the third embodiment is as described above.

The variation of Sa is preferably 0.090 μm or less, more preferably 0.070 μm or less, and still more preferably 0.050 μm or less, for in-plane uniformity of the effects of anti-glare properties, suppression of reflected scattered light, and jet-black appearance.

The lower limit of Sa variation is not particularly limited, but is usually 0.010 μm or more, preferably 0.020 μm or more.

In the present specification, variation means standard deviation σ. In the present specification, variations in various parameters mean variations in measured values at the sixteen points described above.

Examples of the preferred range of variation of Sa include 0.010 μm or more and 0.090 μm or less, 0.010 μm or more and 0.070 μm or less, 0.010 μm or more and 0.050 μm or less, 0.020 μm or more and 0.090 μm or less, 0.020 μm or more and 0.070 μm or less, and 0.020 μm or more and 0.050 μm or less.

Smp is preferably 8.00 μm or less, more preferably 6.00 μm or less, still more preferably 4.50 μm or less, and further preferably 3.50 μm or less, in order to more easily exhibit the effects of the anti-glare properties, the suppression of the reflected scattered light, and the jet-black appearance.

When Smp is too small, the lower portions of adjacent peaks may overlap and slopes with large angles may disappear, reducing the effects of (z2) above. Therefore, Smp is preferably 1.00 μm or more, more preferably 1.50 μm or more, and still more preferably 2.00 μm or more.

The preferred range of Smp in the third embodiment is as described above.

The variation of Smp is preferably 3.00 μm or less, more preferably 2.00 μm or less, still more preferably 1.00 μm or less, and further preferably 0.50 μm or less, for in-plane uniformity of the effects of anti-glare properties, suppression of reflected scattered light, and jet-black appearance.

When the variation of Smp is too small, moire may occur in combination with the pixels of the display element. Therefore, the variation of Smp is preferably 0.05 μm or more, more preferably 0.10 μm or more, and still more preferably 0.15 μm or more.

Examples of the preferred range of variation of Smp include 0.05 μm or more and 3.00 μm or less, 0.05 μm or more and 2.00 μm or less, 0.05 μm or more and 1.00 μm or less, 0.05 μm or more and 0.50 μm or less, 0.10 μm or more and 3.00 μm or less, 0.10 μm or more and 2.00 μm or less, 0.10 μm or more and 1.00 μm or less, 0.10 μm or more and 0.50 μm or less, 0.15 μm or more and 3.00 μm or less, 0.15 μm or more and 2.00 μm or less, 0.15 μm or more and 1.00 μm or less, and 0.15 μm or more and 0.50 μm or less.

In the anti-glare film of the third embodiment, Sa/Smp is preferably 0.05 or more, more preferably 0.10 or more, and still more preferably 0.13 or more. By setting Sa/Smp to 0.05 or more, it is possible to further increase the tendency of peaks having a high elevation to be present at narrow intervals on the uneven surface of the anti-glare film, and the effects of anti-glare properties, suppression of reflected scattered light, and jet-black appearance can be exhibited more easily.

When Sa/Smp is too large, the above-described effect when Sa is too large and the above-described effect when Smp is too small may occur. Therefore, Sa/Smp is preferably 0.50 or less, more preferably 0.40 or less, and still more preferably 0.25 or less.

The preferred range of Sa/Smp in the third embodiment is as described above.

<<Sz/Sa>>

In the anti-glare film of the third embodiment, Sz/Sa, which is the ratio of the three-dimensional ten-point mean roughness Sz of the uneven surface and Sa, is preferably 5.0 or more, more preferably 5.5 or more, and still more preferably 6.0 or more. When Sz/Sa is 5.0 or more, a certain degree of randomness is imparted to the uneven surface, and defects such as scratches on the uneven surface can be made inconspicuous.

When Sz/Sa is too large, there is a possibility that peculiar points are present on the uneven surface, causing sparkle or locally reducing the jet-black appearance. Therefore, Sz/Sa is preferably 10.0 or less, more preferably 8.0 or less, and still more preferably 7.5 or less.

The preferred range of Sz/Sa in the third embodiment is as described above.

<<Ssk>>

In the anti-glare film of the third embodiment, the three-dimensional skewness Ssk of the uneven surface is preferably 0.60 or less, more preferably 0.20 or less, and still more preferably 0 or less. A small Ssk means that the uneven surface has a small proportion of low-elevation points. Therefore, by setting Ssk to 0.60 or less, the effects of (z3) and (z4) above are more likely to occur, the effects of anti-glare properties, suppression of reflected scattered light, and jet-black appearance can be exhibited more easily.

When Ssk is too small, the effects of (z5) above tend to increase reflected scattered light. Also, when Ssk is too small, the lower portions of adjacent peaks may overlap and slopes with large angles may disappear, reducing the effects of (z2) above. Therefore, Ssk is preferably −1.00 or more, more preferably −0.80 or more, and still more preferably −0.70 or more.

The preferred range of Ssk in the third embodiment is as described above.

<<Inclination Angle>>

The uneven surface of the anti-glare film of the third embodiment preferably has a predetermined inclination angle distribution.

Specifically, for the inclination angle of the uneven surface of the anti-glare film, an inclination angle of more than 0 degrees and less than 1 degree is defined as $\theta 1$, an inclination angle of 1 degree or more and less than 3 degrees is defined as $\theta 2$, an inclination angle of 3 degrees or more and less than 10 degrees is defined as $\theta 3$, and an inclination angle of 10 degrees or more and less than 90 degrees is defined as $\theta 4$. Further, when the sum of $\theta 1$, $\theta 2$, $\theta 3$, and $\theta 4$ is 100%, the ratio of $\theta 1$, $\theta 2$, $\theta 3$, and $\theta 4$ is preferably within the following ranges. By setting $\theta 1$, $\theta 2$, $\theta 3$, and $\theta 4$ within the following ranges, the effects (z1) to (z5) described above can be easily generated, and reduction in resolution can be easily suppressed.

$\theta 1 \leq 3.0\%$
$0.5\% \leq \theta 2 \leq 15.0\%$
$7.0\% \leq \theta 3 \leq 40.0\%$
$50.0\% \leq \theta 4 \leq 90.0\%$ The preferred range of $\theta 1$ in the third embodiment is as described above.

The preferred range of $\theta 2$ in the third embodiment is as described above.

The preferred range of $\theta 3$ in the third embodiment is as described above.

The preferred range of $\theta 4$ in the third embodiment is as described above.

<<Amplitude Spectrum of Elevation>>

In the anti-glare film of the third embodiment, it is preferable that the amplitude spectrum of the elevation of the uneven surface satisfies predetermined conditions.

For amplitude spectrum of elevation of the uneven surface, the sum of amplitudes corresponding to spatial frequencies of 0.005 $\mu m^{-1}$, 0.010 $\mu m^{-1}$, and 0.015 $\mu m^{-1}$ is defined as AM1 and the amplitude at a spatial frequency of 0.300 $\mu m^{-1}$ is defined as AM2.

On the above premise, in the anti-glare film of the third embodiment, it is preferable that AM1 is 0.070 $\mu m$ or more and 0.400 $\mu m$ or less. In the anti-glare film of the third embodiment, it is preferable that AM2 is 0.0050 $\mu m$ or more. In the anti-glare film of the third embodiment, it is preferable that AM2<AM1.

Further, on the above premise, in the anti-glare film of the third embodiment, it is more preferable that AM1 is 0.070 $\mu m$ or more and 0.400 $\mu m$ or less, AM2 is 0.0050 $\mu m$ or more, and AM2<AM1.

As described above, AM1 is the sum of the amplitudes of the three spatial frequencies and is represented by the following formula.

$$AM1 = \text{amplitude at spatial frequency } 0.005\ \mu m^{-1} +$$
$$\text{amplitude at spatial frequency } 0.010\ \mu m^{-1} +$$
$$\text{amplitude at spatial frequency } 0.015\ \mu m^{-1}$$

Since the spatial frequency is a discrete value depending on the length of one side, a spatial frequency corresponding to 0.005 $\mu m^{-1}$, 0.010 $\mu m^{-1}$, 0.015 $\mu m^{-1}$, and 0.300 $\mu m^{-1}$ may not be obtained. In a case where there is no spatial frequency that matches the value, the amplitude of a spatial frequency having a value closest to the value may be extracted.

The spatial frequency and amplitude can be obtained by Fourier transforming the three-dimensional coordinate data of the uneven surface. The method of calculating the spatial frequency and amplitude from the three-dimensional coordinate data of the uneven surface is as described in the first embodiment.

<<AM1, AM2>>

For amplitude spectrum of elevation of the uneven surface, it can be said that the spatial frequency is generally correlated with "the reciprocal of the interval between the convex portions", and the amplitude is generally correlated with "the amount of change in the elevation of the convex portions having a predetermined interval". The spatial frequency of 0.005 $\mu m^{-1}$ indicates that the interval is about 200 $\mu m$, the spatial frequency of 0.010 $\mu m^{-1}$ indicates that the interval is about 100 $\mu m$, the spatial frequency of 0.015 $\mu m^{-1}$ indicates that the interval is about 67 $\mu m$, and the spatial frequency of 0.300 $\mu m^{-1}$ indicates that the interval is about 3 $\mu m$. It can be said that "the amount of change in the elevation of the convex portions having a predetermined interval" is generally proportional to the absolute value of each individual height of convex portions having a predetermined interval.

Therefore, it can be said that it is indirectly defined that the uneven surfaces in which AM1 is 0.070 $\mu m$ or more and 0.400 $\mu m$ or less, AM2 is 0.0050 $\mu m$ or more, and AM2<AM1 include the following convex portion groups i and ii.

<Convex Portion Group of i>

Those in which a plurality of convex portions i are disposed at intervals of about 67 $\mu m$ or more and 200 $\mu m$ or less, and the absolute value of the height of the convex portions i is within a predetermined range.

<Convex Portion Group of ii>

Those in which a plurality of convex portions ii are arranged at intervals of about 3 $\mu m$, and the absolute value of the height of the convex portions ii is greater than or equal to a predetermined value and less than the absolute value of the height of the convex portions i.

It is considered that the uneven surface including the convex portion groups of i and ii described above first exhibit the actions of (z1) to (z5) described above by the convex portion group of i described above. Further, in the uneven surface including the convex portion groups of i and ii above, since the convex portion by the convex portion group ii above can be formed in the substantially flat region between the adjacent peaks, the proportion of the specular reflected light in the reflected light reflected by the substantially flat region can be reduced. Therefore, it is considered that the uneven surface including the convex portion groups of i and ii described above tends to improve anti-glare properties, suppression of reflected scattered light, and jet-black appearance.

In order to allow the effects described above to be easily exhibited, AM1 is preferably 0.090 $\mu m$ or more and 0.390 $\mu m$ or less, more preferably 0.130 $\mu m$ or more and 0.380 $\mu m$ or less, and still more preferably 0.150 $\mu m$ or more and 0.370 $\mu m$ or less.

When AM is too small, the anti-glare properties tend to be particularly insufficient.

On the other hand, when AM1 is too large, the resolution of the video tends to decrease. Further, when AM1 is too large, the proportion of light totally reflected by the uneven surface increases, so the transmittance of light such as image light entering from the opposite side of the uneven surface tends to decrease. Also, when AM1 is too large, the proportion of light reflected to the observer side increases due to the increase in the number of convex portions having a large absolute value of height, and thus the reflected scattered light may become conspicuous. Therefore, it is suitable that AM1 is not too large in order to suppress the deterioration of the resolution and the transmittance and also to further suppress the reflected scattered light.

The preferred range of AM1 in the third embodiment is as described above.

In order to allow the effects described above to be easily exhibited, AM2 is preferably 0.0055 μm or more and 0.0550 μm or less, more preferably 0.0060 μm or more and 0.0500 μm or less, still more preferably 0.0070 μm or more and 0.0450 μm or less, and further preferably 0.0080 μm or more and 0.0400 μm or less.

When AM2 is too large, the resolution of the video tends to decrease. Therefore, it is also suitable that AM2 is not too large in order to suppress the deterioration of the resolution.

The preferred range of AM2 in the third embodiment is as described above.

In the third embodiment, when the average of the amplitudes corresponding to the spatial frequencies of 0.005 $\mu m^{-1}$, 0.010 $\mu m^{-1}$, and 0.015 $\mu m^{-1}$ is defined as AM1ave, AM1ave is preferably 0.023 μm or more and 0.133 μm or less, more preferably 0.030 μm or more and 0.130 μm or less, still more preferably 0.043 μm or more and 0.127 μm or less, and further preferably 0.050 μm or more and 0.123 μm or less. AM1ave can be represented by the following formula.

$$AM1\text{ave} = (\text{amplitude at spatial frequency } 0.005\ \mu m^{-1} + \text{amplitude at spatial frequency } 0.010\ \mu m^{-1} + \text{amplitude at spatial frequency } 0.015\ \mu m^{-1})/3$$

In the third embodiment, when the amplitude corresponding to the spatial frequency of 0.005 $\mu m^{-1}$ is defined as AM1-1, the amplitude corresponding to the spatial frequency of 0.010 $\mu m^{-1}$ is defined as AM1-2, and the amplitude corresponding to the spatial frequency of 0.015 $\mu m^{-1}$ is defined as AM1-3, AM1-1, AM1-2, and AM1-3 are preferably in the ranges described above. By setting AM1-1, AM1-2, and AM1-3 within the ranges described above, it becomes easier to suppress the uniformity of the intervals between the convex portions, so it is easier to suppress an increase in reflected light.

The preferred range of AM1-1 in the third embodiment is as described above.

The preferred range of AM1-2 in the third embodiment is as described above.

The preferred range of AM1-3 in the third embodiment is as described above.

In the anti-glare film of the third embodiment, AM1/AM2 is preferably 1.0 or more and 60.0 or less, more preferably 2.0 or more and 50.0 or less, still more preferably 3.0 or more and 40.0 or less, and further preferably 4.0 or more and 30.0 or less in order to improve the balance of the convex portions having different cycles and to facilitate the effects of (z1) to (z5) above to occur.

The preferred range of AM1/AM2 in the third embodiment is as described above.

<Anti-Glare Layer>

In the third embodiment, the anti-glare layer is the layer responsible for the suppression of reflected scattered light and the center of anti-glare properties.

<<Method for Forming Anti-Glare Layer>>

The method of forming the anti-glare layer of the third embodiment is as described above.

In the third embodiment, (d1) above is more preferable than (d2) above in that variation of surface shapes such as Sa and Smp can be easily suppressed. In the third embodiment, (d1) above is more preferable than (d2) above in that the balance between AM1 and AM2 is easily improved.

<<Thickness>>

In the third embodiment, the preferred range of the thickness T of the anti-glare layer is as described above.

<<Components>>

In the third embodiment, embodiments of the components of the anti-glare layer are as described above. That is, in the third embodiment, the anti-glare layer mainly contains a resin component, and optionally contains particles such as organic particles and inorganic fine particles, and additives such as a refractive index adjuster, an anti-static agent, an anti-fouling agent, an ultraviolet absorber, a light stabilizer, an antioxidant, a viscosity modifier, and a thermal polymerization initiator.

—Particles—

The types of particles in the third embodiment are as described above.

Since the specific gravity of organic particles is light, the organic particles are likely to float in the vicinity of the surface of the anti-glare layer when used in combination with the inorganic fine particles described later. Therefore, in the third embodiment, by using the organic particles and the inorganic fine particles in combination, the surface shapes such as Sa, Smp, and Ssk can easily be set in the range described above, which is preferable. Further, in the third embodiment, by using the organic particles and the inorganic fine particles in combination, the organic particles can easily form unevenness having a long cycle and the inorganic fine particles can easily form unevenness having a short cycle, and thus AM1 and AM2 can easily be set in the range described above.

In the third embodiment, when only organic particles are used as the particles, it is preferable to increase the content ratio of the organic particles in the anti-glare layer in order to easily set the surface shapes such as Sa and Smp in the ranges described above. By increasing the content ratio of the organic particles in the anti-glare layer, the antiglare layer has a shape in which the organic particles are spread all over the surface, so that Smp can be easily reduced, and further, by partially forming a shape in which the organic particles are stacked in the shape, Sa can be easily increased. By increasing the content ratio of the organic particles, it is possible to form a shape in which the organic particles are spread all over the surface to form unevenness having a short cycle AM2, and it is possible to form unevenness having a long cycle AM1 by partially forming a shape in which the organic particles are stacked in the shape in which the organic particles are spread all over the surface.

The preferred range of the average particle size D of the particles in the third embodiment is as described above.

By setting the average particle size D to 1.0 μm or more, Sa can be easily set to 0.30 μm or more, and AM1 can be easily suppressed from becoming too small. By setting the average particle size D to 5.0 μm or less, Smp can be easily set to 10.00 μm or less, and AM1 can be easily suppressed from becoming too large.

In the third embodiment, the preferred range of D/T, which is the ratio of the thickness T of the anti-glare layer and the average particle size D of the particles, is as described above.

In the third embodiment, by setting D/T within the above range, it is possible to easily set the height of the peaks and the interval between the peaks of the uneven surface to be in an appropriate range, and to easily set the surface shapes such as Sa and Smp to be in the range described above. In the third embodiment, by setting D/T within the above range, AM1 and AM2 can easily be set in the range described above.

In the third embodiment, the preferred range of the content of the particles is as described above.

In the third embodiment, by setting the content of the particles to 40 parts by mass or more, Sa can be easily set to 0.30 μm or more, Smp can be easily set to 10.00 μm or less, and Ssk can be easily set to 0.40 or less. In the third embodiment, by setting the content of the particles to 40 parts by mass or more, AM1 can be easily suppressed from becoming too small.

In the third embodiment, by setting the content of the particles to 200 parts by mass or less, the particles can be easily prevented from falling off from the anti-glare layer.

In the third embodiment, when the inorganic fine particles described below are not used, the content of the particles is preferably set to a relatively large amount in the above range in order to facilitate the exhibition of the "stacking" described above to occur.

—Inorganic Fine Particles—

As described above, in the third embodiment, the anti-glare layer preferably further contains inorganic fine particles in addition to the binder resin and particles. In particular, the anti-glare layer preferably further contains inorganic fine particles in addition to the binder resin and organic particles.

In the third embodiment, when the anti-glare layer contains inorganic fine particles, organic particles having a relatively low specific gravity are likely to float in the vicinity of the surface of the anti-glare layer, and thus the surface shapes such as Sa, Smp and Ssk can easily be set in the range described above. Furthermore, in the third embodiment, when the anti-glare layer contains inorganic fine particles, fine unevenness is easily formed between peaks of the uneven surface, and thus specular reflected light can be easily reduced. Furthermore, when the anti-glare layer contains inorganic fine particles, fine unevenness is easily formed between peaks of the uneven surface, and AM1 and AM2 can easily be set in the range described above.

The types of inorganic fine particles in the third embodiment are as described above.

The preferred range of the average particle size of the inorganic fine particles in the third embodiment is as described above.

The preferred range of the content of the inorganic fine particles in the third embodiment is as described above.

In the third embodiment, by setting the content of the inorganic fine particles to 40 parts by mass or more, the effects based on the inorganic fine particles described above can be easily obtained. Further, in the third embodiment, by setting the content of the inorganic fine particles to 200 parts by mass or less, a decrease in coating film strength of the anti-glare layer can be easily suppressed.

—Binder Resin—

The types of binder resin in the third embodiment are as described above.

In the configuration C1 described above, the viscosity of the anti-glare layer-coating liquid is increased by the thermoplastic resin, so that the organic particles are less likely to sink, and the binder resin is less likely to flow down between the peaks. Therefore, in the third embodiment, in the configuration C1, surface shapes such as Sa and Smp can easily be set within the above ranges. Furthermore, in the third embodiment, in the configuration C1, AM1 and AM2 can be easily suppressed from becoming too small.

The preferred range of the weight-average molecular weight of the thermoplastic resin in the third embodiment is as described above.

In the third embodiment, the preferred range of the mass ratio of the cured product of the ionizing radiation-curable resin composition and the thermoplastic resin in the configuration C1 is as described above.

In the third embodiment, by setting the thermoplastic resin to 10 or more with respect to the cured product 90 of the ionizing radiation-curable resin composition, the effect of increasing the viscosity of the anti-glare layer-coating liquid described above can be easily exhibited. Further, in the third embodiment, by setting the thermoplastic resin to 40 or less with respect to the cured product 60 of the ionizing radiation-curable resin composition, the decrease in the mechanical strength of the anti-glare layer can be easily suppressed.

In the third embodiment, in the above configuration C2, the organic particles are spread all over the bottom portion of the anti-glare layer, and the organic particles are stacked in a part of the region, and these organic particles tend to be covered with a thin-skinned binder resin. Therefore, in the third embodiment, in the configuration C2, Sa can be easily set within the above range by the stacked organic particles, and Smp can be easily set within the above range by the spread organic particles. Further, in the third embodiment, in the configuration C2, the stacked organic particles form unevenness having a long cycle AM1, and the non-stacked organic particles form unevenness having a short cycle AM2 between the unevenness having a long cycle. Therefore, in the third embodiment, in the configuration C2, AM1 and AM2 can easily be set within the above ranges.

In the third embodiment, in the C2 configuration above, it is preferable that the amount of the binder resins with respect to the organic particles is set to be smaller than that in the C1 configuration above in order to easily form the binder resins into a thin film shape.

As described above, in the third embodiment, a solvent is usually used as the anti-glare layer-coating liquid to adjust the viscosity and to dissolve or disperse each component.

The type of solvent and the drying speed of the solvent in the third embodiment are as described above.

As described above, in the third embodiment, it is preferable that the main component of the solvent in the anti-glare layer-coating liquid is a solvent having a high evaporation rate.

In the third embodiment, by increasing the evaporation rate of the solvent, the organic particles are prevented from settling to the bottom portion of the anti-glare layer, and the binder resin is less likely to flow down between the peaks. Therefore, in the third embodiment, by increasing the evaporation rate of the solvent, surface shapes such as Sa and Smp can be easily set within the above ranges. Further, in the third embodiment, by increasing the evaporation rate of the solvent, AM1 and AM2 can be easily set within the above ranges.

As described above, in the third embodiment, the solvent in the anti-glare layer-coating liquid preferably also contains a small amount of solvent having a low evaporation rate in addition to the solvent having a high evaporation rate.

In the third embodiment, the preferred range of the mass ratio of the solvent with a high evaporation rate and the solvent having a low evaporation rate is as described above.

In the third embodiment, by containing a solvent having a low evaporation rate, the organic particles are aggregated, and Sa, Smp, and the like. can be easily set within the above ranges. Further, in the third embodiment, by containing a solvent having a low evaporation rate and moderately agglomerating organic particles, AM1 and AM2 can be easily set within the above ranges.

<Optical Characteristics>

Preferred ranges of the total light transmittance, haze and internal haze of the anti-glare film of the third embodiment are as described above.

<Other Layers>

The anti-glare film of the third embodiment may have another layer which is a layer other than the anti-glare layer and transparent substrate, as described above.

Embodiments of other layers in the third embodiment are as described above.

<Size, Shape, and the Like>

The size and shape of the anti-glare film of the third embodiment are as described above.

[Image Display Device]

The image display device of the present disclosure is an image display device including a display element and the anti-glare film of any one of the first, second, and third embodiments disposed on the display element so that a surface of the anti-glare film on the uneven surface side is disposed so as to face the opposite side to the display element, the anti-glare film being disposed on an outermost surface (see FIG. 3).

Examples of display elements include liquid crystal display elements, EL display elements such as organic EL display elements and inorganic EL display elements, plasma display elements, and LED display elements such as micro LED display elements. These display elements may have a touch panel function inside the display element.

Examples of the liquid crystal display method of the liquid crystal display element includes an IPS method, a VA method, a multi-domain method, an OCB method, an STN method, and a TSTN method. When the display element is a liquid crystal display element, a backlight is required. The backlight is arranged on the side of the liquid crystal display element opposite to the side where the anti-glare film is arranged.

The image display device of the present disclosure may be an image display device with a touch panel having the touch panel between the display element and the anti-glare film. In this case, the anti-glare film may be disposed on the outermost surface of the image display device with the touch panel, and the uneven surface side of the anti-glare film may be disposed so as to face the side opposite to the display element.

The size of the image display device is not particularly limited, but the maximum size of the effective display region is about 2 inches or more and 500 inches or less.

The effective display region of an image display device is an area in which an image can be displayed. For example, when the image display device has a housing that surrounds the display element, the region inside the housing becomes the effective image region.

The maximum size of the effective image region refers to the maximum length of any two points within the effective image area when connected. For example, when the effective image region is rectangular, the diagonal line of the rectangle is the maximum size. When the effective image region is circular, the diameter of the circle is the maximum size.

EXAMPLES

Next, the present disclosure will be described in more detail with reference to Examples, but the present disclosure is not limited by these Examples. "Parts" and "%" are based on mass unless otherwise specified.

Example and Comparative Example of First Embodiment

1. Measurement and Evaluation

The anti-glare films of Examples and Comparative Examples were measured and evaluated as follows. The atmosphere during each measurement and evaluation was set at a temperature of 23±5° C. and a humidity of 40% or more and 65% or less. In addition, before starting each measurement and evaluation, the target sample was exposed to the atmosphere for 30 minutes or more, and then the measurement and evaluation were performed. The results are shown in Table 1 or 2.

1-1. Measurement of AM1 and AM2

The anti-glare films of Examples and Comparative Examples were cut into pieces of 10 cm×10 cm. The cutting site was selected from random sites after visually confirming that there were no abnormal points such as dust and scratches. The transparent substrate side of the cut anti-glare film was bonded to a glass plate (thickness 2.0 cm) having a size of vertical 10 cm×horizontal 10 cm through an optically transparent adhesive sheet (trade name: Panaclean PD-S1, thickness 25 μm) manufactured by Panac Co., Ltd. to produce a sample 1.

Using a white light interferometry microscope (Zygo Corporation, New View7300), the sample 1 was set on a measurement stage so as to be fixed and in close contact with the measurement stage, and then the elevation of the uneven surfaces of the anti-glare film was measured and analyzed under the following measurement condition 1 and analysis condition 1 to calculate AM1 and AM2. Microscope Application of MetroPro ver 9.0.10 was used as measurement/analysis software.

(Measurement Condition 1)

Objective lens: 50×

Image Zoom: 1×

Measurement region: 218 μm×218 μm

Resolution (spacing per point): 0.22 μm

Instrument: NewView 7000 Id 0 SN 073395

Acquisition Mode: Scan

Scan Type: Bipolar

Camera Mode: 992×992 48 Hz

Subtract Sys Err: Off

SysErr File: SysErr. dat

AGC: Off

Phase Res: High

Connection Order: Location

Discon Action: Filter

Min Mod (%): 0.01

Min Area Size: 7

Remove Fringes: Off

Number of Averages: 0

FDA Noise Threshold: 10

Scan Length: 15 um bipolar (6 sec)

Extended Scan Length: 1000 μm

FDA Res: High 2 G (Analysis Condition 1)

Removed: None

Data Fill: On

Data Fill Max: 10000

Filter: High Pass

Filter Type: Gauss Spline

Filter Window Size: 3

Filter Trim: Off

Filter Low wavelength: 800 μm

Min Area Size: 0

Remove spikes: On

Spike Height (xRMS): 2.5

Low wavelength corresponds to the cutoff value kc in the roughness parameter.

(Calculation Procedure for AM1 and AM2)

The "Save Data" button was displayed on the Surface Map screen, and the analyzed three-dimensional curved surface roughness data was saved in the "XYZ File (*.xyz)" format. Next, exporting was performed in Excel (R) of Microsoft Corporation to obtain a two-dimensional function h(x,y) of elevation. The number of obtained raw data was 992 rows in length×992 columns in width=984064 points, and the length of one side (MΔx or NΔy) was 218 μm, but by repeating deletion of the outer peripheral data 41 times, data of 910 rows in length×910 columns in width=828100 points, and in which the length of one side was 200 μm, was obtained. Next, using statistical analysis software R (ver 3.6.3), one-dimensional amplitude spectrum Hx'(fx) and Hy'(fy) of the elevation of each row and each column in the two-dimensional function of the elevation (910 rows in length×910 columns in width) were calculated, and the values of the amplitudes corresponding to the values of the respective spatial frequency were averaged to obtain a one-dimensional amplitude spectrum H"(f) of the elevation. The one-dimensional function H"(f) of the elevation was measured with respect to the surface at sixteen points for each sample, and the result of averaging the amplitude values corresponding to the respective spatial frequency values was the one-dimensional amplitude spectrum H(f) of elevation.

Then, from the obtained data, AM2 was extracted and AM1 was calculated. Further, the values of the amplitude corresponding to the spatial frequency of $0.005\ \mu m^{-1}$, AM1-1, the amplitude corresponding to the spatial frequency of $0.010\ \mu m^{-1}$, AM1-2, and the amplitude corresponding to the spatial frequency of $0.015\ \mu m^{-1}$, AM1-3, are shown in Table 1.

FIGS. 6 to 18 show the discrete function H(f) of the amplitude spectrum of the elevation of the uneven surface of the anti-glare films of Examples 1-1 to 1-7 and Comparative Examples 1-1 to 1-6. In the figures, the horizontal axis represents the spatial frequency (unit: "$\mu m^{-1}$"), and the vertical axis represents the amplitude (unit: "μm").

1-2. Total Light Transmittance (Tt) and Haze (Hz)

The anti-glare films of Examples and Comparative Examples were cut into pieces of 10 cm squares. The cutting site was selected from random sites after visually confirming that there were no abnormal points such as dust and scratches. The total light transmittance of JIS K7361-1:1997 and the haze of JIS K7136:2000 of each sample were measured using a haze meter (HM-150, manufactured by Murakami Color Research Laboratory Co., Ltd.).

In order to stabilize the light source, the power switch of the apparatus was turned on in advance, and then the apparatus was allowed to stand for 15 minutes or more, and then, calibration was performed without setting anything in the inlet opening, and then a measurement sample was set in the inlet opening and measurement was performed. The light incident surface was on the side of the transparent substrate.

1-3. Anti-Glare Properties 1 (Anti-Glare Properties in Specular Reflection Direction)

The anti-glare films of Examples and Comparative Examples were cut into pieces of 10 cm×10 cm. The cutting site was selected from random sites after visually confirming that there were no abnormal points such as dust and scratches. The transparent substrate side of the cut anti-glare film was bonded to a black plate (Kuraray Co., Ltd., trade name: Comoglass DFA2CG 502K (black) Series, thickness 2 mm) having a size of vertical 10 cm×horizontal 10 cm through an optically transparent adhesive sheet (trade name: Panaclean PD-S1, thickness 25 μm) manufactured by Panac Co., Ltd. to produce a sample 2.

The sample 2 was placed on a horizontal table with a height of 70 cm so that the uneven surfaces faced upward, and reflection of illumination light on the uneven surfaces was evaluated in a bright room environment from an angle in the specular reflection direction of the illumination light according to the following evaluation criteria. During the evaluation, the position of the sample 2 with respect to the illumination was adjusted so that the incident angle of the light emitted from the center of the illumination with respect to the sample 2 was 10 degrees. A Hf32 type straight tube three-wavelength neutral white fluorescent lamp was used as illumination, and the position of the illumination was 2 m above the horizontal table in the vertical direction. Further, the evaluation was carried out in a range where the illuminance on the uneven surface of the sample was 500 lux or more and 1000 lux or less. The position of the eyes of observer was about 160 cm from the floor. Observers were healthy people in their thirties with visual acuity of 0.7 or better.

<Evaluation Criteria>

A: There is no outline of illumination, and position is not visible.

B: There is no outline of illumination, but position is vaguely visible.

C: Outline and position of illumination are vaguely visible.

D: Outline of illumination is less blurred, and position is clearly visible.

1-4. Anti-Glare Properties 2 (Anti-Glare Properties at Various Angles)

The sample 2 produced in 1-3 was held with both hands, and the reflection of the illumination light on the uneven surface was evaluated in the same manner as in 1-3 except that the evaluation was performed while changing the height and angle of the sample 2. The change of the angle described above was performed within a range in which the incident angle of the light emitted from the center of the illumination with respect to the sample 2 was 10 degrees or more and 70 degrees or less.

1-5. Reflected Scattered Light (Jet-Black Appearance)

The sample 2 prepared in 1-3 was placed on a horizontal table with a height of 70 cm with the uneven surface facing upward. The position of the sample 2 with respect to the illumination was adjusted so that the light having the strongest emission angle among the light emitted from the illumination did not just barely enter the sample 2. By the above-described adjustment, the position of the sample with respect to the observer is arranged on the side farther from the observer than the position of the sample 1-3.

Sample 2 was arranged at the position described above, and the degree of reflected scattered light was evaluated according to the following evaluation criteria. The line of sight of the observer was about 160 cm from the floor. Observers were healthy people in their thirties with visual acuity of 0.7 or better.

<Evaluation Criteria>

A: Sufficiently black with no sense of whiteness of scattered light

B: Slight whiteness of scattered light is felt, but not bothersome

C: Whiteness of scattered light is felt at a worrisome level

1-6. Surface Shape Measurement

Using a white light interferometry microscope (Zygo Corporation, New View7300), the sample 1 prepared in 1-1 was set on a measurement stage so as to be fixed and in close contact with the measurement stage, and then the surface shape of the anti-glare film was measured and analyzed. The measurement conditions and analysis conditions were the same as measurement condition 1 and analysis condition 1 in 1-1. Microscope Application of MetroPro ver 9.0.10 (64-bit) was used as measurement/analysis software. Examples 1-6 and 1-7 and Comparative Examples 1-3 and 1-6 were excluded from the measurement of the surface shape.

"Ra", "SRz", and "Rsk" were displayed on the Surface Map screen above, and the respective numerical values were defined as Sa, Sz, and Ssk for each measurement region.

Next, the "Save Data" button was displayed on the Surface Map screen, and the analyzed three-dimensional curved surface roughness data was saved. Then, in Advanced Texture Application, the saved data was read and the following analysis condition 2 was applied.

(Analysis Condition 2)

High FFT Filter: off
    Low FFT Filter: off
    Calc High Frequency: On
    Calc Low Frequency: On
    Filter Trim: On
    Remove spikes: Off
    Spike Height (xRMS): 5.00
    Noise Filter Size: 0
    Noise Filter Type: 2 Sigma
    Fill Data: Off
    Data Fill Max: 25
    Trim: 0
    Trim Mode: All
    Remove Plane
    Reference Band: 0 μm
    Mim Peaks/Valleys Area: 0 μm$^2$
    Max Peaks/Valleys Area: 0 μm$^2$ Next, a "Peaks/Valleys" screen was displayed, and analysis was performed in "Reference Band: 0 μm", "Mim Peaks/Valleys Area: 0 μm$^2$", and "Max Peaks/Valleys Area: 0 μm$^2$", and the numerical value displayed in "Peak Spacing" was set as Smp of each measurement region.

Next, a Slope Mag Map screen was displayed by the analysis software (MetroPro ver 9.0.10 (64-bit) Microscope Application), a histogram was displayed on the screen with the horizontal axis as Value (μm/mm) and the vertical axis as Counts, and the histogram data of the three-dimensional surface inclination angle distribution was obtained by converting the horizontal axis into an angle by the arctangent. In each measurement sample, adjustment was performed by changing the numerical value of nBins so that an angular distribution histogram in which each class interval of the angular distribution after conversion was equal to or less than 1 degree was obtained. Based on the obtained histogram data, an inclination angle (θ1) of more than 0 degrees and less than 1 degree, an inclination angle (θ2) of 1 degree or more and less than 3 degrees, an inclination angle (θ3) of 3 degrees or more and less than 10 degrees, and an inclination angle (θ4) of 10 degrees or more and less than 90 degrees were calculated.

2. Production of Anti-Glare Film

Example 1-1

An anti-glare layer-coating liquid 1 having the following formulation was applied onto a transparent substrate (thickness 80 μm, triacetyl cellulose resin film (TAC), Fujifilm Corporation, TD80UL), dried at 70° C. and a wind velocity of 5 m/s for 30 seconds, and then irradiated with ultraviolet rays in a nitrogen gas atmosphere having an oxygen concentration of 200 ppm or less so that the integrated light quantity became 100 mJ/cm$^2$ to form an anti-glare layer, thereby obtaining an anti-glare film of Example 1-1. The thickness of the anti-glare layer was 5.0 μm. Ra on the side opposite to the anti-glare layer of the anti-glare film was 0.012 μm.

<Anti-Glare Layer-Coating Liquid 1>

Pentaerythritol triacrylate 58.2 parts
(Nippon Kayaku Co., Ltd., trade name: KAYARAD-PET-30)
    Urethane acrylate oligomer 18.2 parts
(DIC Corporation, trade name: V-4000BA)
    Thermoplastic resin 23.6 parts
(acrylic polymer, Mitsubishi Rayon Co., Ltd., molecular weight 75,000)
    Organic particles 63.6 parts
(Sekisui Plastics Co., Ltd., spherical polyacrylic-styrene copolymer)
(average particle size 2.0 μm, refractive index 1.515)
(ratio of particles with a particle size of 1.8 μm or more and 2.2 μm or less is 90% or more)
    Inorganic fine particle dispersion 230 parts
(Nissan Chemical Industries, Ltd., silica having a reactive functional group introduced on its surface, solvent: MIBK, solid content: 35.5%)
(average particle size 12 nm)
(active ingredient of inorganic fine particles: 81.9 parts)
    Photopolymerization initiator 5.5 parts
(IGM Resins B.V., trade name: Omnirad184)
    Photopolymerization initiator 1.8 parts
(IGM Resins B.V., trade name: Omnirad907)
    Silicone leveling agent 0.2 parts
(Momentive Performance Materials, trade name: TSF4460)
    Solvent (toluene) 346.8 parts
    Solvent (cyclohexanone) 17.9 parts

Examples 1-2 to 1-7, Comparative Examples 1-1 to 1-6

Anti-glare films of Examples 1-2 to 1-7 and Comparative Examples 1-1 to 1-6 were obtained in the same manner as in Example 1-1, except that anti-glare layer-coating liquid 1 was changed to an anti-glare coating liquid with the number listed in Table 1. The compositions of anti-glare layer-coating liquids 2 to 13 are shown below.

The anti-glare layer-coating liquids 1 to 13 may also be used in Examples of the second and third embodiments.

<Anti-Glare Layer-Coating Liquid 2>

A coating liquid having the same composition as the anti-glare layer-coating liquid 1 except that the organic particles in the anti-glare layer-coating liquid 1 were changed to organic particles having "an average particle size of 4.0 µm and a refractive index of 1.515 (Sekisui Plastics Co., Ltd., spherical polyacrylic-styrene copolymer, the ratio of particles with a particle size of 3.8 µm or more and 4.2 µm or less is 90% or more)".

<Anti-Glare Layer-Coating Liquid 3>
Pentaerythritol triacrylate 100 parts
(Nippon Kayaku Co., Ltd., trade name: KAYARAD-PET-30)
Organic particles 129.8 parts
(Sekisui Plastics Co., Ltd., spherical polyacrylic-styrene copolymer)
(average particle size 2.0 µm, refractive index 1.515)
(ratio of particles with a particle size of 1.8 µm or more and 2.2 µm or less is 90% or more)
Photopolymerization initiator 6.4 parts
(IGM Resins B.V., trade name: Omnirad184)
Photopolymerization initiator 1.0 parts
(IGM Resins B.V., trade name: Omnirad907)
Silicone leveling agent 0.1 parts
(Momentive Performance Materials, trade name: TSF4460)
Solvent (toluene) 498.4 parts
Solvent (cyclohexanone) 55.4 parts <Anti-Glare Layer-Coating Liquid 4>
Pentaerythritol triacrylate 100 parts
(Nippon Kayaku Co., Ltd., trade name: KAYARAD-PET-30)
Organic particles 99.6 parts
(Sekisui Plastics Co., Ltd., spherical polyacrylic-styrene copolymer)
(average particle size 2.0 µm, refractive index 1.515)
(ratio of particles with a particle size of 1.8 µm or more and 2.2 µm or less is 90% or more)
Silica particles 10 parts
(average particle size: 4.1 µm)
(manufactured by Fuji Silysia Chemical Ltd., gel method amorphous silica)
Photopolymerization initiator 6.1 parts
(IGM Resins B.V., trade name: Omnirad184)
Photopolymerization initiator 1.1 parts
(IGM Resins B.V., trade name: Omnirad907)
Solvent (toluene) 452.9 parts
Solvent (cyclohexanone) 50.3 parts
Solvent (ethyl acetate) 2.6 parts <Anti-Glare Layer-Coating Liquid 5>
A coating liquid having the same composition as the anti-glare layer-coating liquid 1 except that in the anti-glare layer-coating liquid 1, the addition amount of the organic particles was changed from 63.6 parts to 50.0 parts and the addition amount of the inorganic fine particle dispersion was changed from 230 parts to 187 parts.

<Anti-Glare Layer-Coating Liquid 6>
Pentaerythritol triacrylate 100 parts
(Nippon Kayaku Co., Ltd., trade name: KAYARAD-PET-30)
Silica particles 14 parts
(average particle size: 4.1 µm)
(manufactured by Fuji Silysia Chemical Ltd., gel method amorphous silica)

Photopolymerization initiator 5 parts
(IGM Resins B.V., trade name: Omnirad184)
Silicone leveling agent 0.2 parts
(Momentive Performance Materials, trade name: TSF4460)
Solvent (toluene) 150 parts
Solvent (MIBK) 35 parts
Solvent (ethyl acetate) 5.2 parts <Anti-Glare Layer-Coating Liquid 7>
Pentaerythritol triacrylate 65 parts
(Nippon Kayaku Co., Ltd., trade name: KAYARAD-PET-30)
Urethane acrylate oligomer 35 parts
(DIC Corporation, trade name: V-4000BA)
Organic particles 14 parts
(Sekisui Plastics Co., Ltd., spherical polyacrylic-styrene copolymer)
(average particle size 3.5 µm, refractive index 1.550)
Silica particles 6 parts
(average particle size: 12 nm)
(Nippon Aerosil Co., Ltd., fumed silica)
Photopolymerization initiator 5 parts
(IGM Resins B.V., trade name: Omnirad184)
Silicone leveling agent 0.025 parts
(Momentive Performance Materials, trade name: TSF4460)
Solvent (toluene) 100 parts
Solvent (cyclohexanone) 20 parts
Solvent (isopropyl alcohol) 55 parts <Anti-Glare Layer-Coating Liquid 8>
Pentaerythritol triacrylate 33 parts
(Nippon Kayaku Co., Ltd., trade name: KAYARAD-PET-30)
isocyanuric acid EO-modified triacrylate 52 parts
(Toagosei Co., Ltd., trade name: M-313)
Thermoplastic resin 15 parts
(acrylic polymer, Mitsubishi Rayon Co., Ltd., molecular weight 75,000)
Organic particles 16 parts
(Sekisui Plastics Co., Ltd., spherical polyacrylic-styrene copolymer)
(average particle size 3.5 µm, refractive index 1.555)
(ratio of particles with a particle size of 3.2 µm or more and 3.8 µm or less is 90% or more)
Inorganic fine particle dispersion 158 parts
(Nissan Chemical Industries, Ltd., silica having a reactive functional group introduced on its surface, solvent: MIBK, solid content: 40%)
(average particle size: 12 nm)
Photopolymerization initiator 5 parts
(IGM Resins B.V., trade name: Omnirad184)
Silicone leveling agent 0.20 parts
(Momentive Performance Materials, trade name: TSF4460)
Solvent (toluene) 211 parts
Solvent (propylene glycol monomethyl ether acetate) 165 parts <Anti-Glare Layer-Coating Liquid 9>
Pentaerythritol triacrylate 91.5 parts
(Nippon Kayaku Co., Ltd., trade name: KAYARAD-PET-30)
Urethane acrylate oligomer 8.5 parts
(DIC Corporation, trade name: V-4000BA)
Organic particles 2 parts
(manufactured by Sekisui Plastics Co., Ltd., spherical polyacrylic-styrene copolymer)
(average particle size 5.0 µm, refractive index 1.550)
Silica particles 15 parts (average particle size: 4.1 μm)
(manufactured by Fuji Silysia Chemical Ltd., gel method amorphous silica)

Photopolymerization initiator 1.9 parts
(IGM Resins B.V., trade name: Omnirad184)

Photopolymerization initiator 7 parts
(IGM Resins B.V., trade name: Omnirad907)

Silicone leveling agent 0.1 parts
(Momentive Performance Materials, trade name: TSF4460)

Solvent (toluene) 161.1 parts

Solvent (cyclohexanone) 69 parts

Solvent (ethyl acetate) 3.9 parts

<Anti-glare layer-coating liquid 10>

Pentaerythritol triacrylate 50.6 parts
(Nippon Kayaku Co., Ltd., trade name: KAYARAD-PET-30)

Urethane acrylate oligomer 49.4 parts
(DIC Corporation, trade name: V-4000BA)

Organic particles 3 parts
(Sekisui Plastics Co., Ltd., spherical polyacrylic-styrene copolymer)
(average particle size 2.0 μm, refractive index 1.545)

Silica particles 1 part
(average particle size: 12 nm
(Nippon Aerosil Co., Ltd., fumed silica)

Photopolymerization initiator 1 part (IGM Resins B.V., trade name: Omnirad184)

Photopolymerization initiator 0.2 parts
(IGM Resins B.V., trade name: Omnirad907)

Photopolymerization initiator 1.5 parts
(Lamberti, ESACURE ONE)

Silicone leveling agent 0.1 parts
(Momentive Performance Materials, trade name: TSF4460)

Solvent (toluene) 98.6 parts

Solvent (cyclohexanone) 38.7 parts

Solvent (isopropyl alcohol) 44.1 parts

Solvent (MIBK) 2.4 parts

<Anti-Glare Layer-Coating Liquid 11>

A coating liquid having the same composition as the anti-glare layer coating liquid 1 except that the amount of the organic particles added in the anti-glare layer-coating liquid 3 was changed to 300 parts.

<Anti-Glare Layer-Coating Liquid 12>

A coating liquid having the same composition as the anti-glare layer-coating liquid 3 except that the average particle size of the organic particles of the anti-glare layer-coating liquid 3 was changed to 3.5 m.

<Anti-Glare Layer-Coating Liquid 13>

A coating liquid having the same composition as that of the anti-glare layer-coating liquid 3 except that the average particle size of the organic particles in the anti-glare layer-coating liquid 3 was changed to 1.5 m and the addition amount of the organic particles in the anti-glare layer-coating liquid 3 was changed to 160 parts.

TABLE 1

| | No. of anti-glare layer-coating liquid | AM1-1 [μm] | AM1-2 [μm] | AM1-3 [μm] | AM1 [μm] | AM2 [μm] | AM1/ AM2 | Tt (%) | Hz (%) | Anti-glare property 1 | Anti-glare property 2 | Reflected scattered light |
|---|---|---|---|---|---|---|---|---|---|---|---|---|
| Example 1-1 | 1 | 0.0666 | 0.0657 | 0.0668 | 0.1991 | 0.01435 | 13.87 | 91.0 | 84.0 | A | A | B |
| Example 1-2 | 2 | 0.1150 | 0.1198 | 0.1182 | 0.3530 | 0.01016 | 34.74 | 89.2 | 74.5 | B | B | B |
| Example 1-3 | 3 | 0.0635 | 0.0573 | 0.0637 | 0.1845 | 0.02454 | 7.52 | 80.7 | 91.3 | B | B | A |
| Example 1-4 | 4 | 0.0639 | 0.0629 | 0.0602 | 0.1870 | 0.03436 | 5.44 | 72.0 | 96.3 | A | A | A |
| Example 1-5 | 5 | 0.0556 | 0.0672 | 0.0621 | 0.1849 | 0.01210 | 15.29 | 91.4 | 69.7 | B | B | B |
| Example 1-6 | 12 | 0.1354 | 0.1329 | 0.1173 | 0.3856 | 0.00660 | 58.42 | 70.1 | 97.1 | A | A | B |
| Example 1-7 | 13 | 0.0515 | 0.0444 | 0.0474 | 0.1434 | 0.01646 | 8.71 | 91.1 | 72.5 | B | B | B |
| Comparative Example 1-1 | 6 | 0.1505 | 0.1259 | 0.1364 | 0.4128 | 0.00284 | 145.14 | 90.7 | 22.5 | B | B | C |
| Comparative Example 1-2 | 7 | 0.0524 | 0.0460 | 0.0489 | 0.1474 | 0.00099 | 148.86 | 90.7 | 24.7 | C | C | B |
| Comparative Example 1-3 | 8 | 0.0464 | 0.0525 | 0.0471 | 0.1460 | 0.00202 | 72.43 | 91.2 | 24.7 | C | C | B |
| Comparative Example 1-4 | 9 | 0.1491 | 0.1416 | 0.1166 | 0.4073 | 0.00422 | 96.56 | 90.5 | 42.1 | B | B | C |
| Comparative Example 1-5 | 10 | 0.0277 | 0.0185 | 0.0148 | 0.0610 | 0.00031 | 195.22 | 91.8 | 3.5 | D | D | A |
| Comparative Example 1-6 | 11 | 0.1296 | 0.1442 | 0.1357 | 0.4096 | 0.05829 | 7.03 | 69.1 | 98.0 | A | A | C |

TABLE 2

| | Sa [μm] | Smp [μm] | Sa/ Smp | Sz [μm] | Sz/ Sa | Ssk | θ1 | θ2 | θ3 | θ4 |
|---|---|---|---|---|---|---|---|---|---|---|
| | | | | | | | Inclination angle distribution (%) | | | |
| Example 1-1 | 0.399 | 3.263 | 0.122 | 2.490 | 6.24 | 0.343 | 0.5 | 3.7 | 27.0 | 68.8 |
| Example 1-2 | 0.612 | 8.228 | 0.071 | 3.560 | 5.82 | −0.296 | 1.0 | 6.7 | 27.4 | 64.9 |
| Example 1-3 | 0.497 | 3.447 | 0.144 | 3.110 | 6.26 | −0.601 | 0.6 | 4.1 | 16.4 | 78.9 |
| Example 1-4 | 0.569 | 2.524 | 0.225 | 3.930 | 6.91 | −0.375 | 0.4 | 2.8 | 13.5 | 83.3 |

TABLE 2-continued

| | Sa | Smp | Sa/ | Sz | Sz/ | | Inclination angle distribution (%) | | | |
| --- | --- | --- | --- | --- | --- | --- | --- | --- | --- | --- |
| | [μm] | [μm] | Smp | [μm] | Sa | Ssk | θ1 | θ2 | θ3 | θ4 |
| Example 1-5 | 0.352 | 2.963 | 0.119 | 2.440 | 6.93 | 0.542 | 0.8 | 5.6 | 31.6 | 62.0 |
| Comparative Example 1-1 | 0.374 | 16.973 | 0.022 | 1.620 | 4.33 | 0.991 | 6.4 | 31.5 | 49.1 | 13.0 |
| Comparative Example 1-2 | 0.149 | 17.672 | 0.008 | 0.670 | 4.50 | 1.402 | 16.2 | 46.4 | 36.1 | 1.3 |
| Comparative Example 1-4 | 0.457 | 10.551 | 0.043 | 2.270 | 4.97 | 1.158 | 2.8 | 17.4 | 51.6 | 28.2 |
| Comparative Example 1-5 | 0.059 | 23.511 | 0.003 | 0.180 | 3.05 | 0.904 | 74.5 | 24.6 | 0.9 | 0 |

From the results in Table 1, it can be confirmed that the anti-glare film of the first embodiment has excellent anti-glare properties, suppresses reflected scattered light, and has an excellent jet-black appearance.

Example and Comparative Example of Second Embodiment

3. Measurement and Evaluation

The measurement and evaluation of the anti-glare films of Examples and Comparative Examples were performed as described below. The atmosphere during each measurement and evaluation was set at a temperature of 23±5° C. and a humidity of 40% or more and 65% or less. In addition, before starting each measurement and evaluation, the target sample was exposed to the atmosphere for 30 minutes or more, and then the measurement and evaluation were performed. The results are shown in Tables 3 to 5.

3-1. Measurement of Reflected Light Intensity

The reflected light intensity of the anti-glare films of Examples and Comparative Examples was measured by the following steps, and the smoothed reflected light intensity was calculated. Table 3 shows the maximum absolute value of the difference under condition 1 and the values under conditions 2 and 3. FIGS. 22 to 30 show the smoothed reflected light intensity for each angle of the anti-glare films of Examples and Comparative Examples. The horizontal axis is the light receiving angle (degrees), and the vertical axis is the smoothed reflected light intensity (logarithmic scale).

(0) In a goniophotometer (trade name "GC5000 L" manufactured by Nippon Denshoku Industries Co., Ltd., beam size: approximately 3 mm, inclination angle in beam: 0.8 degrees or less, aperture angle of light receiver: 1 degree), after turning on the power switch of the device beforehand to stabilize the light source and waiting for more than 20 minutes, zero adjustment was performed. Zero adjustment was carried out by setting a zero cap on the sample table of the goniophotometer and pressing the "zero adjustment" button on the attached software with light irradiation at 45 degrees.

(1) In a transmission measurement mode of a goniophotometer (1000-fold photosensitivity), a visible light beam was emitted as a parallel light beam from a light source of the goniophotometer, an intensity of the emitted light was measured at an aperture angle of 1 degree without passing through a sample, and standardization was performed so that the maximum intensity was 100,000;

(2) Next, a black plate (Kuraray Co., Ltd., trade name: Comoglass DFA2CG 502K (black) Series, thickness 2 mm) was bonded to the surfaces of the anti-glare films of Examples and Comparative Examples opposite to the uneven surfaces via a transparent adhesive layer (Panac Co., Ltd., trade name: Panaclean PD-S1) having a thickness of 25 μm to produce a sample α of 10 cm×10 cm. The sample α had an anti-glare film, a transparent adhesive layer, and a black plate in this order, and had an uneven surface. The uneven surface of the sample α is the uneven surface of the anti-glare film.

(3) the sample α was placed in the goniophotometer, and a visible light beam was irradiated as a parallel light beam from the light source of the goniophotometer on the uneven surface of the sample α, and a reflected light intensity was measured at an aperture angle of 1 degree, wherein an irradiation angle of the parallel light beam was set to a direction inclined by +45 degrees from a normal direction of the sample α, the reflected light intensity was measured at intervals of 1 degree from 0 degrees, which is the normal direction of the sample α, to −85 degrees, and in order to maintain effects of standardization in (1), the reflected light intensity was measured in the transmission measurement mode.

(4) A smoothing process represented by the following formula (i) was performed at each angle from 0 degrees to −85 degrees, and the reflected light intensity after the smoothing process was calculated as the smoothed reflected light intensity at each angle:

$$n\text{-degree smoothed reflected light intensity} = ([n\text{−}2\text{-degree reflected light intensity}] + [n\text{−}1\text{-degree reflected light intensity}] + [n\text{-degree reflected light intensity}] + [n\text{+}1\text{-degree reflected light intensity}] + [n\text{+}2\text{-degree reflected light intensity}])/5 \quad (i)$$

3-2. Surface Shape Measurement

The surface shapes of the anti-glare films of Examples and Comparative Examples were measured by the same method as in 1-6 above, and Sa, Sz, Ssk, Smp, and θ1 to θ4 were calculated.

3-3. Total Light Transmittance (Tt) and Haze (Hz)

The total light transmittance and haze of the anti-glare films of Examples and Comparative Examples were measured in the same manner as in 1-2 above.

3-4. Anti-Glare Properties 1 (Anti-Glare Properties in Specular Reflection Direction)

The anti-glare properties in the specular reflection direction of the anti-glare films of Examples and Comparative Examples were evaluated in the same manner as in 1-3 above.

3-5. Anti-Glare Properties 2 (Anti-Glare Properties at Various Angles)

Anti-glare properties at various angles of the anti-glare films of Examples and Comparative Examples were evaluated in the same manner as in 1-4 above.

3-6. Reflected Scattered Light (≈Jet-Black Appearance)

Reflected scattered light of the anti-glare films of Examples and Comparative Examples was evaluated by the same method as in 1-5 above.

3-7. Measurement of AM1 and AM2

AM1 and AM2 of the anti-glare films of Examples and Comparative Examples were measured in the same manner as in 1-1 above.

4. Production of Anti-Glare Film

Example 2-1

An anti-glare layer-coating liquid 1 having the above formulation was applied onto a transparent substrate (thickness 80 μm, triacetyl cellulose resin film (TAC), Fujifilm Corporation, TD80UL), dried at 70° C. and a wind velocity of 5 m/s for 30 seconds, and then irradiated with ultraviolet rays in a nitrogen gas atmosphere having an oxygen concentration of 200 ppm or less so that the integrated light quantity became 100 mJ/cm$^2$ to form an anti-glare layer, thereby obtaining an anti-glare film of Example 2-1. The thickness of the anti-glare layer was 5.0 μm. Ra on the side opposite to the anti-glare layer of the anti-glare film was 0.012 μm.

Examples 2-2 to 2-5, Comparative Examples 2-1 to 2-4

Anti-glare films of Examples 2-2 to 2-5 and Comparative Examples 2-1 to 2-4 were obtained in the same manner as in Example 2-1, except that anti-glare layer-coating liquid 1 was changed to an anti-glare coating liquid with the number listed in Table 3.

TABLE 3

| | No. of anti-glare layer-coating liquid | Smoothed reflected light intensity | | | | | |
| | | Condition 1: maximum absolute value of difference | Condition 2: value at −35 degrees | Condition 3: value at −45 degrees | Anti-glare property 1 | Anti-glare property 2 | Reflected scattered light |
| --- | --- | --- | --- | --- | --- | --- | --- |
| Example 2-1 | 1 | 0.077 | 0.954 | 1.200 | A | A | B |
| Example 2-2 | 2 | 0.165 | 1.705 | 3.069 | B | B | B |
| Example 2-3 | 3 | 0.514 | 0.287 | 1.123 | B | B | A |
| Example 2-4 | 4 | 0.026 | 0.147 | 0.164 | A | A | A |
| Example 2-5 | 5 | 0.098 | 1.666 | 2.262 | B | B | B |
| Comparative Example 2-1 | 6 | 4.423 | 4.660 | 33.070 | B | B | C |
| Comparative Example 2-2 | 9 | 1.100 | 4.378 | 12.733 | B | B | C |
| Comparative Example 2-3 | 10 | 209.014 | 0.211 | 308.023 | D | D | A |
| Comparative Example 2-4 | 7 | 21.897 | 3.078 | 91.338 | C | C | B |

TABLE 4

| | Sa | Smp | Sa/ | Sz | Sz/ | | Inclination angle distribution (%) | | | |
| | [μm] | [μm] | Smp | [μm] | Sa | Ssk | θ1 | θ2 | θ3 | θ4 |
| --- | --- | --- | --- | --- | --- | --- | --- | --- | --- | --- |
| Example 2-1 | 0.399 | 3.263 | 0.122 | 2.490 | 6.24 | 0.343 | 0.5 | 3.7 | 27.0 | 68.8 |
| Example 2-2 | 0.612 | 8.228 | 0.071 | 3.560 | 5.82 | −0.296 | 1.0 | 6.7 | 27.4 | 64.9 |
| Example 2-3 | 0.497 | 3.447 | 0.144 | 3.110 | 6.26 | −0.601 | 0.6 | 4.1 | 16.4 | 78.9 |
| Example 2-4 | 0.569 | 2.524 | 0.225 | 3.930 | 6.91 | −0.375 | 0.4 | 2.8 | 13.5 | 83.3 |
| Example 2-5 | 0.352 | 2.963 | 0.119 | 2.440 | 6.93 | 0.542 | 0.8 | 5.6 | 31.6 | 62.0 |
| Comparative Example 2-1 | 0.374 | 16.973 | 0.022 | 1.620 | 4.33 | 0.991 | 6.4 | 31.5 | 49.1 | 13.0 |
| Comparative Example 2-2 | 0.457 | 10.551 | 0.043 | 2.270 | 4.97 | 1.158 | 2.8 | 17.4 | 51.6 | 28.2 |
| Comparative Example 2-3 | 0.059 | 23.511 | 0.003 | 0.180 | 3.05 | 0.904 | 74.5 | 24.6 | 0.9 | 0 |
| Comparative Example 2-4 | 0.149 | 17.672 | 0.008 | 0.670 | 4.50 | 1.402 | 16.2 | 46.4 | 36.1 | 1 |

TABLE 5

|  | AM1-1 [μm] | AM1-2 [μm] | AM1-3 [μm] | AM1 [μm] | AM2 [μm] | AM1/ AM2 | Tt (%) | Hz (%) |
|---|---|---|---|---|---|---|---|---|
| Example 2-1 | 0.0666 | 0.0657 | 0.0668 | 0.1991 | 0.0143 | 13.87 | 91.0 | 84.0 |
| Example 2-2 | 0.1150 | 0.1198 | 0.1182 | 0.3530 | 0.0102 | 34.74 | 89.2 | 74.5 |
| Example 2-3 | 0.0635 | 0.0573 | 0.0637 | 0.1845 | 0.0245 | 7.52 | 80.7 | 91.3 |
| Example 2-4 | 0.0639 | 0.0629 | 0.0602 | 0.1870 | 0.0344 | 5.44 | 72.0 | 96.3 |
| Example 2-5 | 0.0556 | 0.0672 | 0.0621 | 0.1849 | 0.0121 | 15.29 | 91.4 | 69.7 |
| Comparative Example 2-1 | 0.1505 | 0.1259 | 0.1364 | 0.4128 | 0.0028 | 145.14 | 90.7 | 22.5 |
| Comparative Example 2-2 | 0.1491 | 0.1416 | 0.1166 | 0.4073 | 0.0042 | 96.56 | 90.5 | 42.1 |
| Comparative Example 2-3 | 0.0277 | 0.0185 | 0.0148 | 0.0610 | 0.0003 | 195.22 | 91.8 | 3.5 |
| Comparative Example 2-4 | 0.0524 | 0.0460 | 0.0489 | 0.1474 | 0.0010 | 148.86 | 90.7 | 24.7 |

From the results in Table 3, it can be confirmed that the anti-glare film of the second embodiment has excellent anti-glare properties, suppresses reflected scattered light, and has an excellent jet-black appearance.

Example and Comparative Example of Third Embodiment

5. Measurement and Evaluation

The anti-glare films of Examples and Comparative Examples were measured and evaluated as follows. The atmosphere during each measurement and evaluation was set at a temperature of $23\pm5°$ C. and a humidity of 40% or more and 65% or less. In addition, before starting each measurement and evaluation, the target sample was exposed to the atmosphere for 30 minutes or more, and then the measurement and evaluation were performed. The results are shown in Tables 6 to 7.

5-1. Surface Shape Measurement

The surface shapes of the anti-glare films of Examples and Comparative Examples were measured by the same method as in 1-6 above, and Sa, Sz, Ssk, Smp, and θ1 to θ4 were calculated.

5-2. Total Light Transmittance (Tt) and Haze (Hz)

The total light transmittance and haze of the anti-glare films of Examples and Comparative Examples were measured in the same manner as in 1-2 above.

5-3. Anti-Glare Properties 1 (Anti-Glare in Specular Reflection Direction)

The anti-glare properties in the specular reflection direction of the anti-glare films of Examples and Comparative Examples were evaluated in the same manner as in 1-3 above.

5-4. Anti-Glare Properties 2 (Anti-Glare Properties at Various Angles)

Anti-glare properties at various angles of the anti-glare films of Examples and Comparative Examples was evaluated by the same method as in 1-4 above.

5-5. Reflected Scattered Light (≈Jet-Black Appearance)

Reflected scattered light of the anti-glare films of Examples and Comparative Examples was evaluated by the same method as in 1-5 above.

5-6. Measurement of AM1 and AM2

AM1 and AM2 of the anti-glare films of Examples and Comparative Examples were measured in the same manner as in 1-1 above. Comparative Examples 3-5 and 3-6 were excluded from the measurement of AM1 and AM2.

6. Production of Anti-Glare Film

Example 3-1

An anti-glare layer-coating liquid 1 having the above formulation was applied onto a transparent substrate (thickness 80 μm, triacetyl cellulose resin film (TAC), Fujifilm Corporation, TD80UL), dried at 70° C. and a wind velocity of 5 m/s for 30 seconds, and then irradiated with ultraviolet rays in a nitrogen gas atmosphere having an oxygen concentration of 200 ppm or less so that the integrated light quantity became 100 mJ/cm² to form an anti-glare layer, thereby obtaining an anti-glare film of Example 3-1. The thickness of the anti-glare layer was 5.0 μm. Ra on the side opposite to the anti-glare layer of the anti-glare film was 0.012 μm.

Examples 3-2 to 3-7, Comparative Examples 3-1 to 3-6

Anti-glare films of Examples 3-2 to 3-7 and Comparative Examples 3-1 to 3-6 were obtained in the same manner as in Example 3-1, except that anti-glare layer-coating liquid 1 was changed to an anti-glare coating liquid with the number listed in Table 6. The compositions of anti-glare layer-coating liquids 14 and 15 are shown below.
<Anti-Glare Layer-Coating Liquid 14>
A coating liquid having the same composition as that of the anti-glare layer-coating liquid 3 except that the average particle size of the organic particles in the anti-glare layer-coating liquid 3 was changed to 3.5 μm and the addition amount of the organic particles in the anti-glare layer-coating liquid 3 was changed to 160 parts.

<Anti-Glare Layer-Coating Liquid 15>

A coating liquid having the same composition as that of the anti-glare layer-coating liquid 3 except that the average particle size of the organic particles in the anti-glare layer-coating liquid 3 was changed to 1.0 μm and the addition amount of the organic particles in the anti-glare layer-coating liquid 3 was changed to 160 parts.

The invention claimed is:

1. An anti-glare film comprising an anti-glare layer, the anti-glare film having an uneven surface, wherein the uneven surface has a three-dimensional arithmetic mean roughness Sa of 0.30 μm or more, a three-dimensional mean peak interval Smp of 2.524 or more and 8.228 μm or less, and Sa/Smp is 0.05 or more and 0.40 or less.

TABLE 6

| | No. of anti-glare layer-coating liquid | Sa [μm] | Smp [μm] | Sa/Smp | Sz [μm] | Sz/Sa | Ssk | Inclination angle distribution (%) | | | | Tt (%) | Hz (%) | Anti-glare prop-erty 1 | Anti-glare prop-erty 2 | Reflected scattered light |
|---|---|---|---|---|---|---|---|---|---|---|---|---|---|---|---|---|
| | | | | | | | | θ1 | θ2 | θ3 | θ4 | | | | | |
| Example 3-1 | 1 | 0.399 | 3.263 | 0.122 | 2.490 | 6.24 | 0.343 | 0.5 | 3.7 | 27.0 | 68.8 | 91.0 | 84.0 | A | A | B |
| Example 3-2 | 2 | 0.612 | 8.228 | 0.071 | 3.560 | 5.82 | −0.296 | 1.0 | 6.7 | 27.4 | 64.9 | 89.2 | 74.5 | B | B | B |
| Example 3-3 | 3 | 0.497 | 3.447 | 0.144 | 3.110 | 6.26 | −0.601 | 0.6 | 4.1 | 16.4 | 78.9 | 80.7 | 91.3 | B | B | A |
| Example 3-4 | 4 | 0.569 | 2.524 | 0.225 | 3.930 | 6.91 | −0.375 | 0.4 | 2.8 | 13.5 | 83.3 | 72.0 | 96.3 | A | A | A |
| Example 3-5 | 5 | 0.352 | 2.963 | 0.119 | 2.440 | 6.93 | 0.542 | 0.8 | 5.6 | 31.6 | 62.0 | 91.4 | 69.7 | B | B | B |
| Example 3-6 | 12 | 0.9724 | 3.521 | 0.276 | 5.176 | 5.32 | 0.048 | 0.6 | 3.1 | 14.1 | 82.2 | 70.1 | 97.1 | A | A | B |
| Example 3-7 | 13 | 0.315 | 1.034 | 0.305 | 2.102 | 6.67 | 0.265 | 0.4 | 2.6 | 13.0 | 84.0 | 91.1 | 72.5 | B | B | B |
| Comparative Example 3-1 | 6 | 0.374 | 16.973 | 0.022 | 1.620 | 4.33 | 0.991 | 6.4 | 31.5 | 49.1 | 13.0 | 90.7 | 22.5 | B | B | C |
| Comparative Example 3-2 | 9 | 0.457 | 10.551 | 0.043 | 2.270 | 4.97 | 1.158 | 2.8 | 17.4 | 51.6 | 28.2 | 90.5 | 42.1 | B | B | C |
| Comparative Example 3-3 | 10 | 0.059 | 23.511 | 0.003 | 0.180 | 3.05 | 0.904 | 74.5 | 24.6 | 0.9 | 0 | 91.8 | 3.5 | D | D | A |
| Comparative Example 3-4 | 7 | 0.149 | 17.672 | 0.008 | 0.670 | 4.50 | 1.402 | 16.2 | 46.4 | 36.1 | 1 | 90.7 | 24.7 | C | C | B |
| Comparative Example 3-5 | 14 | 1.04133 | 2.536 | 0.411 | 5.480 | 5.26 | −0.007 | 0.2 | 2.4 | 10.3 | 87 | 68.5 | 98.2 | A | A | C |
| Comparative Example 3-6 | 15 | 0.13 | 0.952 | 0.137 | 0.644 | 4.95 | 0.816 | 6.5 | 22.5 | 38.2 | 32.8 | 91.5 | 15.8 | C | C | B |

TABLE 7

| | AM1-1 [μm] | AM1-2 [μm] | AM1-3 [μm] | AM1 [μm] | AM2 [μm] | AM1/AM2 |
|---|---|---|---|---|---|---|
| Example 3-1 | 0.0666 | 0.0657 | 0.0668 | 0.1991 | 0.0143 | 13.87 |
| Example 3-2 | 0.1150 | 0.1198 | 0.1182 | 0.3530 | 0.0102 | 34.74 |
| Example 3-3 | 0.0635 | 0.0573 | 0.0637 | 0.1845 | 0.0245 | 7.52 |
| Example 3-4 | 0.0639 | 0.0629 | 0.0602 | 0.1870 | 0.0344 | 5.44 |
| Example 3-5 | 0.0556 | 0.0672 | 0.0621 | 0.1849 | 0.0121 | 15.29 |
| Example 3-6 | 0.1354 | 0.1329 | 0.1173 | 0.3856 | 0.0066 | 58.42 |
| Example 3-7 | 0.0515 | 0.0444 | 0.0474 | 0.1434 | 0.0165 | 8.71 |
| Comparative Example 3-1 | 0.1505 | 0.1259 | 0.1364 | 0.4128 | 0.0028 | 145.14 |
| Comparative Example 3-2 | 0.1491 | 0.1416 | 0.1166 | 0.4073 | 0.0042 | 96.56 |
| Comparative Example 3-3 | 0.0277 | 0.0185 | 0.0148 | 0.0610 | 0.0003 | 195.22 |
| Comparative Example 3-4 | 0.0524 | 0.0460 | 0.0489 | 0.1474 | 0.0010 | 148.86 |

From the results in Table 6, it can be confirmed that the anti-glare film of the third embodiment has excellent anti-glare properties, suppresses reflected scattered light, and has an excellent jet-black appearance.

REFERENCE SIGNS LIST

10: transparent substrate
20: anti-glare layer
21: binder resin
22: organic particles
100: anti-glare film
110: display element
120: image display device
200: observer 2. The anti-glare film according to claim 1, wherein Sa is 0.30 μm or more and 1.00 μm or less.

3. The anti-glare film according to claim 1, wherein the uneven surface has a three-dimensional skewness Ssk of 0.60 or less.

4. The anti-glare film according to claim 1, having a haze of 60% or more and 98% or less according to JIS K7136: 2000.

5. The anti-glare film according to claim 1, wherein the anti-glare layer contains a binder resin and particles.

6. The anti-glare film according to claim 5, wherein when a thickness of the anti-glare layer is defined as T and an average particle size of the particles is defined as D, D/T is 0.20 or more and 0.96 or less.

7. The anti-glare film according to claim 5, wherein the particles have an average particle size D of 1.0 μm or more and 5.0 μm or less.

8. The anti-glare film according to claim 5, wherein the particles are contained in an amount of 40 parts by mass or more and 200 parts by mass or less based on 100 parts by mass of the binder resin.

9. The anti-glare film according to claim 5, wherein the particles are organic particles.

10. The anti-glare film according to claim 5, wherein the anti-glare layer further contains inorganic fine particles.

11. The anti-glare film according to claim 10, wherein the inorganic fine particles are contained in an amount of 40 parts by mass or more and 200 parts by mass or less based on 100 parts by mass of the binder resin.

12. The anti-glare film according to claim 5, wherein binder resin comprises a cured product of an ionizing radiation-curable resin composition and a thermoplastic resin.

13. The anti-glare film according to claim 1, further comprising an anti-reflection layer on the anti-glare layer, a surface of the anti-reflection layer being the uneven surface.

14. An image display device comprising:

a display element; and the anti-glare film according to claim 1 disposed on the display element so that a surface of the anti-glare film on the uneven surface side is disposed so as to face the opposite side to the display element, the anti-glare film being disposed on an outermost surface.

15. The anti-glare film according to claim 1, further comprising a transparent substrate on which the anti-glare layer is disposed, wherein a surface of the anti-glare layer opposite to the transparent substrate is the uneven surface of the anti-glare film.

\* \* \* \* \*